United States Patent
Prabhu Gaunkar et al.

(10) Patent No.: US 12,255,158 B2
(45) Date of Patent: Mar. 18, 2025

(54) COMPONENTS FOR MILLIMETER-WAVE COMMUNICATION

(71) Applicant: Intel Corporation, Santa Clara, CA (US)

(72) Inventors: Neelam Prabhu Gaunkar, Chandler, AZ (US); Georgios Dogiamis, Chandler, AZ (US); Telesphor Kamgaing, Chandler, AZ (US); Diego Correas-Serrano, Tempe, AZ (US); Henning Braunisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1069 days.

(21) Appl. No.: 16/911,543

(22) Filed: Jun. 25, 2020

(65) Prior Publication Data

US 2021/0407934 A1 Dec. 30, 2021

(51) Int. Cl.
H01L 23/66 (2006.01)
H01L 23/498 (2006.01)
H01P 3/00 (2006.01)
H01P 3/08 (2006.01)

(52) U.S. Cl.
CPC ........ *H01L 23/66* (2013.01); *H01L 23/49822* (2013.01); *H01L 23/49838* (2013.01); *H01P 3/003* (2013.01); *H01P 3/08* (2013.01); *H01P 3/081* (2013.01); *H01L 2223/6627* (2013.01)

(58) Field of Classification Search
CPC ..... H01L 2224/16145; H01L 23/49822; H01L 23/552; H01P 1/047; H01P 3/08; H01P 3/081

See application file for complete search history.

(56) References Cited

U.S. PATENT DOCUMENTS

| | | | |
|---|---|---|---|
| 9,210,800 B1 * | 12/2015 | Lee ........................ | H01P 3/026 |
| 9,372,206 B2 * | 6/2016 | Wu ........................ | H01L 22/32 |
| 9,735,131 B2 * | 8/2017 | Su .......................... | H01L 25/50 |
| 9,843,301 B1 * | 12/2017 | Rodgers ................. | H01P 1/183 |
| 10,103,054 B2 | 10/2018 | Zhang et al. | |
| 11,335,655 B2 * | 5/2022 | Wan ..................... | H01L 23/315 |
| 11,495,873 B2 * | 11/2022 | Han ....................... | H01Q 1/36 |
| 11,508,675 B2 * | 11/2022 | Chen ..................... | H01L 24/19 |
| 11,728,247 B2 * | 8/2023 | Hu ................... | H01L 21/76898 |
| | | | 257/774 |
| 2010/0224969 A1 * | 9/2010 | Tang ..................... | H01L 24/24 |
| | | | 257/E21.705 |
| 2014/0268614 A1 * | 9/2014 | Zhang ................... | H01L 21/768 |
| | | | 174/262 |
| 2017/0040373 A1 * | 2/2017 | Kim ................ | H01L 27/14621 |
| 2019/0334220 A1 * | 10/2019 | Ali ........................ | H01L 23/66 |

OTHER PUBLICATIONS

Boccia, Luigi et al., "Via-stub effects in millimeter wave printed circuit boards", 2019 IEEE Asia-Pacific Microwave Conference (APMC), pp. 1694-1696.

(Continued)

*Primary Examiner* — Jaehwan Oh
(74) *Attorney, Agent, or Firm* — Akona IP PC

(57) ABSTRACT

Disclosed herein are components for millimeter-wave communication, as well as related methods and systems.

21 Claims, 27 Drawing Sheets

(56) References Cited

OTHER PUBLICATIONS

Du, Jinfeng et al., "How much spectrum is too much in millimeter wave wireless access", IEE Journal on Selected Areas in Communications, vol. 35, No. 7, Jul. 2017, pp. 1444-1458.
Hernandez-Sosa, Gaudencio et al., "Impedance Matching of Traces and Multilayer via Transitions for On-Package Links", IEEE Microwave and Wireless Components Letters, vol. 21, No. 11, Nov. 2011, pp. 595-597.
Lee, Kyoungho et al., "Reduction of Transient Far-End Crosstalk Voltage and Jitter in DIMM Connectors for DRAM Interface", IEE Microwave and Wireless Components Letters, vol. 19, No. 1, Jan. 2009, pp. 15-17.
Li, Zhipeng et al., "Analysis of Wideband Multilayer LTCC Vertical via Transition of Millimeter-wave System-in-package", 2017 18th International Conference on Electronic Packaging Technology, pp. 1039-1042.
Pozar, D. M. "Microwave Engineering", John Wiley and Sons, New York, NY, 2009.

\* cited by examiner

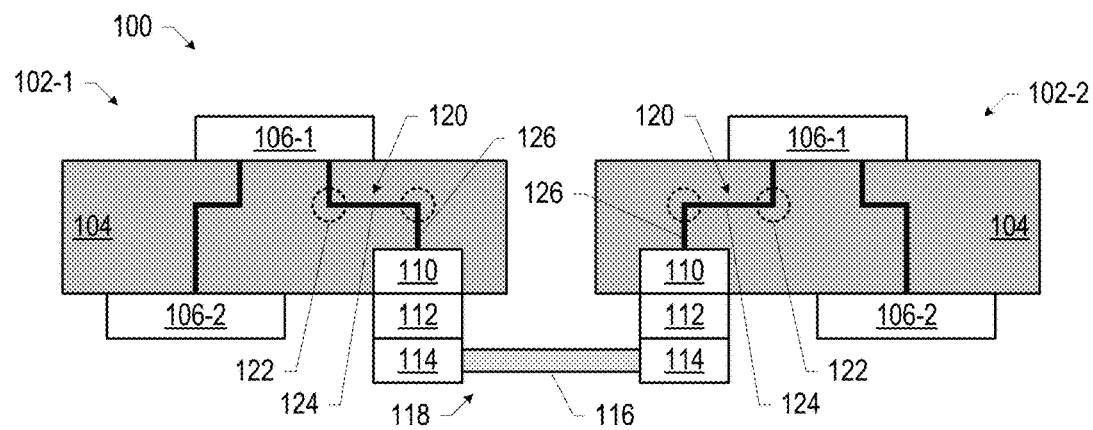
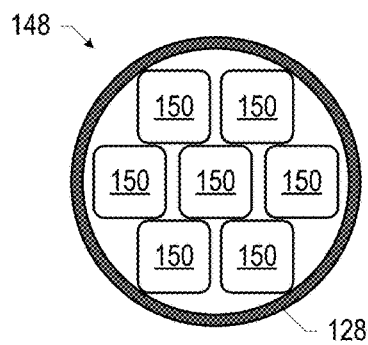
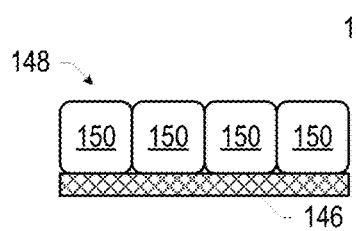
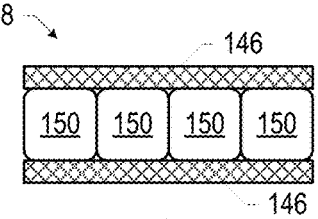
FIG. 1
FIG. 2
FIG. 3
FIG. 4
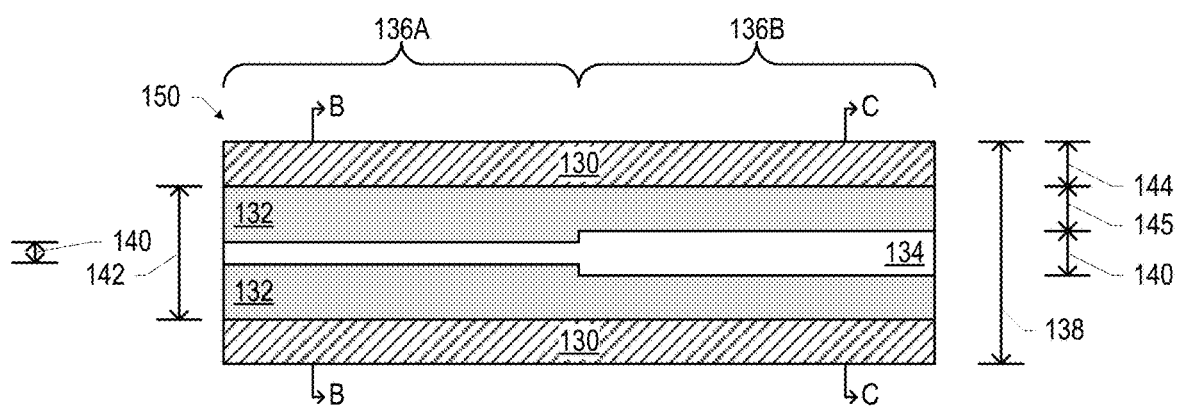
FIG. 5A
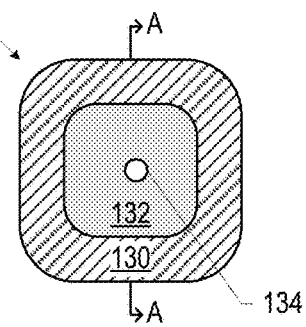
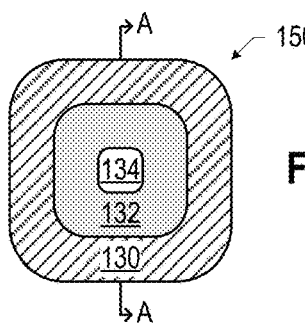
FIG. 5B
FIG. 5C

COMPONENTS FOR MILLIMETER-WAVE COMMUNICATION

BACKGROUND

Communication systems typically include the transmission of electromagnetic signals over an appropriate medium. Some conventional systems include electrical signaling over copper wiring or optical signaling over optical fibers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 illustrates a millimeter-wave communication system, in accordance with various embodiments.

FIGS. 2-4 are cross-sectional views of example waveguide bundles that may be used in a communication system, in accordance with various embodiments.

FIGS. 5A-5C are cross-sectional views of an example dielectric waveguide that may be used in a communication system, in accordance with various embodiments.

DETAILED DESCRIPTION

Figure 6:
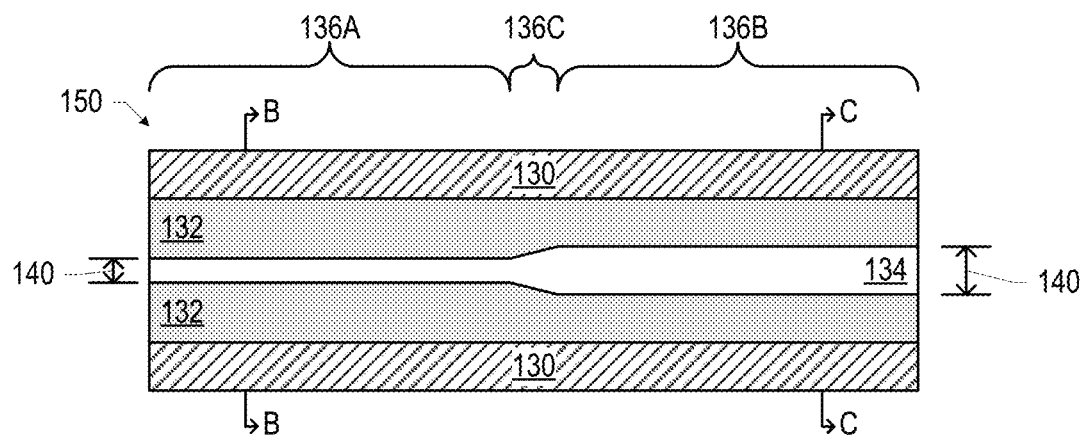
FIGS. 6-8 are cross-sectional views of example dielectric waveguides that may be used in a communication system, in accordance with various embodiments.

Disclosed herein are components for millimeter-wave communication, as well as related methods and systems. Computing applications involving large amounts of data, such as deep learning, autonomous vehicle management, and virtual and augmented reality, place unprecedented demands on computing systems. Existing conventional interconnect technologies, such as baseband copper cables or optical communication components, may not be able to achieve the goals of low latency, low cost, and low power for high data-rate communication. The components disclosed herein, such as dielectric waveguides, waveguide bundles, waveguide connectors, and/or transmission line structures, may help enable high data-rate millimeter-wave communication in a dense, low-latency, power-efficient manner.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 5" may be used to refer to the collection of drawings of FIGS. 5A-5C, the phrase "FIG. 9" may be used to refer to the collection of drawings of FIGS. 9A-9C, etc.

FIG. 1 illustrates a millimeter-wave communication system 100, in accordance with various embodiments. Any one or more of the elements of the communication system 100 of FIG. 1 may include the novel embodiments of those elements disclosed herein. The millimeter-wave communication system 100 may include one or more microelectronic packages 102; two microelectronic packages 102-1 and 102-2 are depicted in FIG. 1, but this is simply illustrative, and a millimeter-wave communication system 100 may include one microelectronic package 102 or more than two microelectronic packages 102. A microelectronic package 102 may include a microelectronic support 104 and one or more microelectronic components 106; two microelectronic components 106 are shown as disposed at opposite faces of each of the microelectronic supports 104 in FIG. 1, but this is simply illustrative, and a microelectronic package 102 may include one microelectronic component 106 or more than two microelectronic components 106 arranged on any one or more faces of a microelectronic support 104. In some embodiments, microelectronic components 106 may be coupled to conductive contacts at a face of the microelectronic support 104 by solder, metal-to-metal interconnects, wirebonding, or another appropriate interconnect.

A microelectronic package 102 may also include a package connector 112 that can mate with a cable connector 114 of a waveguide cable 118. The waveguide cable 118 may include cable connectors 114 at either end of a cable body 116, and may permit millimeter-wave communication between the microelectronic package 102-1 and the microelectronic package 102-2. In some embodiments, a total length of the waveguide cable 118 may be less than 2 meters. In some embodiments, a total length of the waveguide cable 118 may be less than 20 meters (e.g., between 1 meter and 20 meters, less than 10 meters, or less than 5 meters). The microelectronic support 104 may include one or more transmission lines 120 between different ones of the microelectronic components 106 and/or between the microelectronic component 106 and a package connector 112. A microelectronic package 102 may also include launch/filter structures 110 between a transmission line 120 and a package connector 112, with the launch/filter structures 110 providing desired launch and filter functionality, as discussed further below.

A transmission line 120 in the microelectronic support 104 may include one or more horizontal portions 124 and/or one or more vertical portions 126. As used herein, a "horizontal portion" may refer to a portion of a transmission line 120 that is confined to a particular metal layer in the microelectronic support, while a "vertical portion" may refer to a portion of a transmission line 120 that extends between multiple metal layers. As discussed in further detail below, a horizontal portion 124 may include one or more traces (and via pads), while a vertical portion 126 may include one or more vias (and via pads). A transmission line 120 that includes at least one horizontal portion 124 and at least one vertical portion 126 may also include a transition 122 between the horizontal portion 124 and the vertical portion 126; some example transitions 122 are highlighted in FIG. 1. The particular arrangement of transmission lines 120 in the microelectronic supports 104 of FIG. 1 is simply illustrative, and a number of embodiments of transmission lines 120 are disclosed herein. In some embodiments, a microelectronic support 104 may include between 2 and 30 metal layers.

The microelectronic support 104 may include a dielectric material (e.g., a dielectric material 182, as discussed below with reference to FIGS. 36-65) and conductive material, with the conductive material arranged in the dielectric material (e.g., in traces, vias, via pads, and metal planes, as discussed below) to provide transmission lines 120 through the dielectric material. In some embodiments, the dielectric material (e.g., the dielectric material 182) may include an organic material, such as an organic buildup film. In some embodiments, the dielectric material may include a ceramic (e.g., a low-temperature co-fired ceramic or a high-temperature co-fired ceramic), an epoxy film having filler particles therein, glass, an inorganic material, or combinations of organic and inorganic materials, for example. In some embodiments, the conductive material of the microelectronic support 104 may include a metal (e.g., copper). In some embodiments (e.g., as discussed below with reference to FIGS. 36-65), the microelectronic support 104 may include layers of dielectric material/conductive material, with traces of conductive material in one metal layer electrically coupled to traces of conductive material in an adjacent metal layer by vias of the conductive material. A microelectronic support 104 including such layers may be formed using a printed circuit board (PCB) fabrication technique, for example. Although a particular number and arrangement of layers of dielectric material/conductive material are shown in various ones of the accompanying FIGS., these particular numbers and arrangements are simply illustrative, and any desired number and arrangement of a dielectric material/conductive material may be used in a microelectronic support 104. In some embodiments, a microelectronic support 104 may include a package substrate. In some embodiments, a microelectronic support 104 may include an interposer.

FIGS. 2-4 are cross-sectional views of example waveguide bundles 148 that may be used in a communication system 100, in accordance with various embodiments; the longitudinal axes of the dielectric waveguides 150 shown in FIGS. 2-4 may extend into and out of the plane of the page. The waveguide bundles 148 of FIGS. 2-4 may be included in a cable body 116 and/or may be part of a transmission line 120. Although FIGS. 2-4 depict a particular number of dielectric waveguides 150 in the waveguide bundles 148, a waveguide bundle 148 may include any desired number of dielectric waveguides 150. For example, in some embodiments, a waveguide bundle 148 included in a cable body 116 for a server interconnect application may include up to 16 dielectric waveguides 150 in a waveguide bundle 148 (e.g., 5-15 dielectric waveguides 150, or 8-16 dielectric waveguides 150); in other embodiments, a waveguide bundle 148 included in a cable body 116 for a server interconnect application may include more than 16 dielectric waveguides 150. In another example, in some embodiments, a waveguide bundle 148 included in a cable body 116 for a backplane interconnect application may include up to 72 dielectric waveguides 150 in a waveguide bundle 148; in other embodiments, a waveguide bundle 148 included in a cable body 116 for a backplane interconnect application may include more than 72 dielectric waveguides 150. In another example, in some embodiments, a waveguide bundle 148 included in a cable body 116 for an automotive communications application may include two dielectric waveguides 150 in a waveguide bundle 148; in other embodiments, a waveguide bundle 148 included in a cable body 116 for an automotive communications application may include more than two dielectric waveguides 150.

In the waveguide bundle 148 of FIG. 2, one or more dielectric waveguides 150 may be arranged in a cluster and may be surrounded by a cable body wrapper 128. The cable body wrapper 128 may hold the dielectric waveguides 150 together and may provide mechanical, thermal, and/or electromagnetic protection to the waveguide bundle 148. A cable body wrapper 128 may include any suitable materials, such as polyethylene terephthalate (PET), other plastic materials, and/or metal foil (e.g., copper, aluminum, and/or biaxially oriented polyethylene terephthalate foils). In the waveguide bundle 148 of FIG. 3, multiple dielectric waveguides 150 may be arranged along a metal plane 146 (provided, e.g., by a sheet of metal foil in a waveguide cable 118 or by a metal plane in a microelectronic support 104). The waveguide bundle 148 of FIG. 3 may also be surrounded by a cable body wrapper 128, not shown. The waveguide bundle 148 of FIG. 3 may be referred to as a grounded dielectric waveguide bundle. In the waveguide bundle 148 of FIG. 4, multiple dielectric waveguides 150 may be arranged between two metal planes 146 (provided, e.g., by a sheet of metal foil in a waveguide cable 118 or by metal plane in a microelectronic support 104). The waveguide bundle 148 of FIG. 4 may also be surrounded by a cable body wrapper 128, not shown. The waveguide bundle 148 of FIG. 4 may be referred to as a non-radiative dielectric waveguide bundle. The waveguide bundles 148 of FIGS. 2-4 may include any of the dielectric waveguides 150 disclosed herein.

FIGS. 5-27 illustrate example dielectric waveguides 150 and waveguide bundles 148 that may be used in a millimeter-wave communication system 100 (e.g., included in a cable body 116 and/or part of a transmission line 120). A number of elements of FIG. 5 are shared with FIGS. 6-27; for ease of discussion, a description of these elements is not repeated, and these elements may take the form of any of the embodiments disclosed herein. The dielectric waveguides 150 and waveguide bundles 148 disclosed herein may provide significant advantages over baseband copper cables in terms of bandwidth density and transmission distance, without incurring the complex and expensive integration of optical components required by optical interconnect links.

As discussed below, a dielectric waveguide 150 may include a cladding material 130. In some embodiments, the cladding material 130 may not include a metal, nor may the dielectric waveguide 150 have another metal coating. Utilizing a metal cladding or coating may advantageously eliminate crosstalk and energy leakage between adjacent dielectric waveguides 150, allowing an increase in bandwidth density as dielectric waveguides 150 can be densely bundled in a waveguide bundle 148 (e.g., in a waveguide cable 118). However, a metal cladding or coating may compromise communication at millimeter-wave frequencies by introducing increasingly large signal attenuation as frequencies scale up beyond 60 gigahertz, introducing large group-delay dispersion that spreads the transmitted symbols in time and causes inter-symbol interference (ISI) that must be overcome with highly complex and expensive equalization/dispersion compensation schemes, and/or reducing signal integrity due to imperfections in the metal cladding or coating that arise due to the difficulty of wrapping dielectric waveguides 150 whose cross-sections decrease with increasing frequency. The dielectric waveguides 150 and waveguide bundles 148 disclosed herein that do not include a metal cladding or coating may overcome one or more of the challenges arising from the absence of such a metal cladding or coating (e.g., achieving adequate bandwidth density and reducing crosstalk) to achieve dense, low-latency, low-weight, power-efficient interconnects that may support millimeter-wave communication at high data rates (e.g., beyond 100 gigabits per second).

FIGS. 5A-5C are cross-sectional views of an example dielectric waveguide 150 that may be used in a millimeter-wave communication system 100, in accordance with various embodiments. In particular, FIG. 5A is a side, cross-sectional view along a longitudinal axis of the dielectric waveguide 150, FIG. 5B is a cross-sectional view of the dielectric waveguide 150 of FIG. 5A at the section B-B, and FIG. 5C is a cross-sectional view of the dielectric waveguide 150 of FIG. 5A at the section C-C. The dielectric waveguide 150 of FIG. 5 may include a core material 132 having an opening 134 therein, with the opening 134 extending in the longitudinal direction, as shown. A cladding material 130 may wrap around the core material 132. The cladding material 130 may have a dielectric constant that is less than a dielectric constant of the core material 132. The opening 134 in the core material 132 may be filled with air or another material that has a dielectric constant that is less than a dielectric constant of the core material 132. In some embodiments, the core material 132 may have a dielectric constant that is greater than 2, while the cladding material 130 may have a dielectric constant that is less than 2. In some embodiments, the core material 132 may include polytetrafluoroethylene (PTFE), another fluoropolymer, low-density polyethylene, high-density polyethylene, another plastic, a ceramic (e.g., alumina), cyclic olefin polymers (COP), cyclic olefin co-polymers (COC), or any combination thereof. In some embodiments, the core material 132 may include a plastic material having a dielectric constant that is less than 10 (e.g., a dielectric constant that is less than 4). In some embodiments in which the core material 132 includes a ceramic, the dielectric constant of the ceramic used may be less than 10; such embodiments may be particularly advantageous in datacenter applications. In other embodiments in which the core material 132 includes a ceramic, the dielectric constant of the ceramic used may be between 10 and 50; such embodiments may be particularly advantageous in very small and/or shorter dielectric waveguides 150. In some embodiments, the cladding material 130 may include a dielectric material, such as a dielectric foam (e.g., a foam having a dielectric constant between 1.05 and 1.8), any of the materials discussed above with reference to the core material 132, or any other suitable dielectric material.

The dielectric waveguide 150 of FIG. 5 may include sections having openings 134 with different diameters. For example, FIG. 5A illustrates a dielectric waveguide 150 having two sections: a section 136A in which the opening 134 has a smaller diameter and a section 136B in which the opening 134 has a larger diameter. The depiction of two different sections 136 in FIG. 5 is simply illustrative, and a dielectric waveguide 150 may have more than two sections 136 having openings 134 with diameters different from the diameters of adjacent sections 136. For example, a dielectric waveguide 150 may include a section 136A, followed by a section 136B, followed by another section 136A. The arrangement of the sections 136, and the relative lengths of the sections 136, in a dielectric waveguide 150, may be selected to achieve a desired performance for the dielectric waveguide 150.

The dimensions of the dielectric waveguide 150 of FIG. 5 (and others of the dielectric waveguides 150 disclosed herein) may take any suitable values. For example, in some embodiments, the outer diameter 138 of a dielectric waveguide 150 may be between 1 millimeter and 10 millimeters. In some particular embodiments, the outer diameter 138 of a dielectric waveguide 150 may be between 1.5 millimeter and 3 millimeters; such embodiments may be particularly advantageous in datacenter applications. In some embodiments, the outer diameter 142 of the core material 132 may be less than 3 millimeters (e.g., between 0.3 millimeters and 3 millimeters, or less than 2 millimeters). In some particular embodiments, the outer diameter 142 of the core material 132 may be between 1 millimeter and 2 millimeters; such embodiments may be particularly advantageous in datacenter applications. In some embodiments, the thickness 145 of the core material 132 may be between 0.15 millimeters and 1.5 millimeter. In some embodiments, the outer diameter 140 of the opening 134 may be between 0 millimeters (e.g., in sections 136 in which no opening 134 is present) and 2 millimeters. In some embodiments, the outer diameter 140 of the opening 134 may be between 0.2 millimeters and 0.5 millimeters; such embodiments may be particularly advantageous in datacenter applications. In some embodiments, the thickness 144 of the cladding material 130 may be between 1 millimeter and 5 millimeters.

Figure 7:
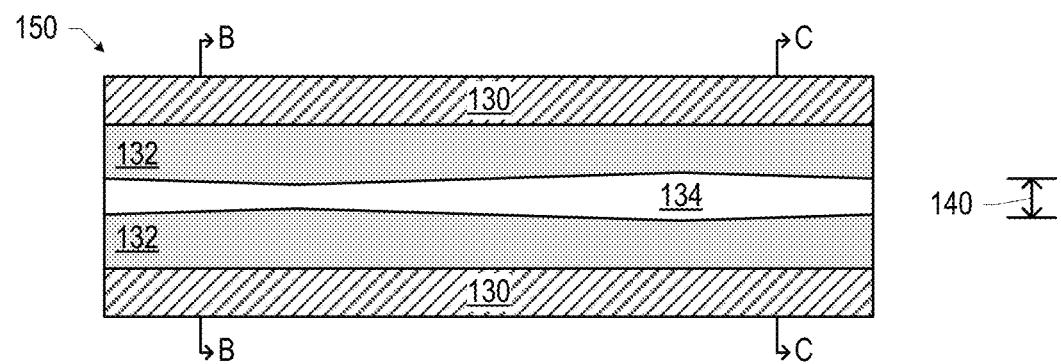
Figure 8:
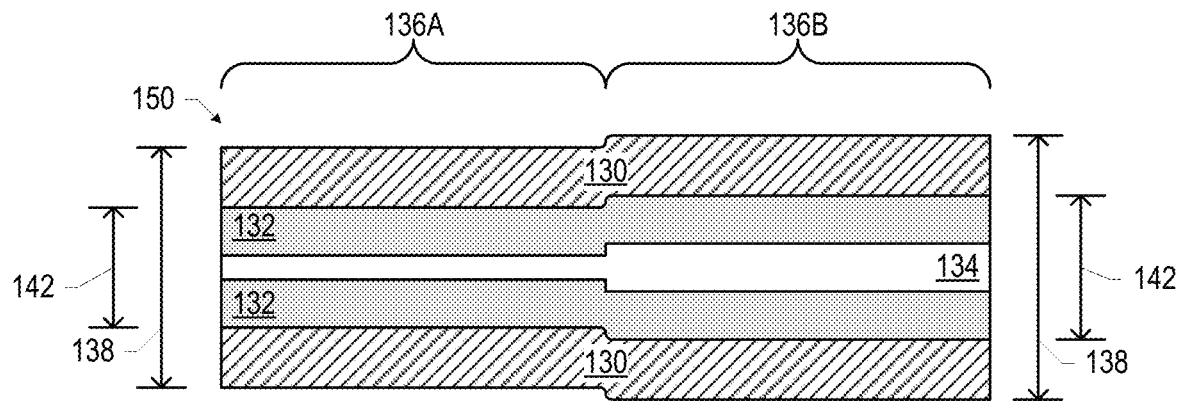

In the dielectric waveguide 150 of FIG. 5, the transition from the section 136A to the section 136B is a stepwise increase in the diameter of the opening 134. In some embodiments, a gap may be present between the section 136A and the section 136B; this gap may have a width up to 1 millimeter, in some embodiments, while still permitting adequate wave propagation. In other embodiments, the transition between sections 136 having openings 134 with different diameters may be smoother. For example, FIG. 6 is a side, cross-sectional view of a dielectric waveguide 150 including a tapered transition section 136C between the sections 136A and 136B. FIGS. 6-8 share a perspective with FIG. 5A. In the transition section 136C, the diameter of the opening 134 at the interface between the sections 136A and 136C may match the diameter of the opening 134 in the section 136A, and the diameter may linearly increase along the longitudinal length of the section 136C until it reaches the interface between the sections 136C and 136B, at which it may match the diameter of the opening 134 in the section 136B. In some embodiments, a transition section 136C may have a length that is less than 10 millimeters. In some embodiments, a gap may be present between the section 136A and the section 136C and/or between the section 136C in the section 136B, as discussed above.

In some embodiments, the different sections 136 having different diameters 140 of the opening 134 may not be distinct; instead, the diameter 140 of the opening 134 may smoothly vary over the longitudinal length of the dielectric waveguide 150. FIG. 7 is a side, cross-sectional view of such a dielectric waveguide 150. Utilizing a core material 132 with an opening 134 having a smoothly varying diameter 140 may reduce any undesirable amplitude affects that may arise from non-smooth transitions between different sections 136, but may be more difficult to manufacture.

In the embodiments of FIGS. 5-7, the outer diameter 138 of the dielectric waveguide 150 remains constant over the length of the dielectric waveguide 150. Similarly, the outer diameter 142 of the core material 132 of the dielectric waveguide 150 remains constant. In embodiments in which the outer diameter 138 is constant over the length of the dielectric waveguide 150 may enable easy assembly, and may eliminate or minimize the use of additional matching transitions. However, in other embodiments, the outer diameter 138 and/or the outer diameter 142 may vary over the length of the dielectric waveguide 150. For example, FIG. 8 illustrates an embodiment in which the outer diameter 138 of the dielectric waveguide 150 is different in different ones of the sections 136. Similarly, the outer diameter 142 of the core material 132 the dielectric waveguide 150 is different in different ones of the sections 136. More generally, in some embodiments, the thickness 144 of the cladding material 130 may remain constant over the length of the dielectric waveguide 150 (e.g., as illustrated in FIGS. 5-8) while in other embodiments, the thickness 144 of the cladding material 130 may not remain constant over the length of the dielectric waveguide 150. Similarly, in some embodiments, the thickness 145 of the core material 132 may remain constant over the length of the dielectric waveguide 150 (e.g., as illustrated in FIG. 8), while in other embodiments, the thickness 145 of the core material 132 may not remain constant over the length of the dielectric waveguide 150 (e.g., as illustrated in FIGS. 5-7).

The dielectric waveguides 150 of FIGS. 5-7 (as well as the other dielectric waveguides 150 and waveguide bundles 148 disclosed herein) may be manufactured using any suitable technique. For example, in some embodiments, an extrusion head may be used to extrude the core material 132 with a desired opening 134; the extrusion head may be controlled to adjust the diameter 140 of the opening 134 in embodiments in which the diameter 140 smoothly varies over the length of the dielectric waveguide (e.g., as discussed above with reference to FIG. 7), or different sections 136 may be separately extruded and then assembled using heat-fusion or simply held together by pressure from the cladding material 130. The cladding material 130 may be applied by using heat-shrink tubing techniques with a suitable polymer, through helical wrapping, or using another technique. A common portion of cladding material 130 may be applied to the entire dielectric waveguide 150, or to different sections 136 separately.

Figure 9A:
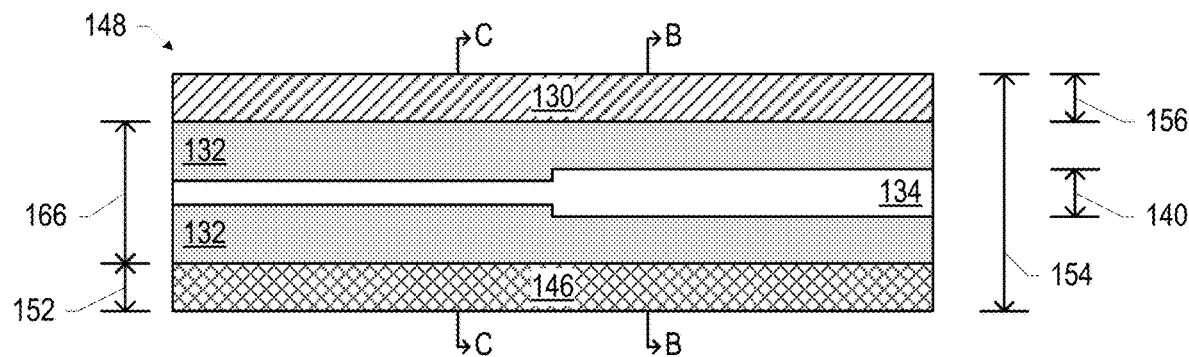
FIGS. 9A-9C are cross-sectional views of an example waveguide bundle that may be used in a communication system, in accordance with various embodiments.
Figure 9B:
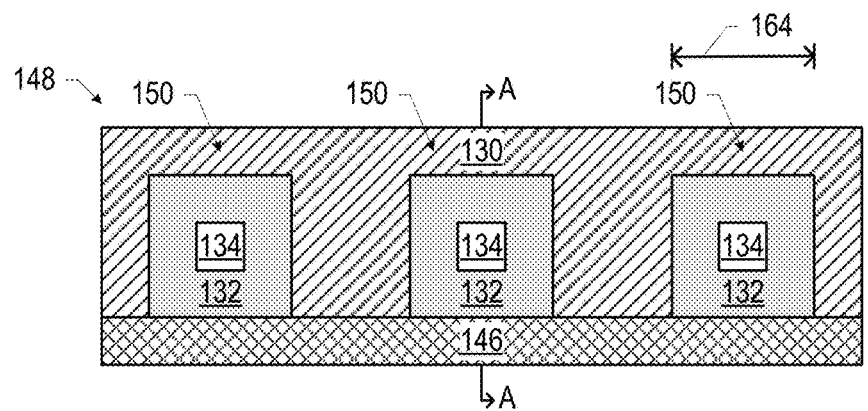
Figure 9C:
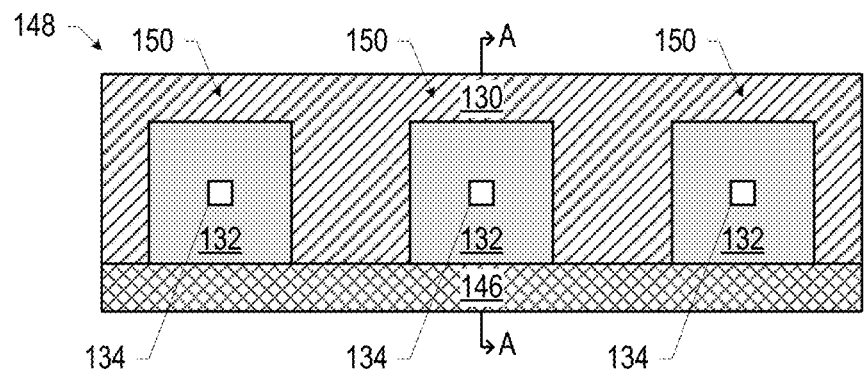
Figure 10A:
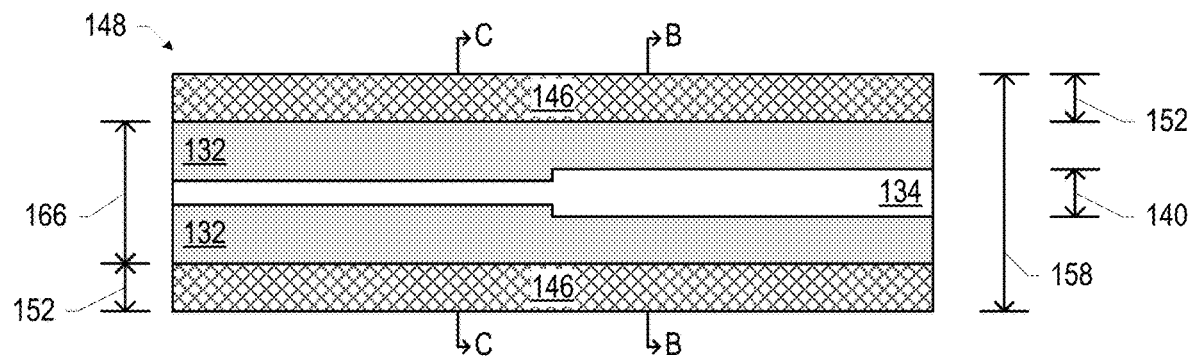
FIGS. 10A-10C are cross-sectional views of an example waveguide bundle that may be used in a communication system, in accordance with various embodiments.
Figure 10B:
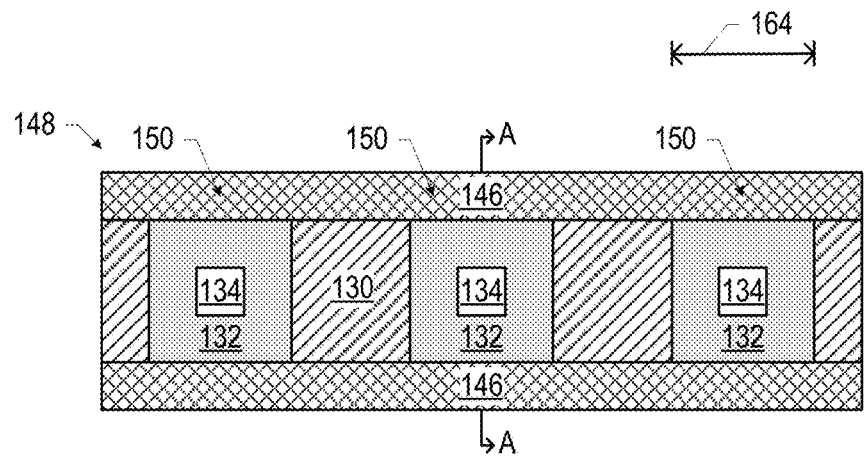
Figure 10C:
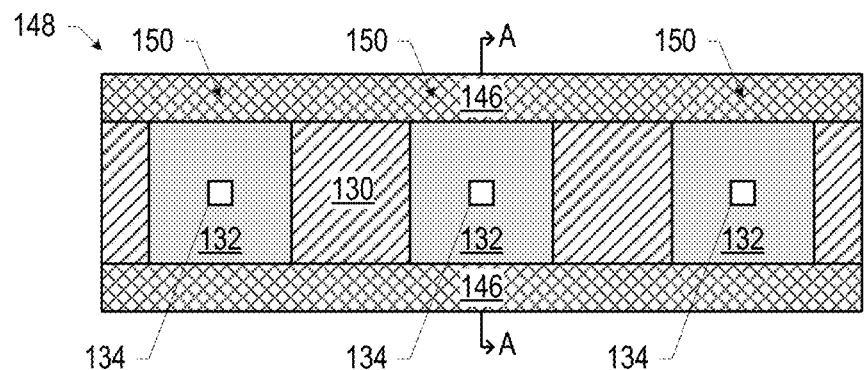

Dielectric waveguides 150 having openings 134 of varying diameter may also be utilized in grounded dielectric waveguide bundles 148 like those of FIG. 3 and in non-radiative dielectric waveguide bundles 148 like those of FIG. 4. For example, FIGS. 9 and 10 illustrate a grounded dielectric waveguide bundle 148 and a non-radiative dielectric waveguide bundle 148, respectively, having an opening 134 of varying diameter along the longitudinal length of the dielectric waveguides 150 in the waveguide bundles 148. In particular, FIGS. 9A and 10A are side, cross-sectional views along a longitudinal axis of the dielectric waveguides 150, FIGS. 9B and 10B are cross-sectional views of the dielectric waveguides 150 of FIGS. 9A and 10A, respectively, at the sections B-B, and FIGS. 9C and 10C are cross-sectional views of the dielectric waveguides 150 of FIGS. 9A and 10A, respectively, at the sections C-C.

In the waveguide bundle 148 of FIG. 9, a bottom face of the core material 132 may be in contact with the metal plane 146, and the cladding material 130 may be present at top and side faces of the core material 132, as shown. In the waveguide bundle 148 of FIG. 10, a bottom face and a top face of the core material 132 may be in contact with the metal planes 146, as shown, and the cladding material 130 may be present at side faces of the core material 132. The openings 134 in the core material 132 of the dielectric waveguides 150 of the waveguide bundles 148 of FIGS. 9 and 10 may have different diameters along the longitudinal length of the dielectric waveguides 150 in accordance with any of the embodiments disclosed herein (e.g., a gap, a linear transition, smoothly varying diameters, etc.).

The dimensions of the waveguide bundles 148 of FIGS. 9 and 10 may take any suitable values. For example, in some embodiments, the height 154 of a grounded dielectric waveguide bundle 148 (like that of FIG. 9) may be between 0.5 millimeter and 5 millimeters. In some embodiments, the thickness 156 of the cladding material 130 above the core material 132 may be between 1 millimeter and 3 millimeters. In some embodiments, the height 158 of a non-radiative dielectric waveguide bundle 148 (like that of FIG. 10) may be between 0.5 millimeters and 3 millimeters. In some embodiments, the thickness 152 of a metal plane 146 may be between 0.002 millimeters and 1 millimeter. In some embodiments, the height 166 of the core material 132 in a grounded dielectric waveguide bundle (like that of FIG. 9) or a non-radiative dielectric waveguide bundle 148 (like that of FIG. 10) may be between 0.2 millimeters and 2 millimeters. In some embodiments, the width 164 of the core material 132 in a grounded dielectric waveguide bundle 148 (like that of FIG. 9) or a non-radiative dielectric waveguide bundle 148 (like that of FIG. 10) may be between 0.2 millimeters and 2 millimeters.

The dielectric waveguides 150 and waveguide bundles 148 of FIGS. 5-10 may have significant advantages over conventional dielectric waveguides and waveguide bundles. Conventional dielectric waveguides may exhibit undesirable dispersion, in which the group delay is not constant over the frequency range, but changes as a function of frequency, leading to ISI. The conventional approach to dealing with such dispersion includes complex baseband equalizers or pre-distorters using finite-impulse-response filters (e.g., implemented using mixed-signal circuits or in the digital domain), signaling schemes based on Hilbert transforms, and/or analog dispersion compensation circuits (e.g., implemented at millimeter-wave, baseband, or an intermediate frequency). These approaches incur significant cost in terms of circuit complexity, silicon area, noise, power consumption, spurious responses arising from non-ideal Hilbert transforms, insertion loss, and/or limited real-time tunability of the circuit response. The dielectric waveguides 150 and waveguide bundles 148 of FIGS. 5-10 may remedy the undesirable dispersion characteristics of conventional dielectric waveguides by achieving an overall compensated dispersion. In particular, the sections 136A having an opening 134 with a smaller diameter 140 may exhibit "anomalous" dispersion, in which the group delay decreases with frequency, while the sections 136B having an opening 134 with a larger diameter 140 may exhibit "normal" dispersion, in which the group delay increases with frequency; including the anomalous dispersion sections 136A and the anomalous dispersion sections 136B in a single dielectric waveguide 150/waveguide bundle 148 may result in a dielectric waveguide 150/waveguide bundle 148 having little to no dispersion (i.e., having group delay that is more constant as a function of frequency), improving signaling fidelity and reducing the need for expensive compensation circuitry. The particular proportions of the different sections 136 in a dielectric waveguide 150 required to achieve a desired dispersion may depend on the geometry of the sections 136, the operational frequency, and the particular materials used; the particular proportions, then, may be determined as a function of these variables.

Figure 11A:
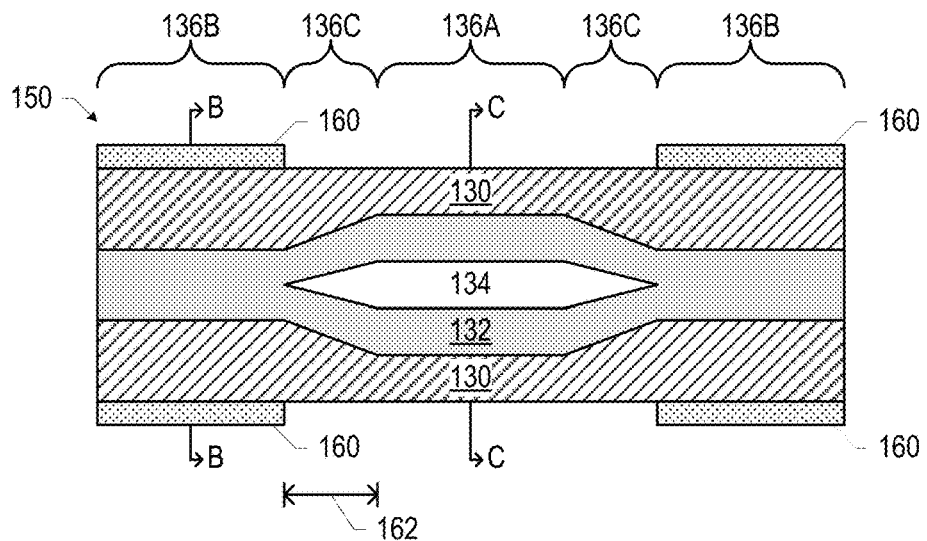
FIGS. 11A-11C are cross-sectional views of an example dielectric waveguide that may be used in a communication system, in accordance with various embodiments.
Figure 11B:
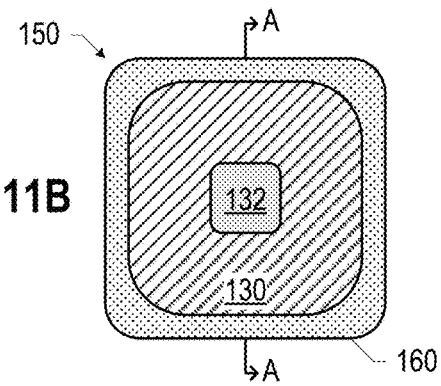
Figure 11C:
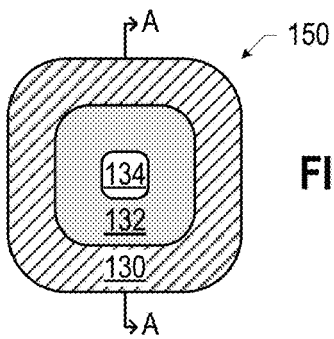

In some embodiments, an absorber material may be present around the cladding material 130 along portions of a dielectric waveguide 150. The absorber material 160 may include small lossy particles or fiber based on poor conductors and/or on lossy magnetic materials such as ferrites. In some embodiments, the absorber material 160 may be an absorbing paint or other material based on polymer composites with fillers that may include carbon particles, fibers, and/or nanotubes (e.g., carbon nanotube powders mixed with polyurethan), or with ferrite powders (e.g., a ferrite powder mixed with a non-conductive epoxy). For example, FIGS. 11A-11C are cross-sectional views of an example dielectric waveguide 150 including sections having an absorber material 160. In particular, FIG. 11A is a side, cross-sectional view along a longitudinal axis of the dielectric waveguide 150, FIG. 11B is a cross-sectional view of the dielectric waveguide 150 of FIG. 11A at the section B-B, and FIG. 11C is a cross-sectional view of the dielectric waveguide 150 of FIG. 11A at the section C-C. the embodiment of FIG. 11 illustrates three different sections 136: a section 136B in which there is no opening 134 in the core material 132, and in which an absorber material 160 is present around the cladding material 130; a section 136A in which there is an opening 134 in the core material 132, and in which no absorber material 160 is present around the cladding material 130; and a transition section 136C in which the outer diameter of the core material 132 linearly transitions from the outer diameter in the section 136A to the section 136B, the opening 134 linearly transitions from no opening in the section 136B to the diameter of the opening 134 in the section 136A, in which no absorber material 160 is present around the cladding material 130. In some embodiments, the transition section 136C may have a length 162 between 1 millimeter and 50 millimeters. In other embodiments, the presence or absence of the opening 134 may occur smoothly (e.g., as discussed above with reference to FIG. 7). In some embodiments, an opening 134 may be present in the section 136B, but the diameter of that opening 134 may be smaller than the diameter of the opening 134 in the section 136A. In some embodiments, the absorber material 160 may extend onto the cladding material 130 of the section 136C. In some embodiments, the thickness of the absorber material 160 may be between 0.1 millimeters and 2 millimeters.

In some embodiments, the sections 136B of the dielectric waveguide 150 of FIG. 11 may be single-mode waveguides, while the sections 136A of the dielectric waveguide 150 of FIG. 11 may be multi-mode waveguides. As used herein, a "single-mode" waveguide may be one in which only the fundamental mode of a signal is guided predominantly along the core material 132; for any cross-section with 90-degree rotational symmetry, such as square and circular waveguides, this fundamental mode may exist in two orthogonal polarizations with identical propagation properties. A "multi-mode" waveguide may be one in which the fundamental mode and higher-order modes are guided along the core material 132; these higher-order modes may be excited due to imperfections along the link. In the dielectric waveguide 150 of FIG. 11, the single-mode sections 136B may exhibit normal dispersion (with group delay increasing with frequency) while the multi-mode sections 136A may exhibit anomalous dispersion (with group delay decreasing with frequency). The dielectric waveguide 150 of FIG. 11 may also achieve dispersion compensation by alternating the normal dispersion single-mode sections 136B with the anomalous dispersion multi-mode sections 136A, as discussed above with reference to FIGS. 5-10. Further, the absorber material 160 on the single-mode sections 136B may absorb the higher-order modes arising in the multi-mode sections 136A, and thus the single-mode section 136B may serve as mode filters to eliminate such higher-order modes and thus reduce the inter-modal dispersion that may impair signaling. Undesirable higher-order modes may arise in and propagate along the dielectric waveguides 150 and waveguide bundles 148 of FIGS. 5-10, and such higher-order modes may be filtered out in the connector 112/114 and/or in the launch filter structures 110.

A dielectric waveguide 150 like that of FIG. 11 may be manufactured using the techniques discussed above with reference to FIGS. 5-10. In some embodiments, the single-mode sections 136B and the multi-mode sections 136A may be extruded independently, and the transition section 136C may be 3-D printed or molded using a suitable polymer having a similar dielectric constant as that of the core material 132 in the sections 136A and 136B; these independent sections 136 may then be heated and fused together. In other embodiments, the tapered shape of the transition section 136C may be achieved during extrusion, as discussed above with reference to FIGS. 5-10. In some embodiments, a single-mode section 136B may be formed by first forming a multi-mode section 136A, and then applying heat and pressure to some or all of the multi-mode section 136A to collapse the multi-mode section 136A into a single-mode section 136B. The absorber material 160 may be applied using any of the techniques discussed herein with respect to the cladding material 130, or may be applied as a painted material.

In some embodiments, a waveguide bundle 148 may include dielectric waveguides 150 having different structures whose phase mismatches reduce crosstalk by preventing electromagnetic modes in adjacent dielectric waveguides 150 from fully exchanging energy. In particular, adjacent dielectric waveguides 150 having different phase constants (also known as propagation constant) in the frequency range of interest arising from such different structures may result in incomplete photonic transitions between phase-mismatched states; since perturbations of the electromagnetic modes in such adjacent dielectric waveguides 150 do not add constructively, crosstalk may be reduced. Consequently, waveguide bundles 148 incorporating such phase-mismatched dielectric waveguides 150 may be spaced closer together than could be conventionally achieved while keeping crosstalk to a manageable level. Utilizing such dielectric waveguides 150 having different structures in such a manner may cause the data in each dielectric waveguide 150 to arrive at different times at the receiver; however, this effect may be only weakly frequency dependent unless the dielectric waveguides 150 are drastically different, and may be readily compensated at the receiver or transmitter. For example, equalizer circuitry (e.g., included in a millimeter-wave transceiver in a microelectronic component 106) may perform this correction in the digital domain (e.g., using de-skewing buffers) or as a mixed-signal circuit (e.g., by adding additional analog delay to some lanes). Such correction may alternately or additionally be implemented at various stages in a radio frequency (RF) front-end using analog circuits such as inductive/capacitive delay lines or all-pass filters (e.g., included in a microelectronic component 106, and/or in the microelectronic support 104).

Figure 12:
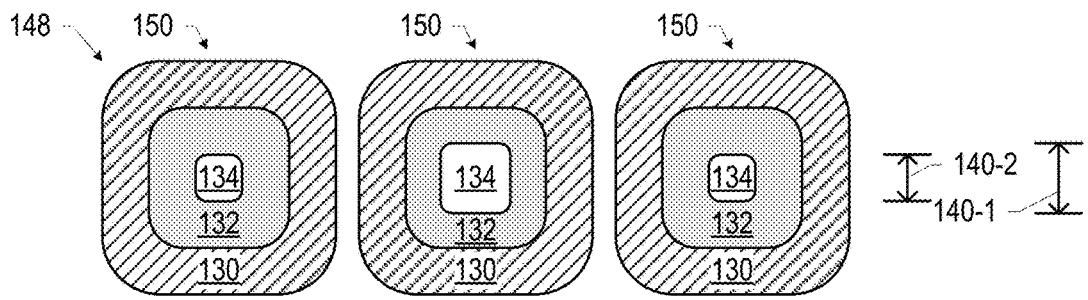
FIGS. 12-23 are cross-sectional views of example portions of waveguide bundles that may be used in a communication system.
Figure 13:
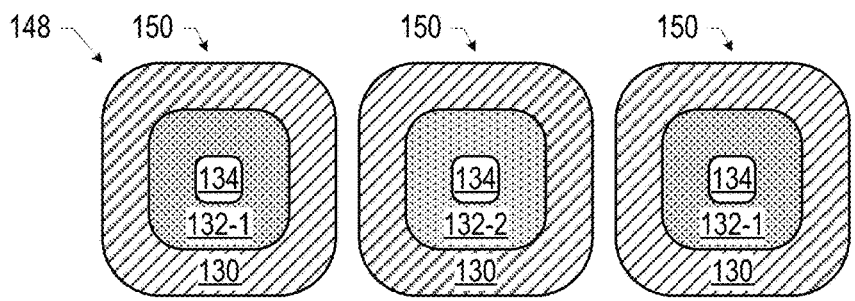

FIGS. 12-23 illustrate examples of waveguide bundles 148 in which adjacent dielectric waveguides 150 have differing structures. Any of the features discussed with reference to any of FIGS. 12-23 herein may be combined with any other features to form a waveguide bundle 148. For example, as discussed further below, FIG. 12 illustrates an embodiment in which adjacent dielectric waveguides 150 have openings 134 with different diameters 140, and FIG. 13 illustrates an embodiment in which adjacent dielectric waveguides 150 have core material 132 with different dielectric constants. These features of FIGS. 12 and 13 may be combined so that a waveguide bundle 148, in accordance with the present disclosure, has adjacent dielectric waveguides 150 with openings 134 having different diameters 140 and with core materials 132 with different dielectric constants. This particular combination is simply an example, and any combination may be used. Further, a waveguide bundle 148 including dielectric waveguides 150 having different structures (as discussed below with reference to FIGS. 12-23) may include dielectric waveguides 150 having any of the structures discussed above with reference to FIGS. 5-11, as appropriate.

FIG. 12 illustrates a waveguide bundle 148 in which adjacent dielectric waveguides 150 have openings 134 with different diameters 140. Dielectric waveguides 150 having openings 134 with different diameters 140 may alternate across the waveguide bundle 148 (e.g., with dielectric waveguides 150 having openings 134 with a diameter 140-1 alternating with dielectric waveguides 150 having openings 134 with a diameter 140-2, as shown), but more generally, the diameters 140 of dielectric waveguides 150 in a waveguide bundle 148 may vary in any desired pattern.

FIG. 13 illustrates a waveguide bundle 148 in which adjacent dielectric waveguides 150 have core materials 132 with different dielectric constants (e.g., due to different material compositions). Dielectric waveguides 150 having different core materials 132 may alternate across the waveguide bundle 148 (e.g., with dielectric waveguides 150 having a core material 132-1 alternating with dielectric waveguides 150 having a different core material 132-2, as shown), but more generally, the material compositions of the core materials 132 of dielectric waveguides 150 in a waveguide bundle 148 may vary in any desired pattern.

Figure 14:
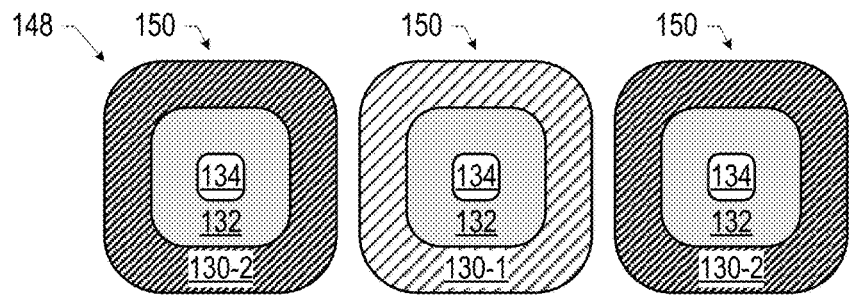

FIG. 14 illustrates a waveguide bundle 148 in which adjacent dielectric waveguides 150 have cladding materials 130 with different dielectric constants (e.g., due to different material compositions). Dielectric waveguides 150 having different cladding materials 130 may alternate across the waveguide bundle 148 (e.g., with dielectric waveguides 150 having a cladding material 130-1 alternating with dielectric waveguides 150 having a different cladding material 130-2, as shown), more generally, the material compositions of the cladding materials 130 of dielectric waveguides 150 in a waveguide bundle 148 may vary in any desired pattern.

Figure 15:
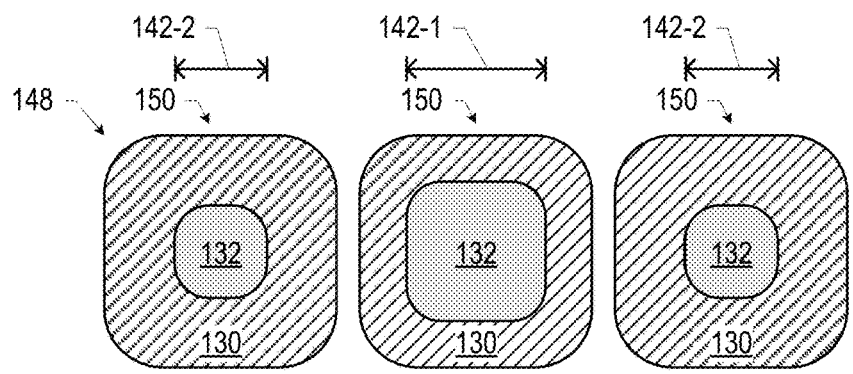

FIG. 15 illustrates a waveguide bundle 148 in which adjacent dielectric waveguides 150 have core materials 132 with different diameters 142. Dielectric waveguides 150 having core materials 132 with different diameters 142 may alternate across the waveguide bundle 148 (e.g., with dielectric waveguides 150 having core materials 132 with the diameter 142-1 alternating with dielectric waveguides 150 having core materials 132 with the diameter 142-2, as shown), but more generally, the diameters 142 of the core materials 132 of dielectric waveguides 150 in a waveguide bundle 148 may vary in any desired pattern.

Figure 16:
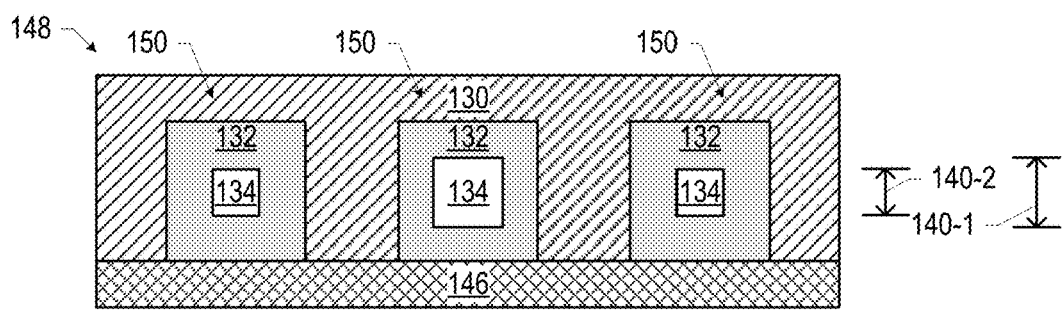
Figure 17:
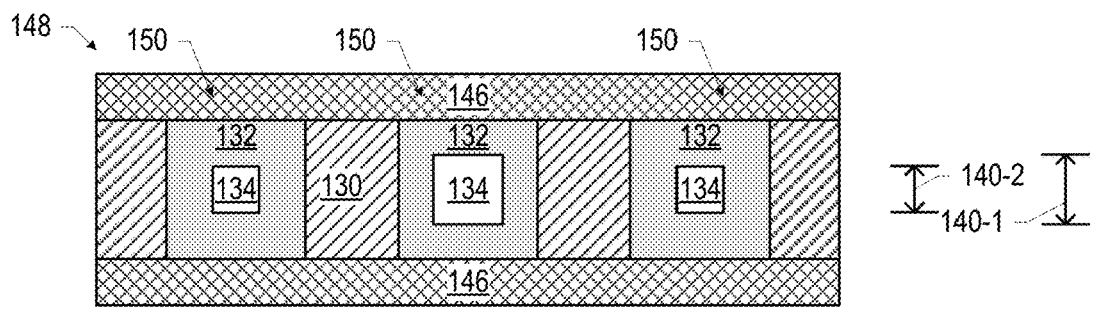
Figure 18:
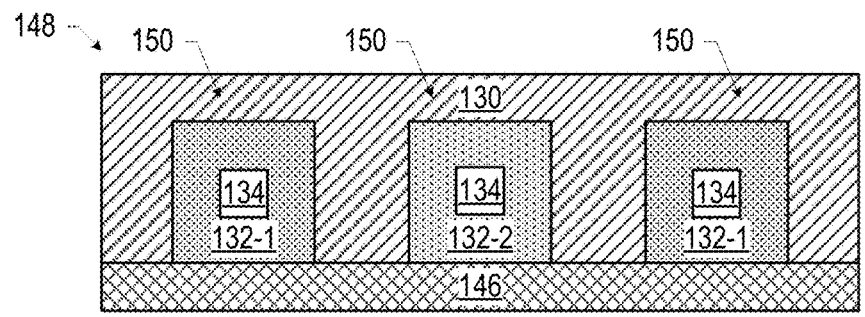
Figure 19:
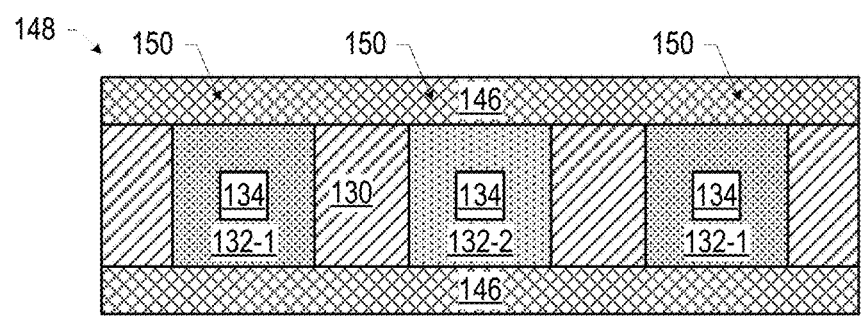
Figure 20:
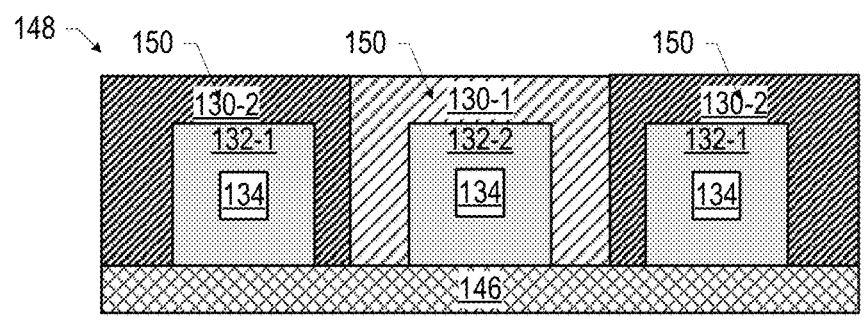
Figure 21:
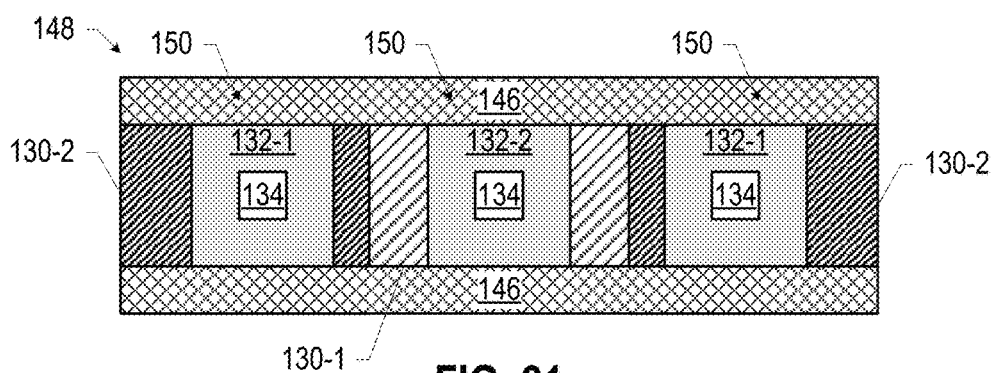
Figure 22:
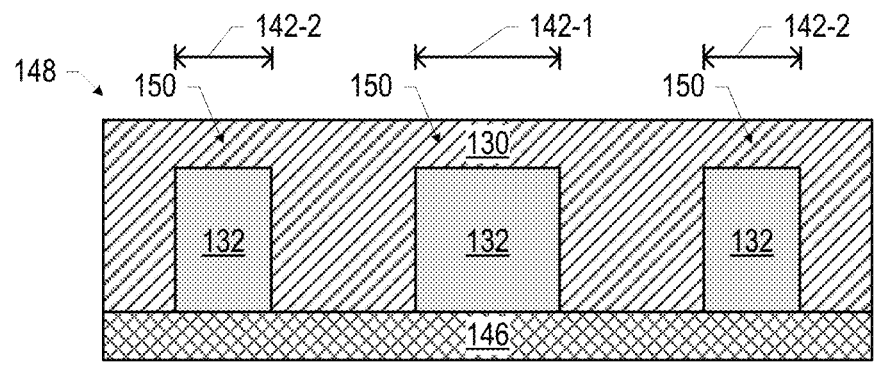
Figure 23:
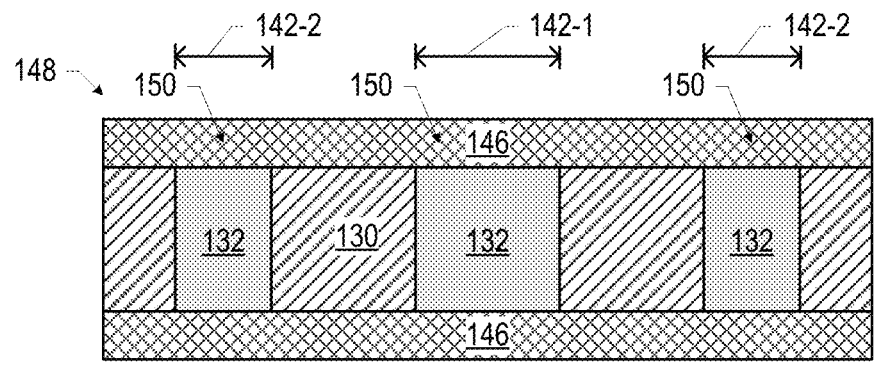

Waveguide bundles 148 including adjacent dielectric waveguides 150 having different structures may also be utilized in grounded dielectric waveguide bundles 148 like those of FIG. 3 and in non-radiative dielectric waveguide bundles 148 like those of FIG. 4. For example, FIGS. 16 and 17 illustrate a grounded dielectric waveguide bundle 148 and a non-radiative dielectric waveguide bundle 148, respectively, including adjacent dielectric waveguides 150 having openings 134 of different diameters 140, as discussed above with reference to FIG. 12. FIGS. 18 and 19 illustrate a grounded dielectric waveguide bundle 148 and a non-radiative dielectric waveguide bundle 148, respectively, including adjacent dielectric waveguides 150 having core materials 132 with different dielectric constants (e.g., due to different material compositions), as discussed above with reference to FIG. 13. FIGS. 20 and 21 illustrate a grounded dielectric waveguide bundle 148 and a non-radiative dielectric waveguide bundle 148, respectively, including adjacent dielectric waveguides 150 having cladding materials 130 with different dielectric constants (e.g., due to different material compositions), as discussed above with reference to FIG. 14. FIGS. 22 and 23 illustrate a grounded dielectric waveguide bundle 148 and a non-radiative dielectric waveguide bundle 148, respectively, including adjacent dielectric waveguides 150 having core materials 132 with different widths 164, as discussed above with reference to the different diameters 140 of FIG. 15. Although FIGS. 12-23 depict one-dimensional arrays of dielectric waveguides 150, this is simply for ease of illustration, and the waveguide bundles 148 disclosed herein may include two-dimensional arrays of dielectric waveguides 150, as desired.

Figure 24:
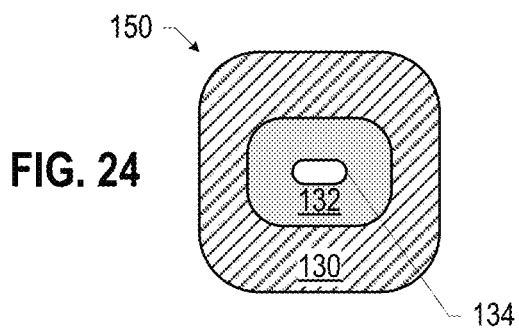
FIGS. 24-27 are cross-sectional views of example dielectric waveguides that may be used in a communication system, in accordance with various embodiments.
Figure 25:
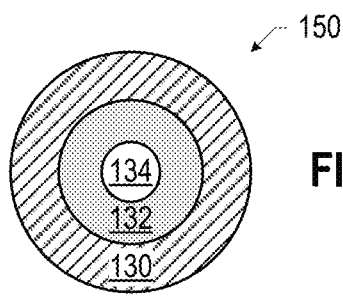
Figure 26:
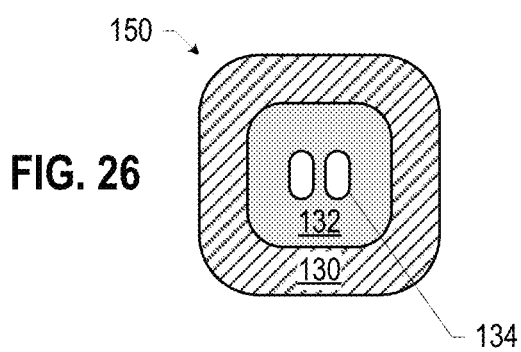
Figure 27:
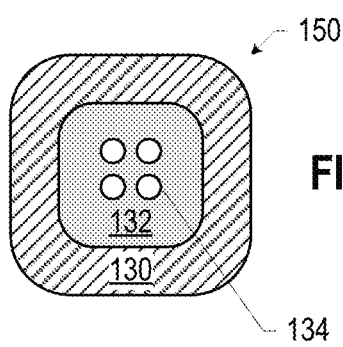

Although various elements of the dielectric waveguides 150 and the waveguide bundles 148 disclosed herein are depicted in the accompanying drawings as having particular shapes, these shapes are simply illustrative, and any suitable shapes may be used. For example, the opening 134 in a core material 132 may have any desired cross-sectional shape (e.g., circular, oval, square, rectangular, triangular, etc.). The core material 132 may have any desired cross-sectional shape (e.g., circular, oval, square, rectangular, triangular, etc.). The cladding material 130 may have any desired cross-sectional shape (e.g., circular, oval, square, rectangular, triangular, etc.) in a waveguide bundle like that of FIG. 2. The shapes of the cross-sections of various elements of a dielectric waveguide 150 need not all be the same; for example, the core material 132 may have a rectangular cross-section, while the cladding material 130 may have a circular cross-section. FIGS. 24 and 25 illustrate example dielectric waveguides 150 in which the opening 134, the core material 132, and the cladding material 130 have various shapes; in FIG. 24, the opening 134 has an oval cross-section, the core material 132 has a substantially rectangular cross-section, and the cladding material 130 has a substantially square cross-section, while in FIG. 25, the opening 134 has a circular cross-section, the core material 132 has a circular cross-section, and the cladding material 130 has a circular cross-section. Moreover, the dielectric waveguides 150 and the waveguide bundles 148 disclosed herein may include more than one of various elements. For example, FIGS. 26 and 27 illustrate embodiments in which the core material 132 includes multiple openings 134 (i.e., two oval openings 134 in FIG. 26, and four circular openings 134 in FIG. 27). Any of the dielectric waveguides 150 disclosed herein may include multiple openings 134 in the core material 132. Dielectric waveguides 150 having 90-degree rotational symmetry may have an identical response for the horizontal-polarized mode and the vertical-polarized mode; polarization multiplexing may be used to double the supported data rate. Further, polarization-dependent waveguide structures may be used with any of the dielectric waveguides 150 and/or waveguide bundles 148 disclosed herein.

As discussed above, any of the dielectric waveguides 150/waveguide bundles 148 disclosed herein may be included in a waveguide cable 118. In particular, the dielectric waveguides 150/waveguide bundles 148 may be included in a cable body 116 and have cable connectors 114 at either end that coupled to package connectors 112. In some embodiments, the dielectric waveguides 150/waveguide bundles 148 disclosed herein may, in order to achieve the benefits of compensated intra-modal group delay dispersion, be vulnerable to spurious excitations of undesired higher-order modes that travel at different speeds than the signaling mode, potentially leading to ISI resulting from inter-modal dispersion. The cable connectors 114/package connectors 112 may be designed to attenuate these higher-order modes that arise along the cable body 116, allowing reduced dispersion dielectric waveguides 150 (e.g., any of the dielectric waveguides 150 of FIGS. 5-11) to be included in a cable body 116 and handling the ISI that arises from such reduced dispersion dielectric waveguides 150 by the structure of the connector complex 114/112.

FIGS. 28A-28B, 29A-29B, 30, 31A-31B, 32, 33A-33B, and 34-35 are cross-sectional views of example waveguide connector complexes that may be used in a millimeter-wave communication system 100, in accordance with various embodiments. Although particular portions of the complexes in FIGS. 28-35 are identified as the package connector 112 and the cable connector 114, the roles of these connectors may be reversed (i.e., the structures identified as the cable connector 114 may be used as a package connector 112, and vice versa). In FIGS. 28-35, the illustrated waveguide connector complexes include a cable connector 114 (at the end of a cable body 116 of a waveguide cable 118) that is to mate with a package connector 112. The package connector 112 is shown on a microelectronic support 104, with the core material 132 coupled to a transmission line 120 between a surface of the microelectronic support 104 and a microelectronic component 106 (e.g., a millimeter-wave transceiver). Launch/filter structures 110 that may be included in the microelectronic support 104 between the package connector 112 and the transmission line 120 are not shown. The microelectronic component 106 is depicted as coupled to the microelectronic support 104 by solder 168, but this is simply illustrative, and any type of interconnect (e.g., metal-to-metal interconnects) may be used. Further, although FIGS. 28-35 depict a single dielectric waveguide in the cable body 116 (and thus a single "lane" for communication), this is simply for ease of illustration, and cable connectors 114/package connectors 112 may include multiple waveguides for multi-lane communication (e.g., as discussed above with reference to the waveguide bundles 148).

Figure 28A:
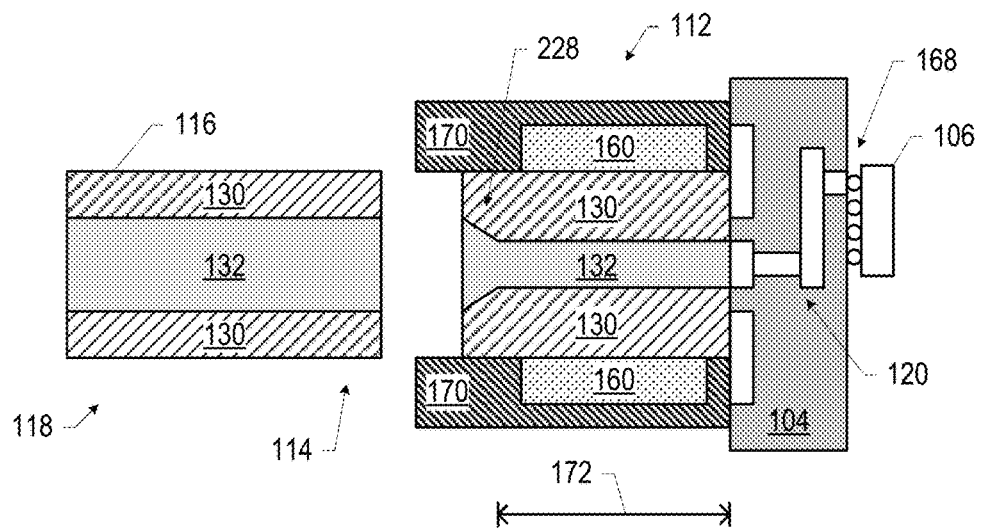
FIGS. 28A-28B, 29A-29B, 30, 31A-31B, 32, 33A-33B, and 34-35 are cross-sectional views of example waveguide connector complexes that may be used in a communication system, in accordance with various embodiments.
Figure 28B:
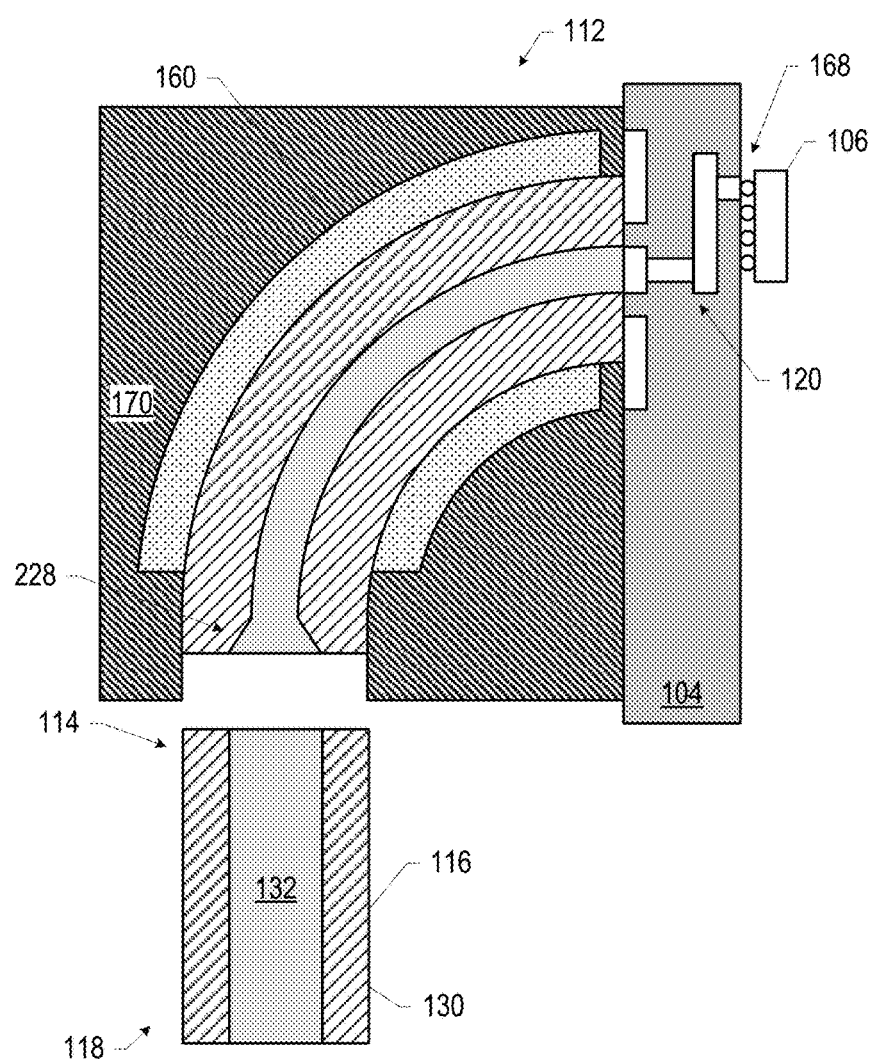

In FIGS. 28A and 28B (as well as in FIGS. 29-35), a small portion of the cable body 116 leading to the cable connector 114 is shown; the structure of this cable body 116 is simply illustrative, and the cable body 116 may take the form of any of the dielectric waveguides 150 disclosed herein. The cable connector 114 is simply the end of the cable body 116, and is received in a recess of the package connector 112. The package connector 112 includes a core material 132 (which may be the same core material 132 included in the cable body 116, or a different core material 132) that has a flared portion 228, increasing diameter toward the interface between the package connector 112 and the cable connector 114, as shown. Narrowing the diameter of the core material 132 from the cable body 116 to the core material 132 of the package connector 112 may cause higher-order modes to attenuate faster relative to the attenuation of the fundamental signaling mode, effectively filtering higher-order modes and reducing inter-modal dispersion. Such embodiments may support high operational bandwidth and may be less sensitive to manufacturing variations than transitions directly into transmission lines. A cladding material 130 may surround the core material 132 of the package connector 112; this cladding material 130 may be the same cladding material 130 included in the cable body 116, or a different cladding material 130. In some embodiments, the length of the core material 132 in the package connector 112 may be between 5 millimeters and 50 millimeters.

An absorber material 160 may be disposed around a portion of the cladding material 130 of the package connector 112, and may be laterally spaced apart from the flared portion 228 of the core material 132 and from the microelectronic support 104, as shown. The absorber material 160 may take the form of any of the embodiments disclosed herein, and may absorb the energy of the undesirable higher-order modes propagating along the waveguide cable 118, filtering these higher-order modes out before they reach the microelectronic support 104 without reflecting the higher-order modes back into the waveguide cable 118. A connector body 170 may wrap around the cladding material 130 and the absorber material 160, with the exposed surface of the cladding material 130 and the core material 132 recessed from an end of the connector body 170 to provide a socket for the cable connector 114. In some embodiments, the connector body 170 may be formed of a plastic material. FIG. 28A illustrates an embodiment in which the interface between the package connector 112 and the cable connector 114 is parallel to the interface between the package connector 112 and the microelectronic support 104, while FIG. 28B illustrates an embodiment in which the core material 132, cladding material 130, and absorber material 160 of the package connector 112 are curved so that the interface between the package connector 112 and the cable connector 114 is rotated 90 degrees relative to the interface between the package connector 112 and the microelectronic support 104. The core material 132, the cladding material 130, and the absorber material 160 of the package connector 112 may be curved in any desired manner to achieve a desired relative angle between the interface between the package connector 112 and the cable connector and the interface between the package connector 112 and the microelectronic support 104. Curved cable connectors 114 and/or package connectors 112 may be advantageous in server rack interconnects, for example, and may provide improved connector performance due to the increased radiation of higher-order modes into the absorber material 160 (as they are more weakly confined).

Figure 29A:
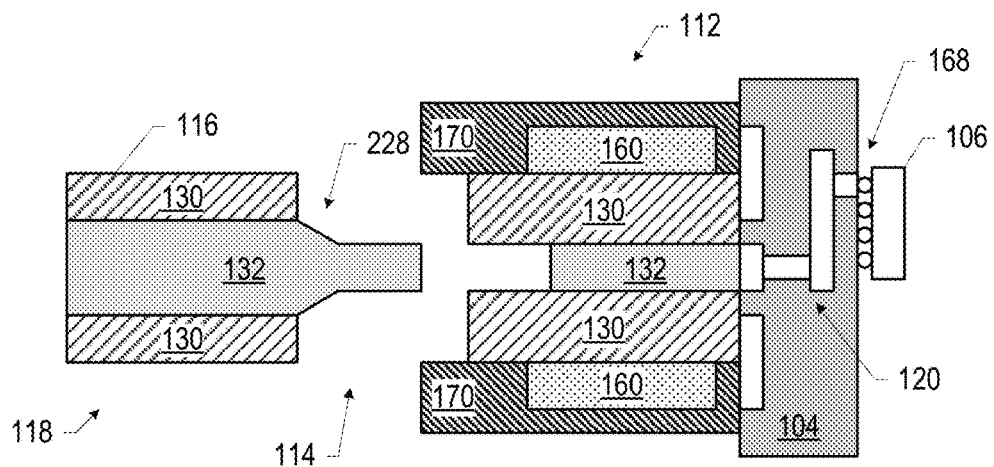
Figure 29B:
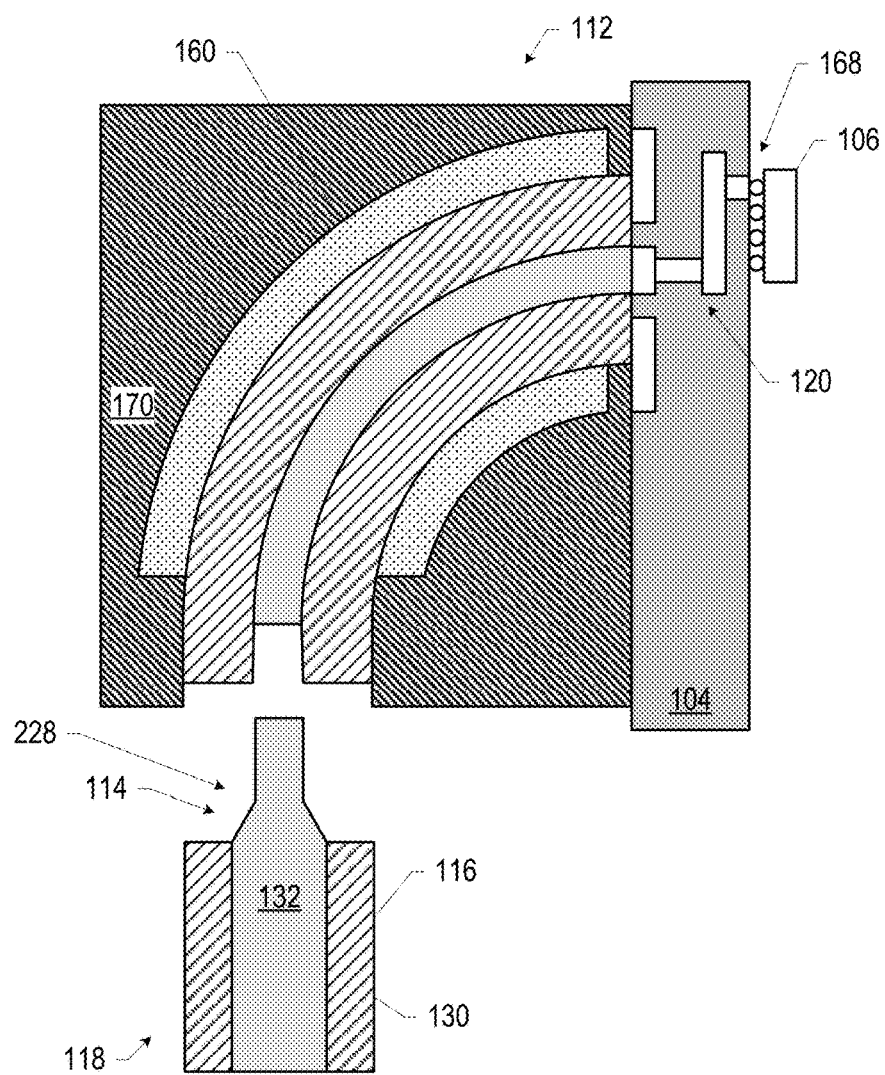

FIGS. 29A and 29B illustrate waveguide connector complexes sharing many features with the waveguide connector complexes of FIGS. 28A and 28B, respectively, but in which the flared portion 228 is part of the core material 132 of the cable connector 114, rather than part of the core material 132 of the package connector 112. In the embodiments of FIG. 29, the flared portion 228 of the core material 132 of the package connector 112 may extend beyond the cladding material 130 of the cable body 116. In the package connector 112, the cladding material 130 may be recessed from the end of the connector body 170, and the core material 132 may be recessed from the end of the cladding material 130, as shown.

Figure 30:
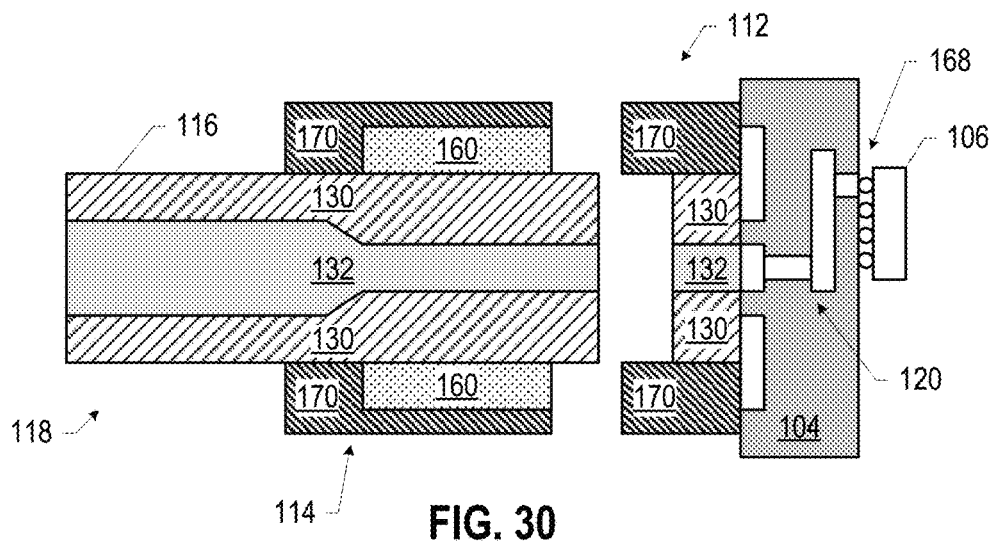
Figure 31A:
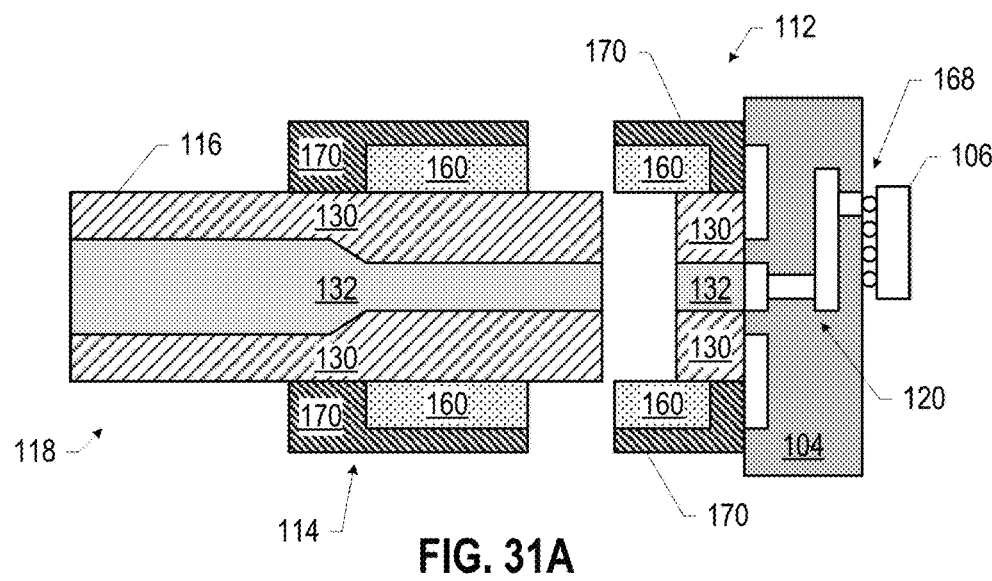
Figure 31B:
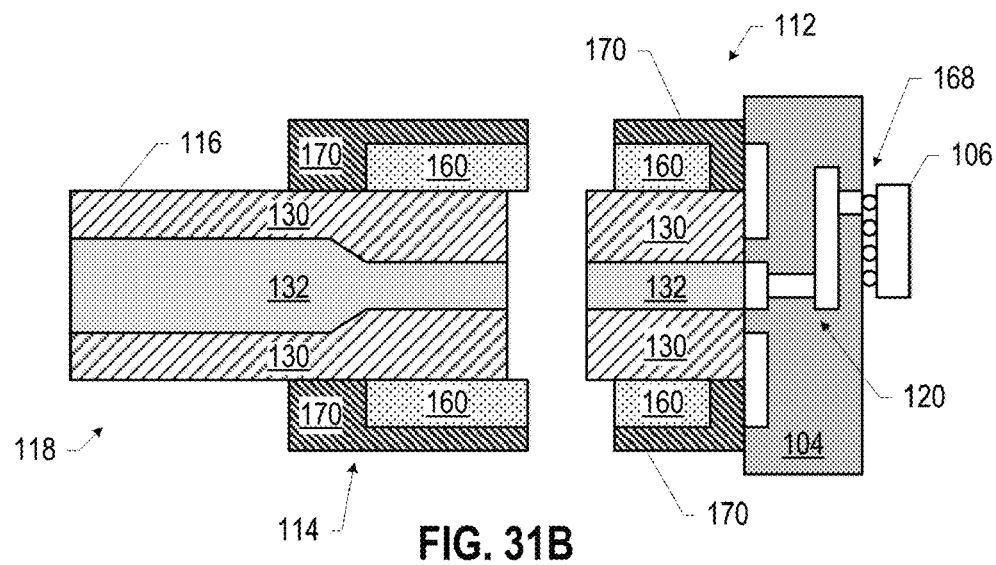

The particular embodiments of waveguide connector complexes illustrated in the accompanying drawings may admit a number of variants. For example, FIG. 30 illustrates a waveguide connector complex similar to that of FIG. 29A, but in which the cable connector 114 includes a connector body 170 and the absorber material 160 is part of the cable connector 114 instead of the package connector 112. The core material 132 and the cladding material 130 of the package connector 112 are recessed from the connector body 170 of the package connector 112 to receive the core material 132 and the cladding material 130 of the cable connector 114 (which extends past the connector body 170 of the cable connector 114). FIG. 31A illustrates a waveguide connector complex similar to that of FIG. 30, but in which the absorber material 160 is included in both the cable connector 114 and the package connector 112. FIG. 31B illustrates a waveguide connector complex similar to that of FIG. 31A, but in which the core material 132 and the cladding material 130 of the package connector 112 extend past the connector body 170 of the package connector 112 so as to mate with a socket in the waveguide cable 118 formed by the cladding material 130 and the core material 132 recessed from the connector body 170 of the cable connector 114. Any of the waveguide connector complexes disclosed herein may include such variants.

Figure 32:
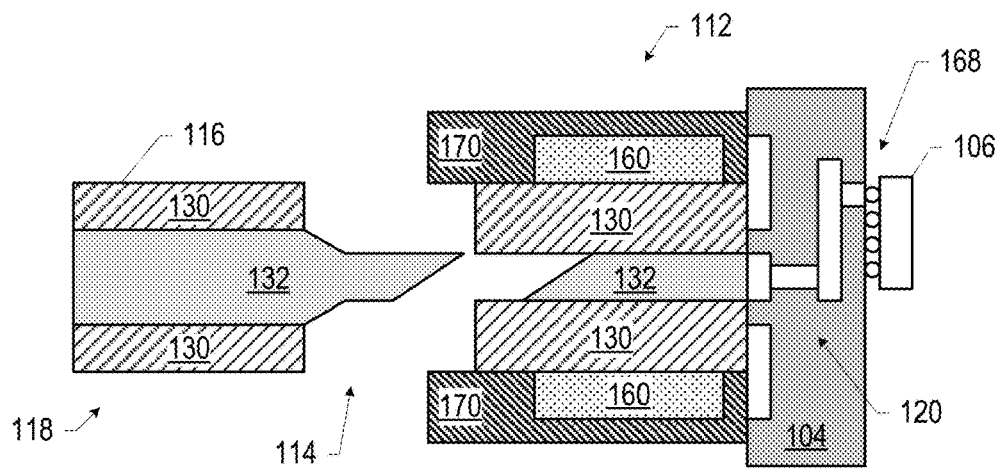

In some embodiments, ends of the core materials 132 at the interface between the cable connector 114 and the package connector 112 may be angled (e.g., at an angle between 30 degrees and 60 degrees). For example, FIG. 32 illustrates a waveguide connector complex similar to that of FIG. 29A, but in which ends of the core materials 132 of the package connector 112 and the cable connector 114 have complementary oblique core cuts (e.g., relative to a surface of the microelectronic support 104 to which the package connector 112 is coupled). Such angled ends of the core materials 132 may be advantageous when the core material 132 of the cable connector 114 has a different dielectric constant than the core material 132 of the package connector 112. Any of the waveguide connector complexes disclosed herein may include angled core materials 132.

Figure 33A:
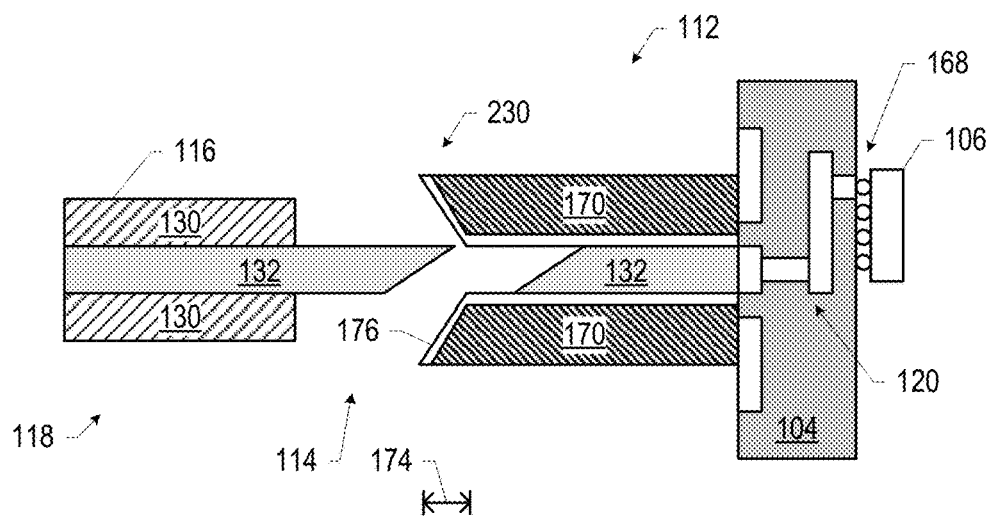
Figure 33B:
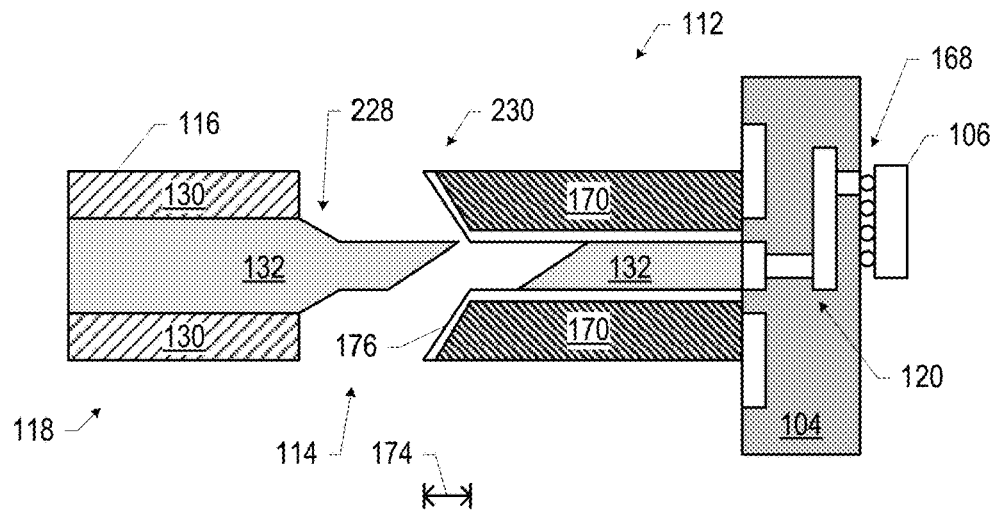

In some embodiments, a waveguide connector complex may include a metal layer around the core material 132 in the package connector 112. FIGS. 33A and 33B illustrate waveguide connector complexes including such a metal structure 176. The metal structure 176 may be disposed between the core material 132 and the connector body 170 of the package connector 112, and may have a flared portion 230, as shown. The flared portion 230 may reduce reflections for the signaling mode to improve signal integrity; in the absence of a flared portion 230, the transition between the cable connector 114 and the package connector 112 may be abrupt, reflecting a large portion of the signal and potentially causing standing waves inside the package connector 112. Higher-order modes may be reflected with or without the flared portion 230; this may be desirable to reduce intermodal dispersion. In some embodiments, the flared portion 230 may have a length 174 that is between the wavelength of the frequency of interest and five times the wavelength of the frequency of interest. The waveguide connector complexes of FIGS. 33A and 33B include angled core materials 132, but this need not be the case.

In the embodiment of FIG. 33A, the diameter of the core material 132 of the cable connector 114 may be the same as the diameter of the core material 132 of the package connector 112, and thus no flared portion may be present. In the embodiment of FIG. 33B, the diameter of the core material 132 of the cable connector 114 is greater than a diameter of the core material 132 of the package connector 112, and thus a flared portion 228 is present in the cable connector 114 (or the package connector 112) to match the diameter of the core material 132 of the package connector 112. Waveguide connector complexes including a metal structure 176 with a flared portion 230 may introduce anomalous dispersion, and thus may be used to compensate for the normal dispersion that may arise in the cable body 116. Further, the anomalous dispersion introduced by the package connectors 112 of FIGS. 33A and 33B may be large, allowing the moderate amounts of normal dispersion arising from the cable body 116 to be compensated for in a fairly small package connector 112.

Figure 34:
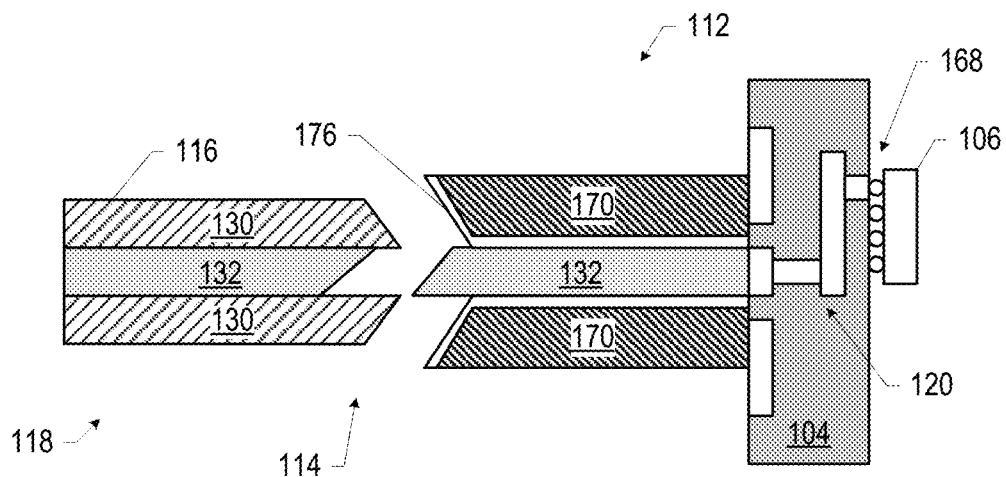
Figure 35:
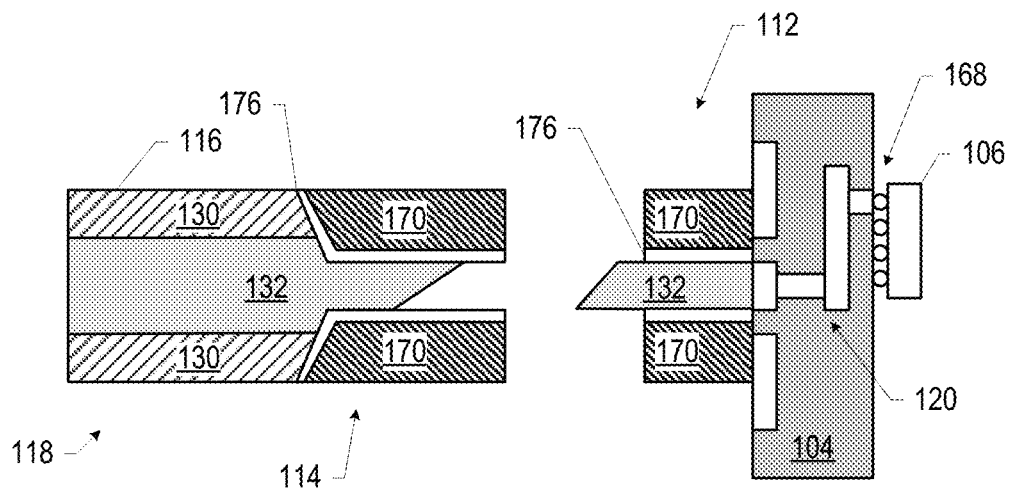

FIGS. 34 and 35 illustrate example variants of the embodiments of FIGS. 33A and 33B. FIG. 34 illustrates an embodiment in which the cladding material 130 of the cable connector 114 is tapered to match the flared and 230 of the metal structure 176 of the package connector 112. FIG. 34 illustrates an embodiment in which the cable connector 114 also includes a metal structure 176 and a connector body 170. Any of the waveguide connector complexes disclosed herein may include such variants.

Figure 36A:
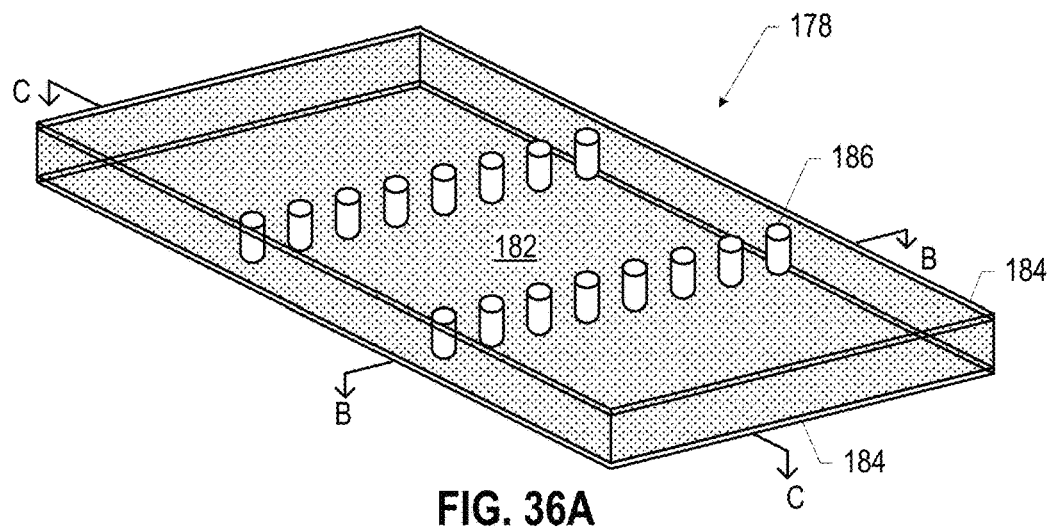
FIGS. 36A-36C are cross-sectional views of an example substrate-integrated waveguide that may be used in a communication system, in accordance with various embodiments.
Figure 36B:
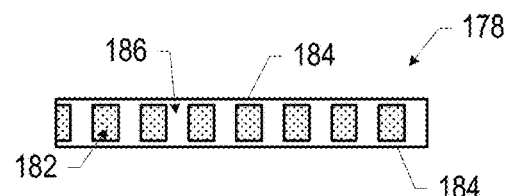
Figure 36C:
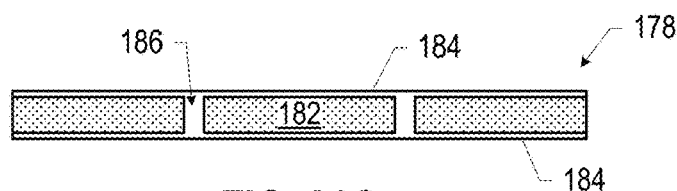

In some embodiments, the launch/filter structures 110 included in a microelectronic support 104 may include one or more substrate-integrated waveguides to provide dispersion compensation, in addition to or instead of the other dispersion-compensation structures disclosed herein. FIG. 36 illustrates a substrate-integrated waveguide 178; FIG. 36A is a perspective view, FIG. 36B is a side, cross-sectional view through the section B-B of FIG. 36A, and FIG. 36C is a side, cross-sectional view through the section C-C of FIG. 36A. The substrate-integrated waveguide 178 may include two metal plates 184 coupled by metal posts 186 through a dielectric material 182 therebetween. In some embodiments, the metal plates 184 may be provided by metal planes in metal layers of the microelectronic support 104, while the metal posts 186 may be provided by vias between the metal planes. A substrate-integrated waveguide 178 may have anomalous dispersion, and thus may be used to compensate for normal dispersion in a dielectric waveguide 150/waveguide bundle 148.

Figure 37:
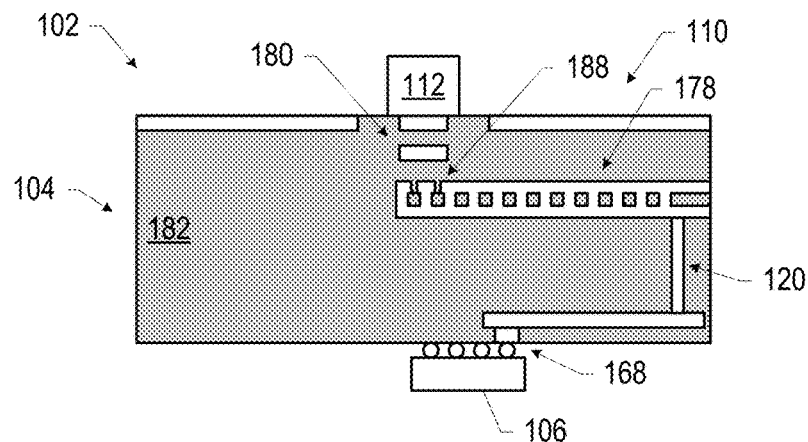
FIGS. 37-39 are cross-sectional views of example microelectronic packages that may include one or more substrate-integrated waveguides, in accordance with various embodiments.

A substrate-integrated waveguide 178 may be arranged in a microelectronic support 104 and any of a number of ways. For example, FIG. 37 illustrates a microelectronic support 104 including a substrate-integrated waveguide 178 coupled between a patch launcher 180 (which may be part of the launch/filter structures 110) and a transmission line 120 to a microelectronic component 106. The patch launcher 180 may be communicatively coupled to a package connector 112, and the substrate-integrated waveguide 178 may be slot-coupled to the patch launcher 180 via slots 188 under the patch launcher 180.

Figure 38:
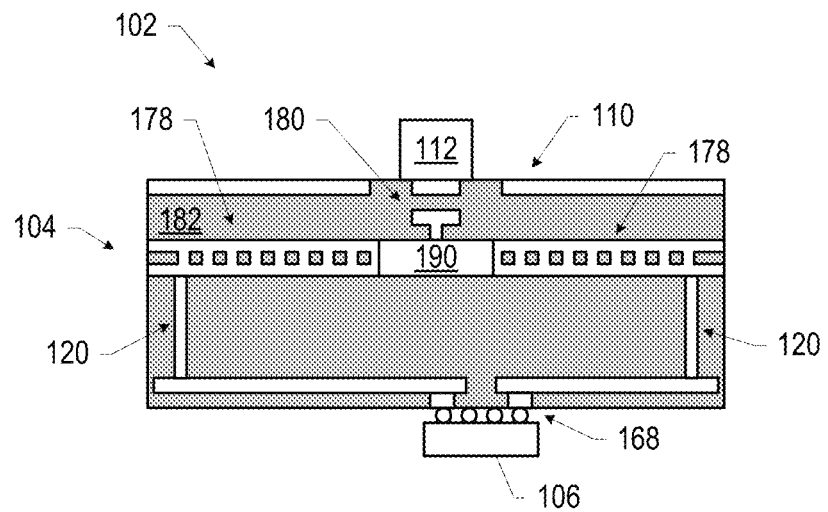

FIG. 38 illustrates a microelectronic support 104 including multiple substrate-integrated waveguides 178. These substrate-integrated waveguides 178 may be coupled between a multiplexer 190 and different transmission lines 120 (which may lead to one microelectronic component 106, as shown, or multiple microelectronic components 106, as desired). The patch launcher 180 may be communicatively coupled to a package connector 112, and the multiplexer 190 may be coupled between the patch launcher 180 and the substrate-integrated waveguides 178. The multiplexer 190 may separate different frequency bands and direct those frequency bands to different ones of the substrate-integrated waveguides 178 for dispersion compensation. In some embodiments, the multiplexer 190 may be a diplexer, or an N-plexer with N equal to three or more.

Figure 39:
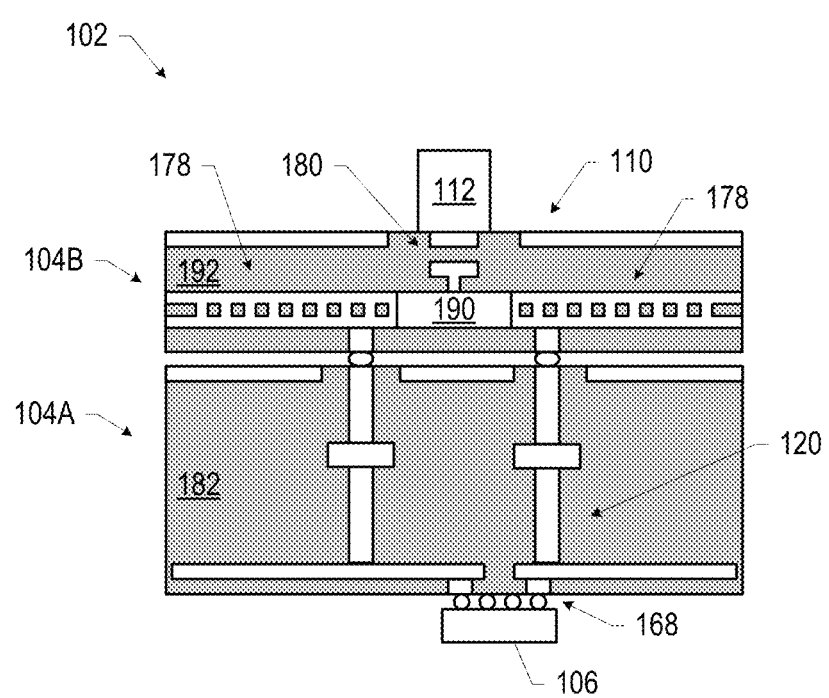

FIG. 39 illustrates an embodiment similar to that of FIG. 38, but in which the microelectronic support 104 includes a first portion 104A and a second portion 104. The first portion 104A may be, for example, a package substrate, while the second portion 104 may be, for example, a silicon-based interposer, another semiconductor-based interposer, or another interposer (e.g., one including organic materials, ceramic materials, glass materials, etc.). In the embodiment of FIG. 39, the package connector 112, the patch launcher 180, the multiplexer 190, and the substrate-integrated waveguides 178 are included in the second portion 104B, while the microelectronic component 106 is coupled to the first portion 104A. The first portion 104A and the second portion 104B may be coupled together in any suitable manner, such as using solder, metal-to-metal interconnects, or other interconnects. The second portion 104B may be, for example, a dedicated passive interposer and the material 192 of the second portion 104B may have a higher dielectric constant than the dielectric material 182 of the first portion 104A, achieving a greater dispersion compensation per unit length and decreasing the width of the substrate-integrated waveguides 178 relative to a substrate-integrated waveguide 178 included in the first portion 104A. In some embodiments, the material 192 may include silicon (e.g., high-resistivity silicon), aluminum nitride, or any other suitable material (e.g., a material with a high dielectric constant and a low loss tangent). Although patch launchers 180 are depicted in FIGS. 37-39, this is simply illustrative, and any suitable launcher structure may be included in a launch/filter structure 110 (e.g., one or more antennas, horn-like launchers, Vivaldi-like launchers, dipole-based launchers, or slot-based launchers).

Figure 40:
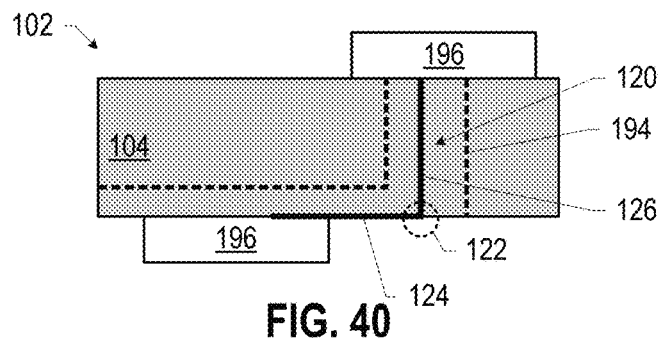
FIGS. 40-42 are cross-sectional views of example microelectronic packages that may include one or more transmission line transitions, in accordance with various embodiments.
Figure 41:
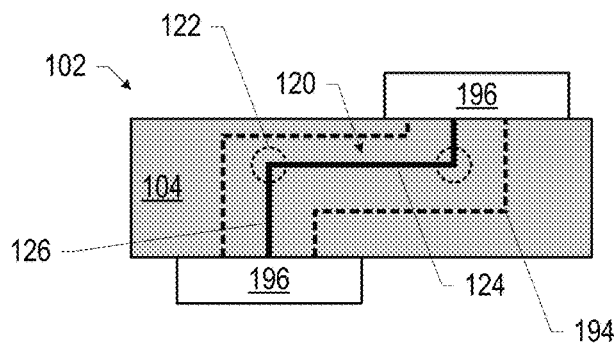
Figure 42:
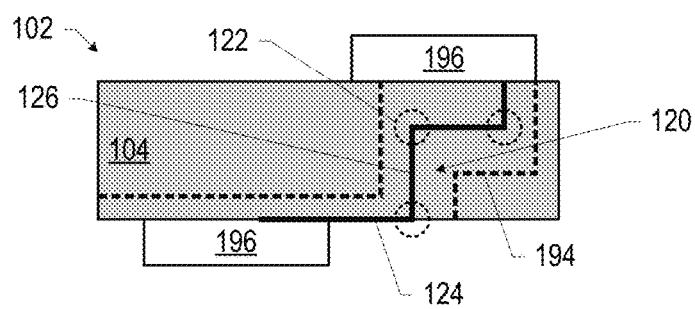

As noted above, a transmission line 120 in a microelectronic support 104 may include one or more horizontal portions 124, one or more vertical portions 126, and one or more transitions 122 between a horizontal portion 124 and a vertical portion 126. The transmission lines 120 in a microelectronic support 104 may be shielded by a shield structure 194, formed of metal planes, vias, and traces, as appropriate, and largely surrounding the transmission lines 120. FIGS. 40-42 illustrate example arrangements of transmission lines 120 in a microelectronic package 102. In these FIGS., the transmission line 120 is communicatively coupled between two microelectronic elements 196 at opposite faces of a microelectronic support 104; the microelectronic elements 196 may include any of the microelectronic components 106 disclosed herein, or any of the package connectors 112 disclosed herein, for example. Launch/filter structures 110 are not depicted in FIGS. 40-42 for ease of illustration, but may be present.

In the embodiment of FIG. 40, a single transition 122 couples a surface horizontal portion 124 and a vertical portion 126. In some embodiments, the horizontal portion 124 of FIG. 40 may be a microstrip, including a trace spaced apart from an underlying ground plane by a dielectric material, and the vertical portion 126 of FIG. 40 may include one or more vias and via pads therebetween; although FIG. 40 and others of the accompanying drawings depict vertical portions 120 as being perfectly straight up and down, this is simply illustrative, and a vertical portion 126 may include a staggered stack of vias or any other suitable structure. In the embodiment of FIG. 41, a single horizontal portion 124 is coupled between two vertical portions 126, and thus the transmission line 120 includes two transitions 122. In some embodiments, the horizontal portion 124 of FIG. 41 may be a stripline, including a trace disposed vertically between two ground planes and spaced apart from the ground planes by a dielectric material, or a coplanar waveguide, including a trace disposed horizontally between two ground planes (or ground traces) and spaced apart from the ground planes (or ground traces) by a dielectric material. In the embodiment of FIG. 42, the transmission line 120 includes two horizontal portions 124, two vertical portions 126, and three transitions 122.

Transitions in a transmission line have the potential to compromise the signal integrity of communications along the transmission line. For example, conventional transitions between conventional horizontal portions and conventional vertical portions may result in parasitic capacitances (e.g., coplanar ground/metal capacitances) and inductances that may cause reflections of signal waveforms that can limit the operating bandwidth and the corresponding achievable data rate. Disclosed herein, and discussed below with reference to FIGS. 40-65, are transmission lines 120 having various features that may be implemented in the vertical portions 126 and/or the horizontal portions 124 around a transition 122 to achieve a desired impedance match at these transitions 122 to improve the integrity of signal propagation through the transitions 122, and thus improve the operational bandwidth.

In some embodiments, a transmission line 120 may include one or more stubs 206 of conductive material (e.g., a metal) that may short the transmission line 120 to the grounded shield structure 194. When communicating employing baseband signaling techniques, shorting a transmission line 120 to a grounded shield structure 194 may eliminate the ability to transmit data over that transmission line 120. However, at millimeter-wave frequencies employing bandpass signaling techniques, stubs 206 providing such a short may behave as a reactive impedance and thus may change the impedance of the transmission line 120 without preventing communication. Thus, stubs 206 may be selectively utilized to achieve a desired impedance for different portions of a transmission line 120 around the transition 122, improving the impedance match between the different portions. Stubs 206 may be included in any desired metal layer of a transmission line 120, and the dimensions of the transmission line 120 (including the dimensions of the stubs 206 and associated features) may be selected to achieve high signal integrity and wide transmission bandwidths in the operating frequency range of interest.

Figure 43:
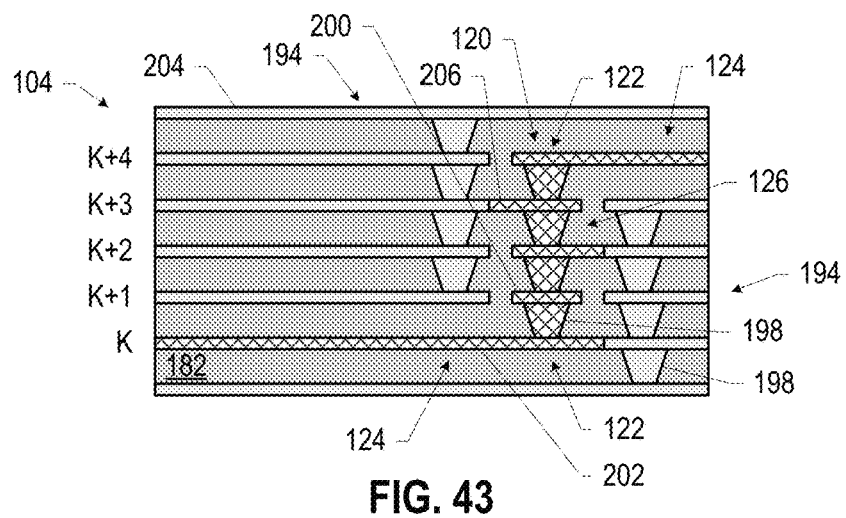
FIG. 43 is a cross-sectional view of a microelectronic support that may include a transmission line with one or more stubs, in accordance with various embodiments.

FIGS. 43 and 44 illustrate an example microelectronic substrate 104 including a transmission line 120 with multiple stubs 206. In particular, FIG. 43 is a cross-sectional view of the microelectronic support 104, having labeled metal layers K, K+1, K+2, K+3, and K+4, and FIGS. 44A-44E are top views of the metal layers in the microelectronic support 104. The transmission line 120 of FIGS. 43 and 44 include a single vertical portion 126 coupled between two horizontal portions 124 (and thus includes two transitions 122). The horizontal portions 124 include traces 202, and the vertical portion 126 includes vias 198 and via pads 200. A shield structure 194 surrounds the transmission line 120, and is grounded during operation. The shield structure 194 includes metal planes 204 and vias 198.

Figure 44A:
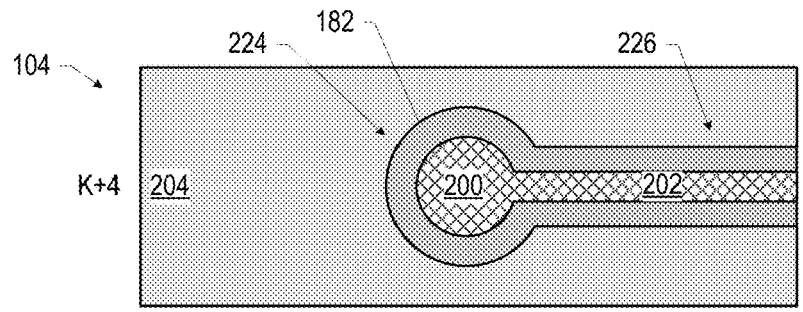
FIGS. 44A-44E are top views of the metal layers in the microelectronic support of FIG. 43, in accordance with various embodiments.
Figure 44B:
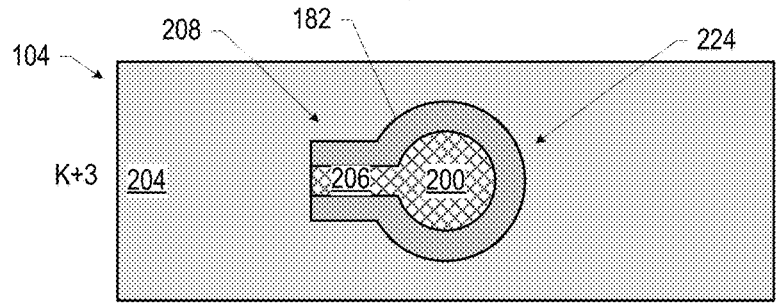
Figure 44C:
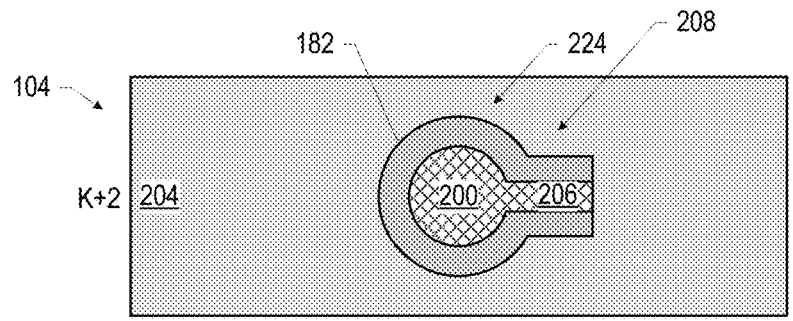
Figure 44D:
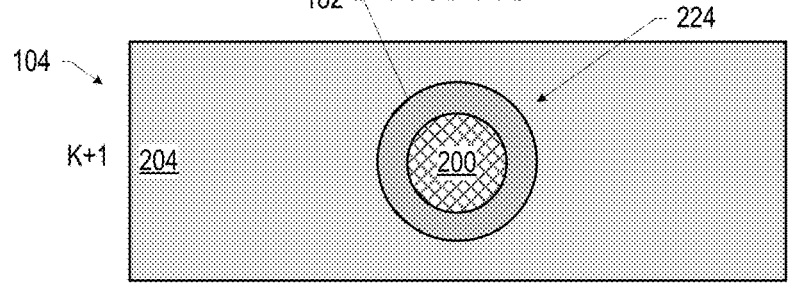
Figure 44E:
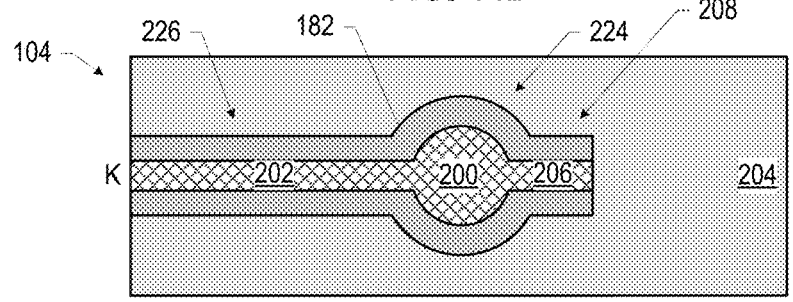

As shown in FIG. 43 and FIG. 44E, the metal layer K may include a trace 202, a via pad 200, and a stub 206 in contact with the via pad 200 and a metal plane 204 of the shield structure 194. Although different shading is used in various ones of the accompanying drawings for the transmission line 120 and the shield structure 194, this is simply to improve understanding of the drawings, and the material of the transmission line 120 and the shield structure 194 may be the same, with the components of the transmission line 120 and the shield structure 194 that are included in a single metal layer being fabricated together. The trace 202 and the via pad 200 of the metal layer K (FIG. 44E) may be spaced apart from the metal plane 204 by an intervening dielectric material 182. The area of dielectric material 182 between the trace 202 and the nearest portion of the metal plane 204 may be referred to as the antitrace 226, while the area of dielectric material 182 between the via pad 200 and the nearest portion of the metal plane 204 may be referred to as the antipad 224. The antipad 224 may have a substantially circular footprint (or may have a footprint substantially having another shape, such as a polygonal shape), but may include an antipad extension 208 into which the stub 206 extends. The dimensions of the traces 202, antitraces 226, via pads 200, antipads 224, stubs 206, and antipad extensions 208 may be selected to achieve a desired impedance for the different portions of the transmission line 120. In some embodiments, an antipad 224 may include an antipad extension 208 without including a stub 206 extending therein.

As shown in FIG. 43 and FIG. 44D, the metal layer K+1 may include a via pad 200 spaced apart from a metal plane 204 by dielectric material 182 in an antipad 224. A via 198 may couple the via pad 200 in the metal layer K+1 to the via pad 200 in the metal layer K (FIG. 44E).

As shown in FIG. 43 and FIG. 44C, the metal layer K+2 may include a via pad 200 and a stub 206 in contact with the via pad 200 and a metal plane 204 of the shield structure 194. Like FIG. 44E, the via pad 200 of the metal layer K+2 may be spaced apart from the metal plane 204 by an intervening dielectric material 182 in an antipad 224 with a substantially circular footprint. The antipad 224 may include an antipad extension 208 into which the stub 206 extends. A via 198 may couple the via pad 200 in the metal layer K+2 to the via pad 200 in the metal layer K+1 (FIG. 44D).

As shown in FIG. 43 and FIG. 44B, the metal layer K+3 may include a via pad 200 and a stub 206 in contact with the via pad 200 and a metal plane 204 of the shield structure 194. Like FIGS. 44E and 44C, the via pad 200 of the metal layer K+2 may be spaced apart from the metal plane 204 by an intervening dielectric material 182 in an antipad 224 with a substantially circular footprint. The antipad 224 may include an antipad extension 208 into which the stub 206 extends. The stub 206 of the metal layer K+3 may extend in an opposite direction relative to the stubs 206 in the metal layers K+2 and K. A via 198 may couple the via pad 200 in the metal layer K+3 to the via pad 200 in the metal layer K+2 (FIG. 44C).

As shown in FIG. 43 and FIG. 44A, the metal layer K+4 may include a trace 202 and a via pad 200, as well as a metal plane 204 of the shield structure 194. The trace 202 and the via pad 200 of the metal layer K+4 may be spaced apart from the metal plane 204 by an intervening dielectric material 182 in an antitrace 226 and an antipad 224, respectively. A via 198 may couple the via pad 200 in the metal layer K+4 to the via pad 200 in the metal layer K+3 (FIG. 44B).

Figure 45:
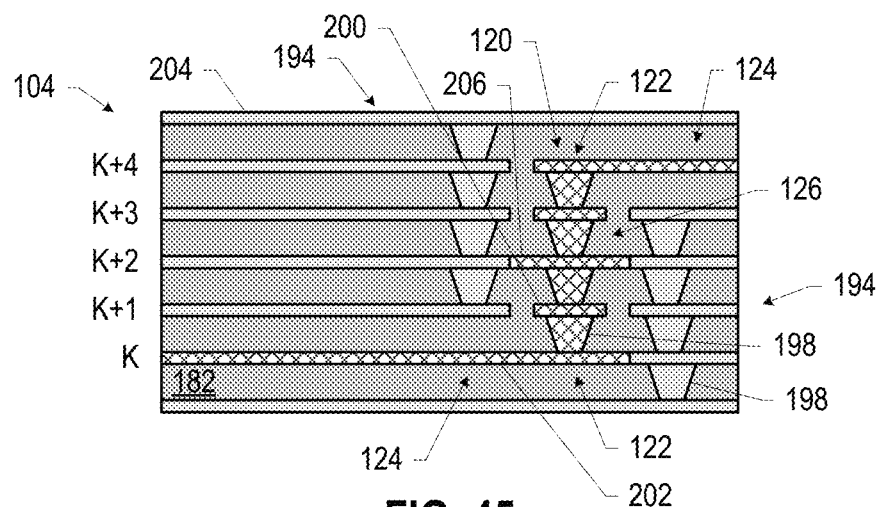
FIG. 45 is a cross-sectional view of a microelectronic support that may include a transmission line with one or more stubs, in accordance with various embodiments.

FIGS. 45 and 46 illustrate an example microelectronic substrate 104 including a transmission line 120 with multiple stubs 206. In particular, FIG. 45 is a cross-sectional view of the microelectronic support 104, having labeled metal layers K, K+1, K+2, K+3, and K+4, and FIGS. 46A-46E are top views of the metal layers in the microelectronic support 104. The transmission line 120 of FIGS. 45 and 46 include a single vertical portion 126 coupled between two horizontal portions 124 (and thus includes two transitions 122). The horizontal portions 124 include traces 202, and the vertical portion 126 includes vias 198 and via pads 200. A shield structure 194 surrounds the transmission line 120, and is grounded during operation. The shield structure 194 includes metal planes 204 and vias 198.

Figure 46A:
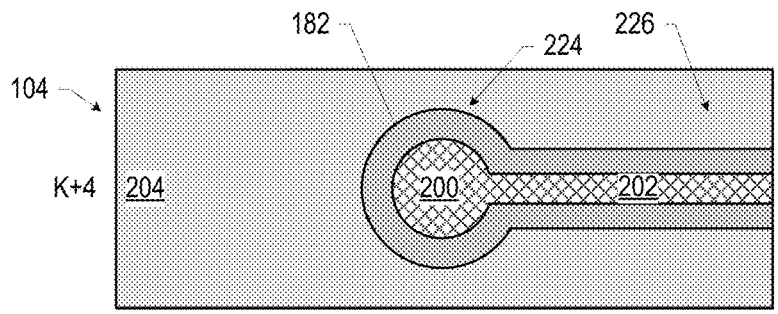
FIGS. 46A-46E are top views of the metal layers in the microelectronic support of FIG. 45, in accordance with various embodiments.
Figure 46B:
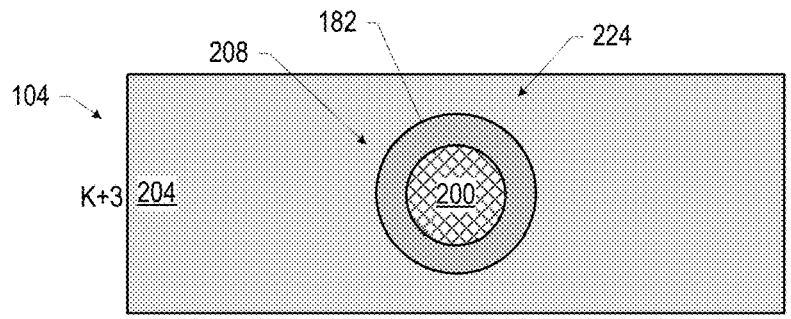
Figure 46C:
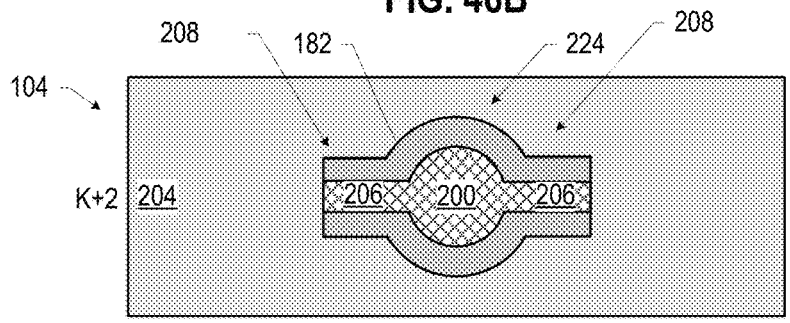
Figure 46D:
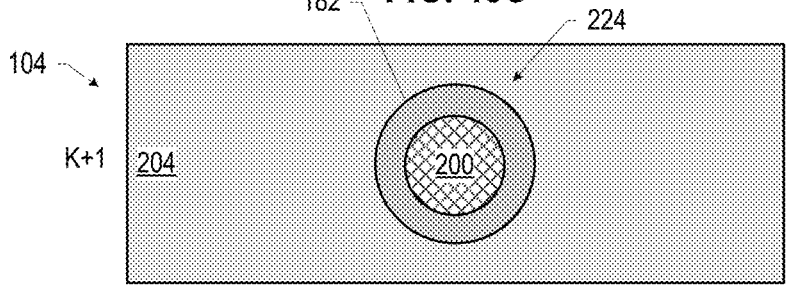
Figure 46E:
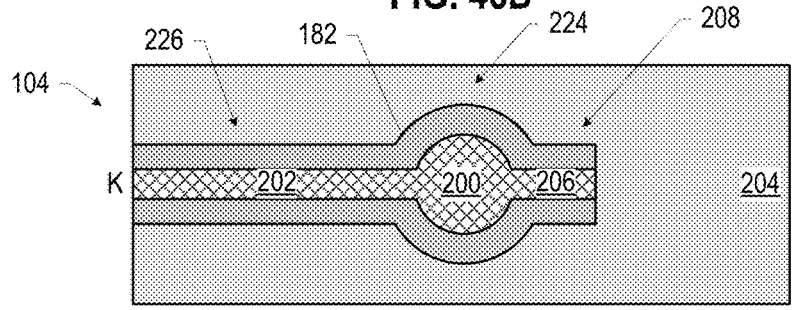

As shown in FIG. 45 and FIG. 46E, the metal layer K may have the same structure as the metal layer K of the embodiment of FIGS. 43 and 44E. As shown in FIG. 45 and FIG. 46D, the metal layer K+1 may have a same structure as a metal layer K+1 of the embodiment of FIGS. 43 and 44D. A via 198 may couple the via pad 200 in the metal layer K+1 to the via pad 200 in the metal layer K (FIG. 46E).

As shown in FIG. 45 and FIG. 46C, the metal layer K+2 may have a structure similar to that of the metal layer K+2 of the embodiment of FIGS. 43 and 44C, but may include an additional antipad extension 208 and an accompanying additional stub 206. Although the stubs 206 and antipad extensions 208 of FIGS. 45 and 46C are shown as disposed at opposite from each other relative to the intervening via pad 200 and antipad 224, two or more stubs 206 on a via pad 200 may be arranged in any desired manner relative to each other (as maybe the associated antipad extensions 208). A via 198 may couple the via pad 200 in the metal layer K+2 to the via pad 200 in the metal layer K+1 (FIG. 46D).

As shown in FIGS. 45 and 46B, the metal layer K+3 may have the same structure as the metal layer K+1 of FIGS. 43 and 44D. A via 198 may couple the via pad 200 in the metal layer K+3 to the via pad 200 in the metal layer K+2 (FIG. 46C). As shown in FIG. 45 and FIG. 46A, the metal layer K+4 may have the same structure as the metal layer K+4 of FIGS. 43 and 44A. A via 198 may couple the via pad 200 in the metal layer K+4 to the via pad 200 in the metal layer K+3 (FIG. 46B).

Figure 47:
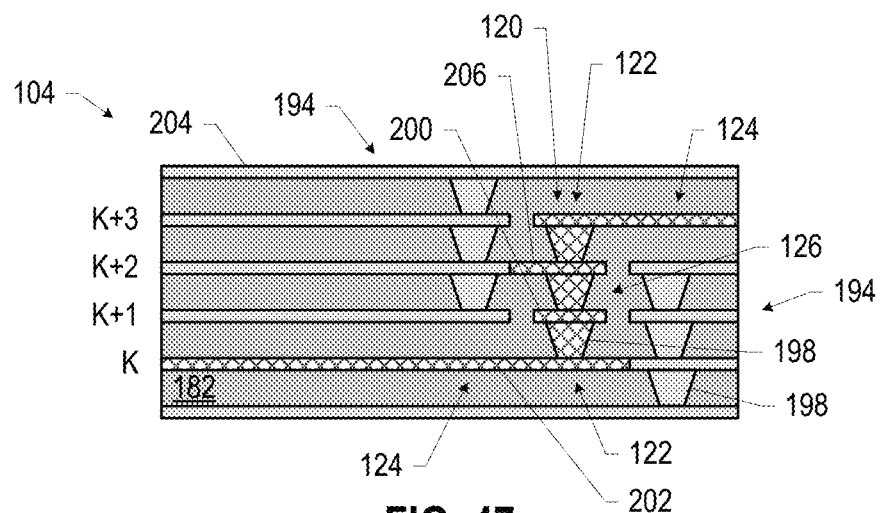
FIG. 47 is a cross-sectional view of a microelectronic support that may include a transmission line with one or more stubs, in accordance with various embodiments.

FIGS. 47 and 48 illustrate an example microelectronic substrate 104 including a transmission line 120 with multiple stubs 206. In particular, FIG. 47 is a cross-sectional view of the microelectronic support 104, having labeled metal layers K, K+1, K+2, and K+3, and FIGS. 48A-48D are top views of the metal layers in the microelectronic support 104. The transmission line 120 of FIGS. 47 and 48 include a single vertical portion 126 coupled between two horizontal portions 124 (and thus includes two transitions 122). The horizontal portions 124 include traces 202, and the vertical portion 126 includes vias 198 and via pads 200. A shield structure 194 surrounds the transmission line 120, and is grounded during operation. The shield structure 194 includes metal planes 204 and vias 198.

Figure 48A:
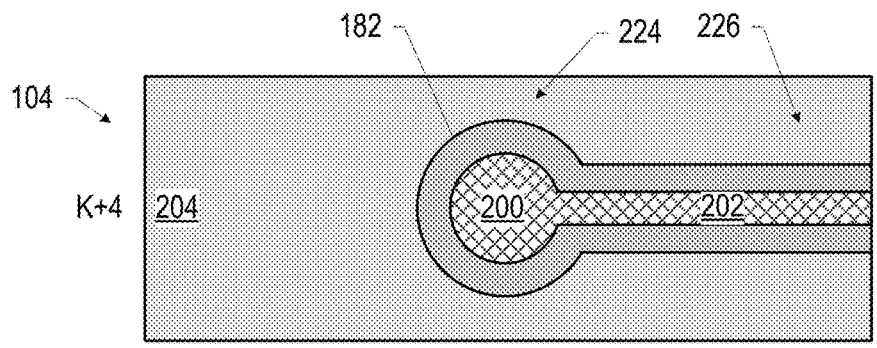
FIGS. 48A-48D are top views of the metal layers in the microelectronic support of FIG. 47, in accordance with various embodiments.
Figure 48B:
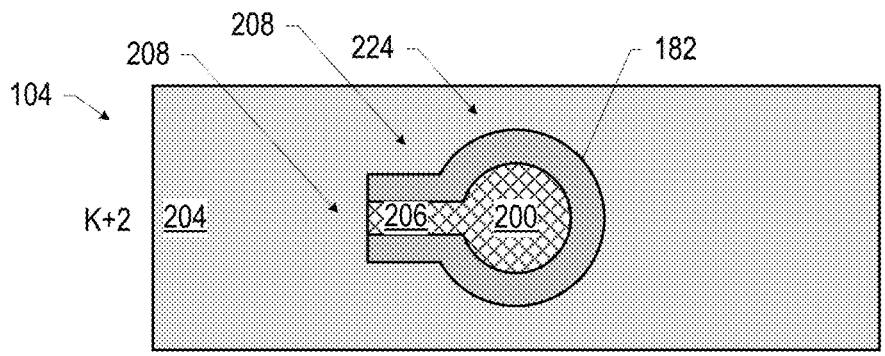
Figure 48C:
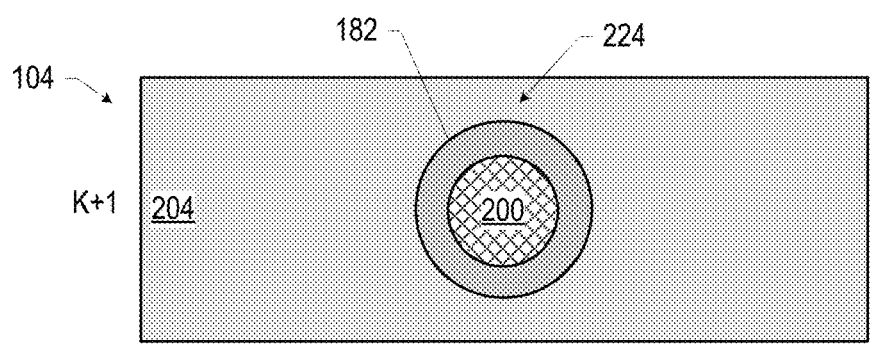
Figure 48D:
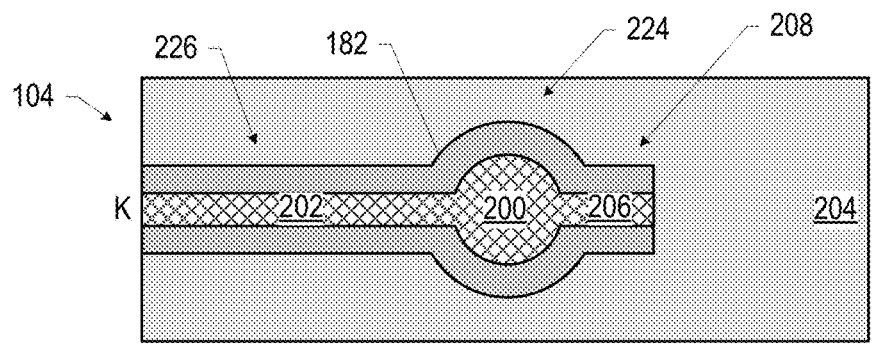

As shown in FIG. 47 and FIG. 48D, the metal layer K may have the same structure as the metal layer K of the embodiment of FIGS. 43 and 44E. As shown in FIG. 47 and FIG. 48C, the metal layer K+1 may have a same structure as a metal layer K+1 of the embodiment of FIGS. 43 and 44D. A via 198 may couple the via pad 200 in the metal layer K+1 to the via pad 200 in the metal layer K (FIG. 48D). As shown in FIG. 47 and FIG. 48B, the metal layer K+2 may have the same structure as the metal layer K+3 of the embodiment of FIGS. 43 and 44B. A via 198 may couple the via pad 200 in the metal layer K+2 to the via pad 200 in the metal layer K+1 (FIG. 48C). As shown in FIG. 47 and FIG. 48A, the metal layer K+3 may have the same structure as the metal layer K+4 of FIGS. 43 and 44A. A via 198 may couple the via pad 200 in the metal layer K+3 to the via pad 200 in the metal layer K+2 (FIG. 48B).

Figure 49:
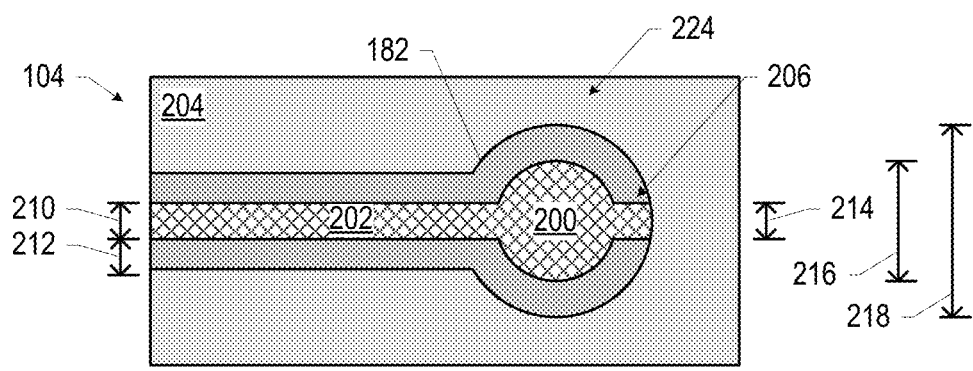
FIGS. 49-53 are top views of example metal layers in a transmission line including one or more stubs, in accordance with various embodiments.

FIG. 49 illustrates a particular example of a stub 206 in a metal layer of a microelectronic support 104, with various dimensions labeled. Any of the dimensions discussed with reference to FIG. 49 may be applied to any of the embodiments disclosed herein. In some embodiments, a width 210 of the trace 202 may be between 5 microns and 400 microns. In some embodiments, a spacing 212 between the trace 202 and the adjacent portion of the metal plane 204 may be between 5 microns and 400 microns. In some embodiments, a width 214 of the stub 206 may be between 5 microns and 400 microns. In some embodiments, the dimensions of a stub 206 may be selected based on the wavelength or frequency range of operation. Stubs 206 may resonate at multiple frequencies, and a stub 206 may behave either as an inductive element or capacitive element around these resonant frequencies. Increasing the length of a stub 206 may correspond to decreasing resonant frequencies. In some embodiments, the length of a stub 206 may be between 150 microns and 12000 microns (e.g., between 150 microns and 300 microns, between 300 microns and 1000 microns, or between 1000 microns and 12000 microns). In some embodiments, a diameter 216 of the via pad 200 may be between 50 microns and 300 microns. In some embodiments, a diameter 218 of the antipad 224 may be between 100 microns and 600 microns. Any other suitable dimensions of the elements disclosed herein may be varied as design parameters.

Figure 50:
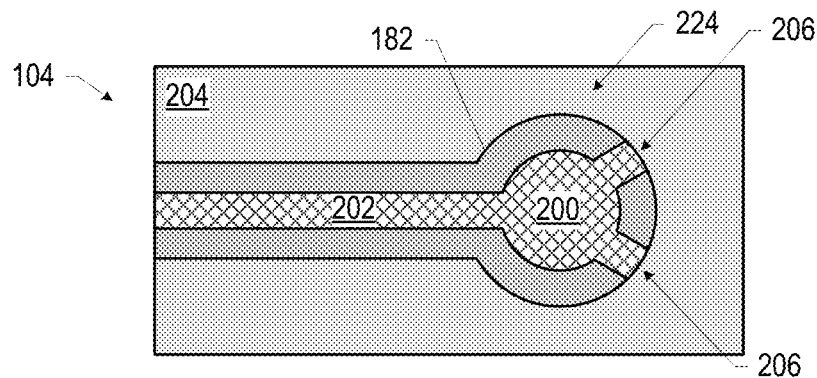
Figure 51:
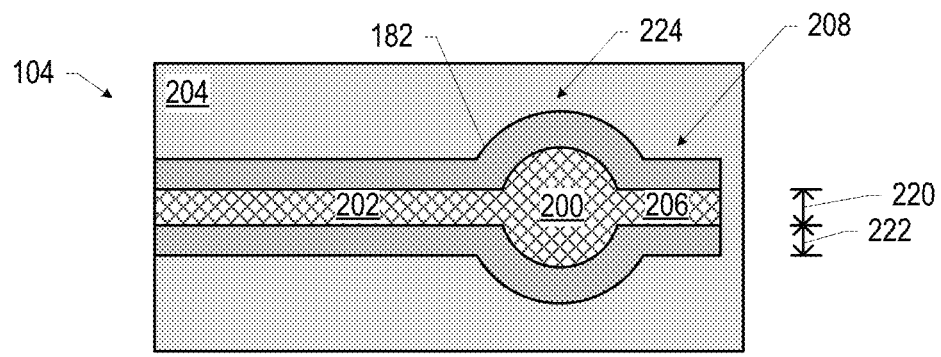

In some embodiments, no antipad extension 208 may be associated with a stub 206 in a metal layer, and instead, a stub 206 extending from a via pad 200 may contact the metal plane 204 of the shield structure 194 at an edge of the antipad 224. An example of such an embodiment, including two stubs 206, is shown in FIG. 50. As noted above, the dimensions of the traces 202, antitraces 226, via pads 200, antipads 224, stubs 206, and antipad extensions 208 may be selected to achieve a desired impedance for the different portions of the transmission line 120. FIG. 51 illustrates an example metal layer in which the stub 206 has a width 220 and is laterally spaced apart from the metal plane 204 by a distance 222. In some embodiments, the width 220 may be between 5 microns and 400 microns, and the distance 222 may be between 5 microns and 400 microns.

Figure 52:
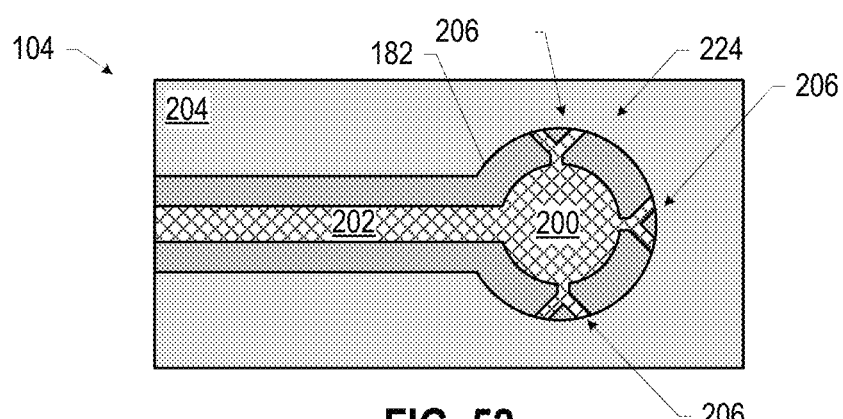
Figure 53:
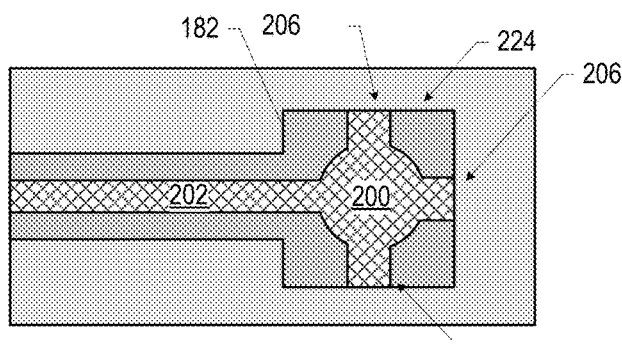

Although various ones of the preceding drawings illustrated stubs 206 having a substantially rectangular shape and antipads 224 having a substantially circular shape, the traces 202, antitraces 226, via pads 200, antipads 224, stubs 206, and antipad extensions 208 may have any desired shape (e.g., as may be enabled by the use of lithographic via techniques). For example, FIG. 52 illustrates a metal layer having branched stubs 206, while FIG. 53 illustrates a metal layer having a substantially square antipad 224.

Figure 54:
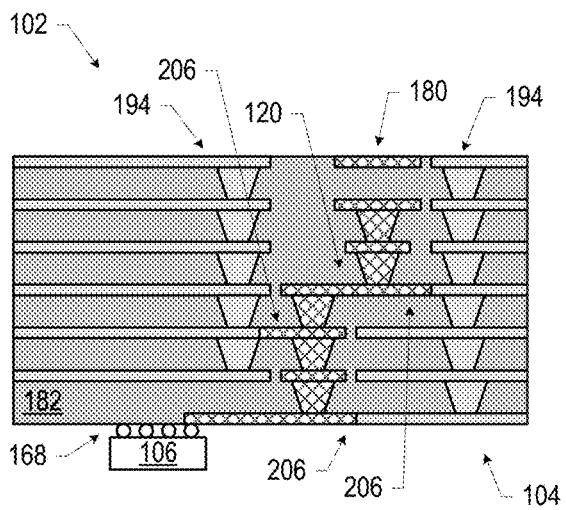
FIGS. 54-56 are cross-sectional views of example microelectronic packages that may include a transmission line with one or more stubs, in accordance with various embodiments.
Figure 55:
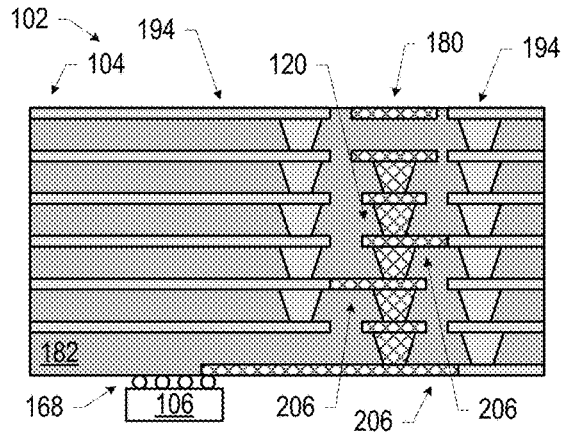
Figure 56:
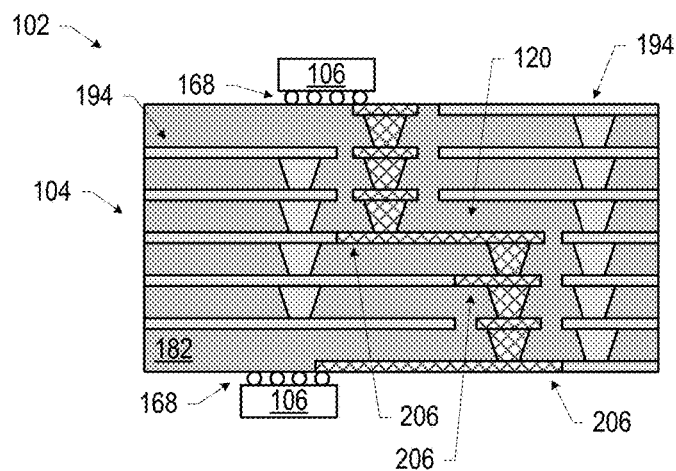

FIGS. 54-56 illustrate additional examples of transmission lines 120 including stubs 206 to short the transmission line 120 to a grounded shield structure 194. In the embodiment of FIGS. 54 and 55, the transmission line 120 is coupled between a microelectronic component 106 and a patch launcher 180. In the embodiment of FIG. 56, the transmission line 120 is coupled between microelectronic components 106 at opposite faces of the microelectronic support 104.

Figure 57:
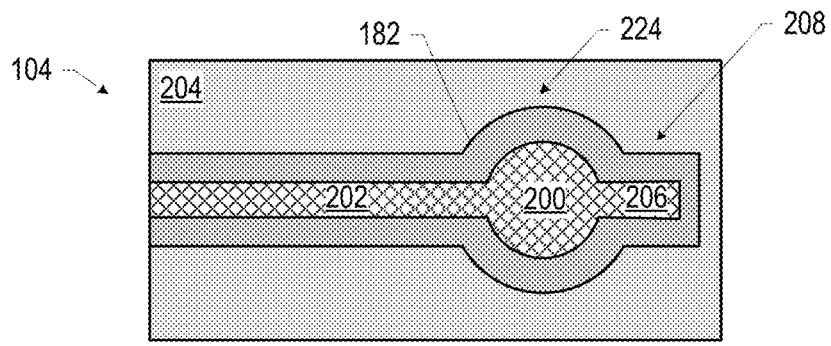
FIG. 57 is a top view of an example metal layer in a transmission line including one or more stubs, in accordance with various embodiments.

While the preceding drawings illustrate the transmission line 120 as shorted to the shield structure 194, in other embodiments, a transmission line 120 may include stubs 206 and/or antipad extensions 208 without the stubs 206 shorting the transmission line 120 to the shield structure 194. In such embodiments, the stubs 206 may be electrically coupled to the shield structure 194 so as to change the impedance of the transmission line 120, but may be spaced apart from the shield structure 194. An example of such an embodiment is illustrated in FIG. 57. In embodiments in which the stubs 206 do not short the transmission line 120 to the shield structure 194, the size and shape of the gap separating a stub 206 from the shield structure 194 may be another parameter that may be tuned to achieve a desired impedance.

Figure 58A:
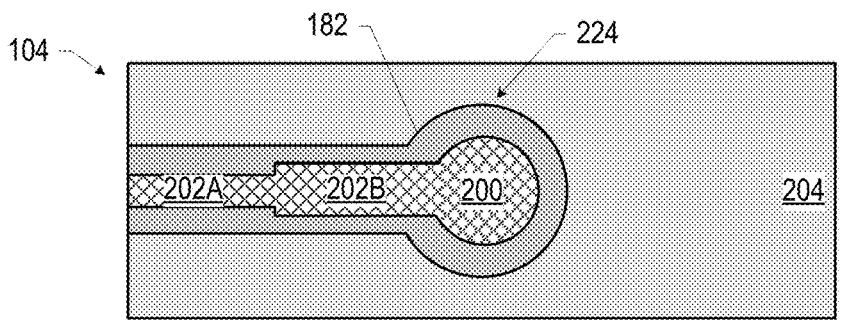
FIGS. 58A-58B are top views of example metal layers in a transmission line including portions with different trace widths, in accordance with various embodiments.
Figure 58B:
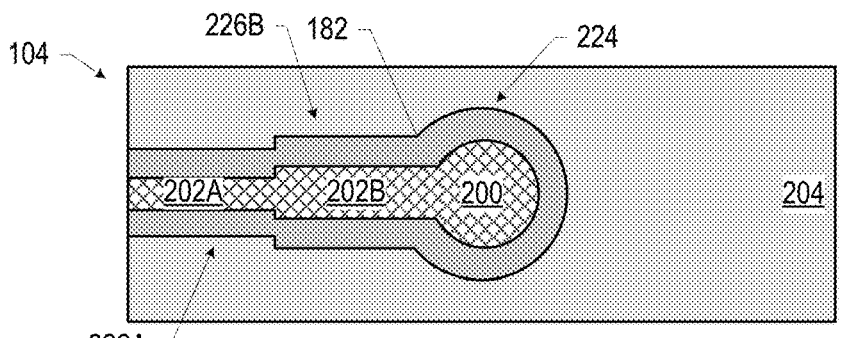

As noted above, the size or shape of a trace 202 (and/or an antitrace 226) may be adjusted to achieve a desired impedance around a transition 122. For example, FIGS. 58A and 58B illustrate metal layers that may be part of a microelectronic support 104, and that include a trace 202 having a narrow portion 202A and a wide portion 202B. In the embodiment of FIG. 58A, the width of the antitrace 226 proximate to the trace 202 is constant, while in the embodiment of FIG. 58B, the antitrace 226 includes a narrow portion 226A and a wide portion 226B. The width of the narrow portion 202A and the wide portion 202B of a trace 202, the arrangements of one or more narrow portions 202A and one or more wide portions 202B, as well as the widths of the narrow portion 226A and the wide portion 226B of an antitrace 226, may be tuned to achieve a desired impedance.

Figure 59:
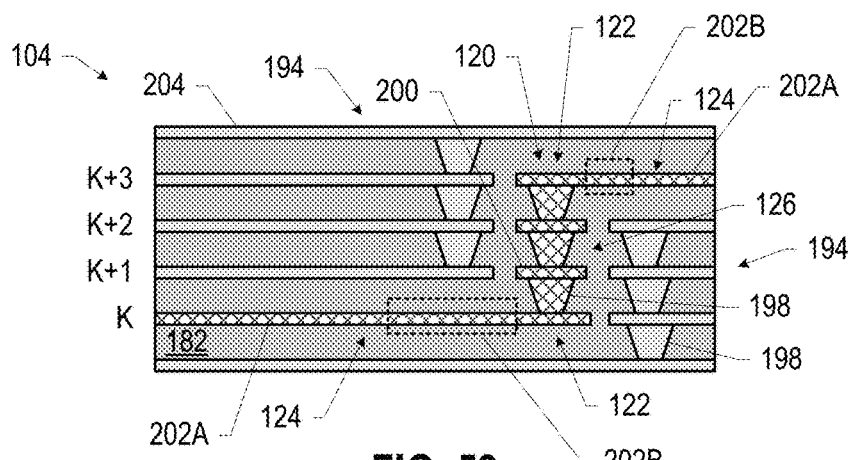
FIGS. 59-62 are cross-sectional views of example microelectronic packages that may include a transmission line including portions with different trace widths, in accordance with various embodiments.
Figure 60:
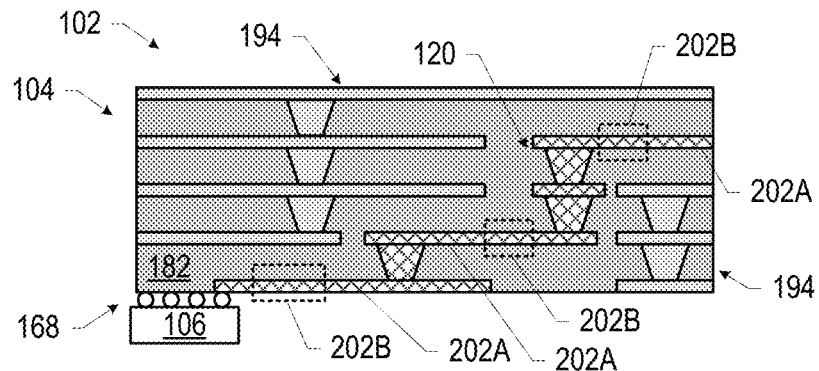
Figure 61:
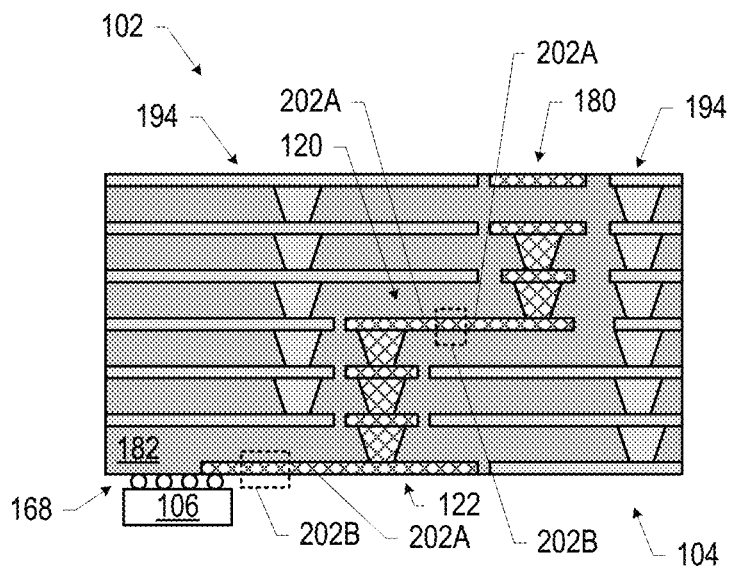
Figure 62:
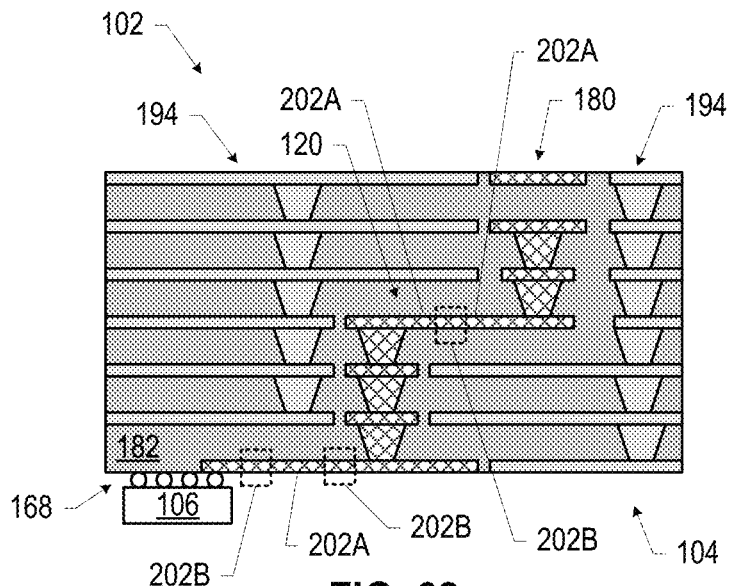
Figure 63:
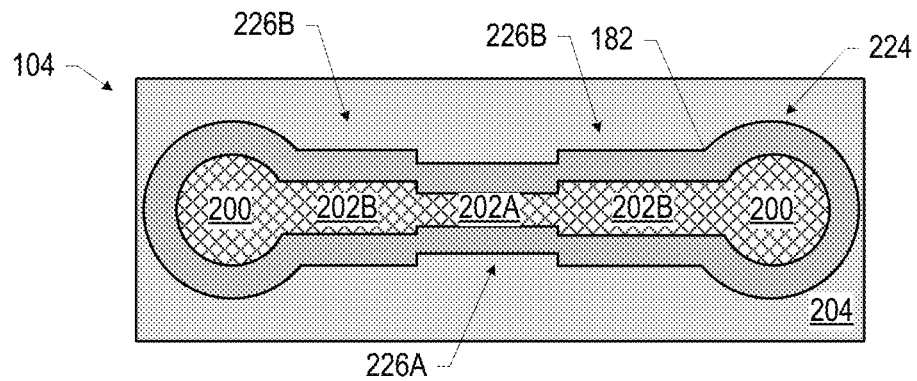
FIG. 63 is a top view of an example metal layer in a transmission line including portions with different trace widths, in accordance with various embodiments.

FIGS. 59-62 and 64-65 are cross-sectional views of example microelectronic packages 102 that may include a transmission line 120 including portions 202A and 202B with different trace widths, in accordance with various embodiments. In the embodiment of FIG. 59, traces 202 included in the horizontal portions 124 include a wide portion 202B between the narrow portion 202A and a transition 122. In the embodiment of FIG. 60, three traces 202 of a transmission line 120 (between a microelectronic component 106 and a patch launcher 180) may include a narrow portion 202A and a wide portion 202B. In the embodiment of FIGS. 61 and 62, two traces 202 of a transmission line 120 (between a microelectronic component 106 and a patch launcher 180) include a narrow portion 202A and a wide portion 202B. In the embodiment of FIG. 61, one of the traces 202 includes a narrow portion 202A between a wide portion 202B and a transition 122. In the embodiments of FIGS. 61 and 62, one of the traces 202 includes a wide portion 202B between two narrow portions 202A. The embodiment of FIG. 62 also illustrates a trace 202 including a narrow portion 202A between two wide portions 202B; such an embodiment is also illustrated in FIG. 63 (which also depicts wide antitrace portions 226B and a narrow antitrace portion 226A therebetween).

Figure 64:
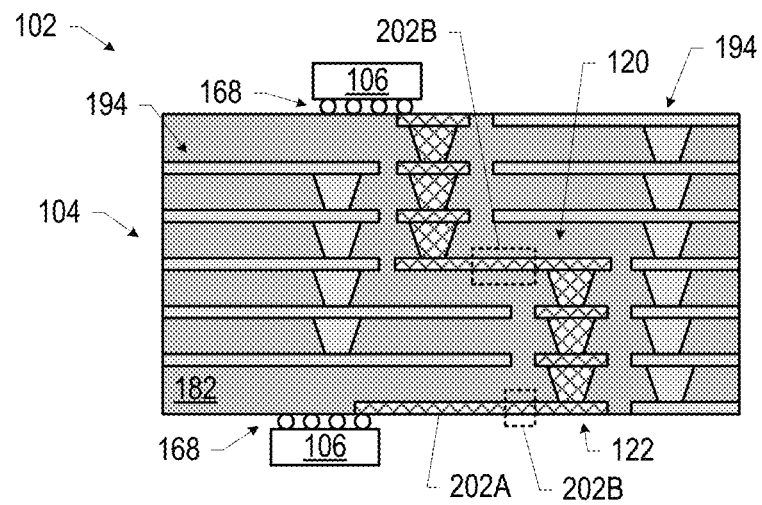
FIGS. 64-65 are cross-sectional views of example microelectronic packages that may include a transmission line including portions with different trace widths, in accordance with various embodiments.
Figure 65:
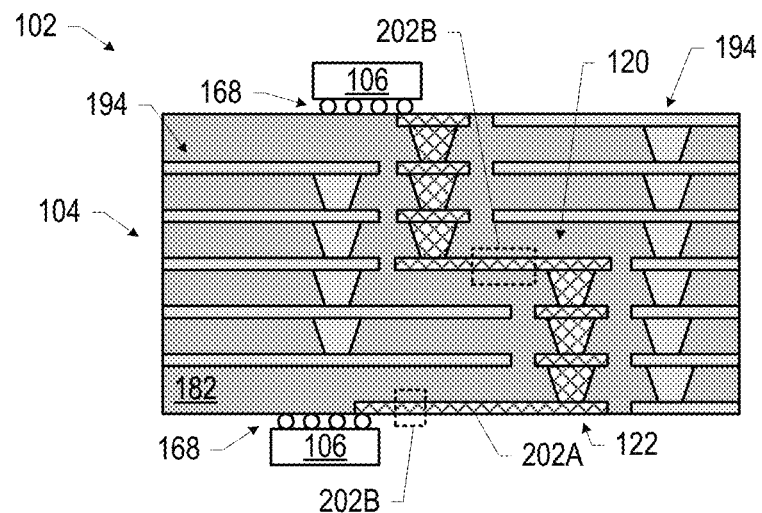

In the embodiment of FIGS. to 64 and 65, two traces 202 of a transmission line 120 (between two microelectronic components 106 at opposite faces of a microelectronic support 104) include a narrow portion 202A and a wide portion 202B. In FIG. 64, one of the traces 202 has a narrow portion 202A between a wide portion 202B and a transition 122, while in FIG. 65, one of the traces 202 has a wide portion 202B between a narrow portion 202A and a transition 122. In some embodiments of the microelectronic supports 104 disclosed herein, wide portions 202B of a trace 202 may be disposed at the traces at either end of a vertical portion 126 (e.g., proximate to the ends of a via stack). In some embodiments, a via pad 200 proximate to a wide portion 202B of the trace 202 may have an antipad 224 with an antipad extension 208 into which no stub 206 extends. Embodiments of transmission lines 120 may include any desired combination of narrow portions 202A, wide portions 202B, stubs 206, and/or any of the other features disclosed herein.

The communication systems 100, microelectronic packages 102, waveguide cables 118, and/or components thereof disclosed herein may be included in any suitable electronic component. FIGS. 66-70 illustrate various examples of apparatuses that may include any of the communication systems 100, microelectronic packages 102, waveguide cables 118, and/or components thereof disclosed herein, or may be included in any of the communication systems 100, microelectronic packages 102, waveguide cables 118, and/or components thereof disclosed herein, as appropriate.

Figure 66:
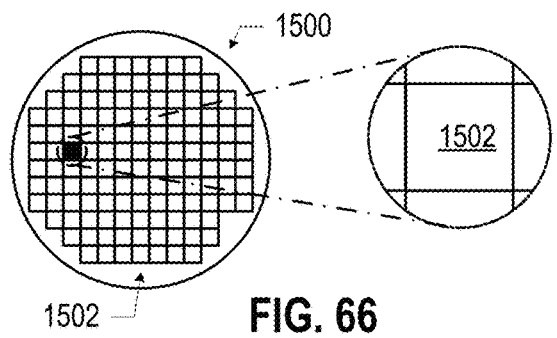
FIG. 66 is a top view of a wafer and dies that may be included in a transceiver or other microelectronic component, in accordance with any of the embodiments disclosed herein.

FIG. 66 is a top view of a wafer 1500 and dies 1502 that may be included in a microelectronic package 102 (e.g., in a microelectronic component 106 or a microelectronic element 196) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 67, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 70) or other logic that is configured to store information in the memory devices or execute instructions stored in the memory array.

Figure 67:
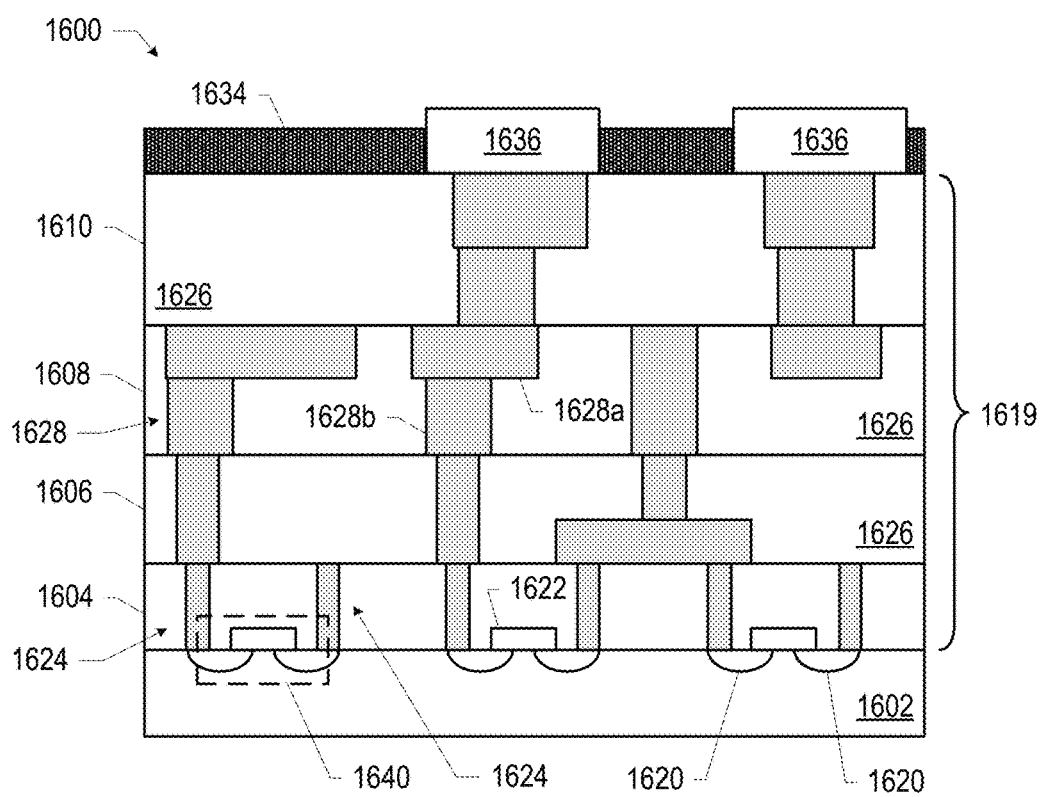
FIG. 67 is a side, cross-sectional view of a microelectronic device that may be included in a transceiver or other microelectronic component, in accordance with any of the embodiments disclosed herein.

FIG. 67 is a side, cross-sectional view of a microelectronic device 1600 that may be included in a microelectronic package 102 (e.g., in a microelectronic component 106 or a microelectronic element 196) in accordance with any of the embodiments disclosed herein. One or more of the microelectronic devices 1600 may be included in one or more dies 1502 (FIG. 66) or other elecronic components. The microelectronic device 1600 may be formed on a substrate 1602 (e.g., the wafer 1500 of FIG. 66) and may be included in a die (e.g., the die 1502 of FIG. 66). The substrate 1602 may be a semiconductor substrate composed of semiconductor material systems including, for example, n-type or p-type materials systems (or a combination of both). The substrate

1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium nitride, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for a microelectronic device 1600 may be used. The substrate 1602 may be part of a singulated die (e.g., the dies 1502 of FIG. 66) or a wafer (e.g., the wafer 1500 of FIG. 66).

The microelectronic device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 67 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 67 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the microelectronic device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 67). Although a particular number of interconnect layers 1606-1610 is depicted in FIG. 67, embodiments of the present disclosure include microelectronic devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 67. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 67. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the microelectronic device 1600 (i.e., farther away from the device layer 1604) may be thicker.

The microelectronic device 1600 may include a solder resist material 1634 (e.g., polyimide or similar material) and one or more conductive contacts 1636 formed on the interconnect layers 1606-1610. In FIG. 67, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the microelectronic device 1600 with another component (e.g., a circuit board). The microelectronic device 1600 may include additional or alternate structures to route the electrical signals from the interconnect layers 1606-1610; for example, the conductive contacts 1636 may include other analogous features (e.g., posts) that route the electrical signals to external components.

Figure 68:
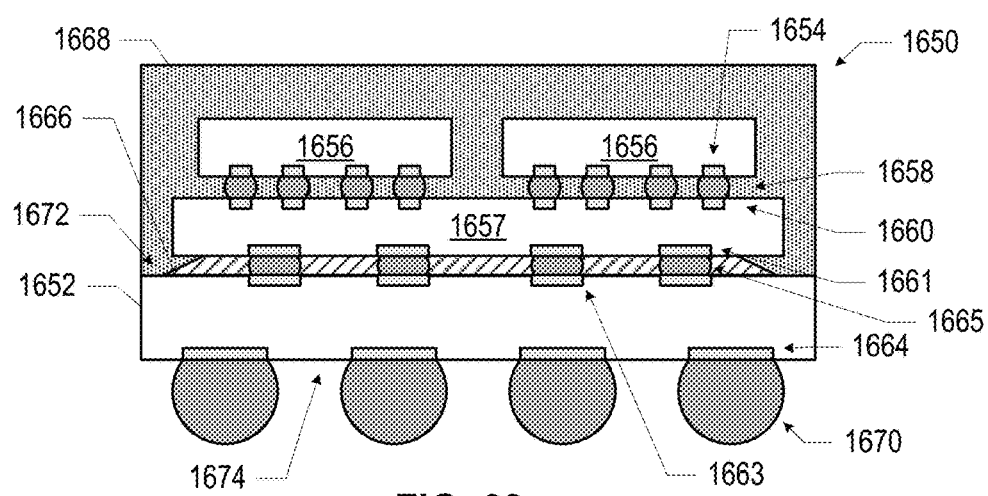
FIG. 68 is a side, cross-sectional view of a microelectronic package that may be included in a communication system, in accordance with various embodiments.

FIG. 68 is a side, cross-sectional view of an example microelectronic package 1650 that may serve as a microelectronic package 102. In some embodiments, the microelectronic package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 67. In some embodiments, the package substrate 1652 may be a microelectronic support 104, or may be included in a microelectronic support 104, in accordance with any of the embodiments disclosed herein.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The microelectronic package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 68 are solder bumps, but any suitable first-level interconnects 1665 may be used. In some embodiments, no interposer 1657 may be included in the microelectronic package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., a silicon bridge, an organic bridge, one or more waveguides, one or more interposers, wirebonds, etc.). In some embodiments, the interposer 1657 may be a microelectronic support 104, or may be included in a microelectronic support 104, in accordance with any of the embodiments disclosed herein.

The microelectronic package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 68 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The dies 1656 may take the form of any of the microelectronic components 106 disclosed herein (e.g., may include one or more millimeter-wave communication transceivers).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 68 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the microelectronic package 1650 to another component, such as a circuit board (e.g., a motherboard), an interposer, or another microelectronic package, as known in the art and as discussed below with reference to FIG. 69.

The dies 1656 may take the form of any of the embodiments of the die 1502 discussed herein (e.g., may include any of the embodiments of the microelectronic device 1600). In embodiments in which the microelectronic package 1650 includes multiple dies 1656, the microelectronic package 1650 may be referred to as a multi-chip package (MCP). The dies 1656 may include circuitry to perform any desired functionality. For example, one or more of the dies 1656 may be logic dies (e.g., silicon-based dies), and one or more of the dies 1656 may be memory dies (e.g., high bandwidth memory).

Although the microelectronic package 1650 illustrated in FIG. 68 is a flip chip package, other package architectures may be used. For example, the microelectronic package 1650 may be a ball grid array (BGA) package, such as an embedded wafer-level ball grid array (eWLB) package. In another example, the microelectronic package 1650 may be a wafer-level chip scale package (WLCSP) or a panel fanout (FO) package. Although two dies 1656 are illustrated in the microelectronic package 1650 of FIG. 68, a microelectronic package 1650 may include any desired number of dies 1656. A microelectronic package 1650 may include additional passive components, such as surface-mount resistors, capacitors, and inductors disposed on the first face 1672 or the second face 1674 of the package substrate 1652, or on either face of the interposer 1657. A microelectronic package 1650 may include any of the package connectors 112 disclosed herein, for example. More generally, a microelectronic package 1650 may include any other active or passive components known in the art.

Figure 69:
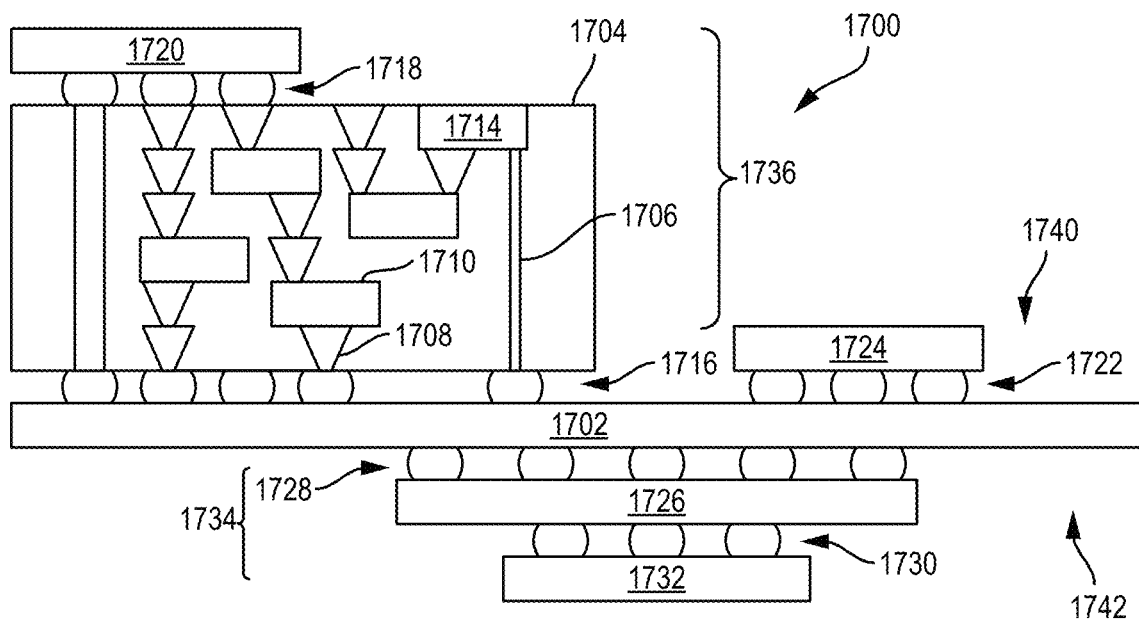
FIG. 69 is a side, cross-sectional view of a microelectronic assembly that may include a microelectronic package and/or a waveguide cable, in accordance with any of the embodiments disclosed herein.

FIG. 69 is a side, cross-sectional view of a microelectronic assembly 1700 that may include one or more microelectronic packages 102, in accordance with any of the embodiments disclosed herein. Further, although not shown in FIG. 69, the microelectronic assembly 1700 may include one or more waveguide cables 118 to communicatively couple different elements of the microelectronic assembly 1700 and/or to communicatively couple an element of the microelectronic assembly 1700 with an external element. The microelectronic assembly 1700 includes a number of components disposed on a circuit board 1702 (which may be, e.g., a motherboard). The microelectronic assembly 1700 includes components disposed on a first face 1740 of the circuit board 1702 and an opposing second face 1742 of the circuit board 1702; generally, components may be disposed on one or both faces 1740 and 1742. Any of the microelectronic packages discussed below with reference to the microelectronic assembly 1700 may take the form of any of the embodiments of the microelectronic package 1650 discussed above with reference to FIG. 68.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The microelectronic assembly 1700 illustrated in FIG. 69 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 69), male and female portions of a socket, an adhesive, an underfill material, and/or any other suitable electrical and/or mechanical coupling structure.

The package-on-interposer structure 1736 may include a microelectronic package 1720 coupled to an package interposer 1704 by coupling components 1718. The coupling components 1718 may take any suitable form for the application, such as the forms discussed above with reference to the coupling components 1716. Although a single microelectronic package 1720 is shown in FIG. 69, multiple microelectronic packages may be coupled to the package interposer 1704; indeed, additional interposers may be coupled to the package interposer 1704. The package interposer 1704 may provide an intervening substrate used to bridge the circuit board 1702 and the microelectronic package 1720. The microelectronic package 1720 may be or include, for example, a die (the die 1502 of FIG. 66), a microelectronic device (e.g., the microelectronic device 1600 of FIG. 67), or any other suitable component. Generally, the package interposer 1704 may spread a connection to a wider pitch or reroute a connection to a different connection. For example, the package interposer 1704 may couple the microelectronic package 1720 (e.g., a die) to a set of BGA conductive contacts of the coupling components 1716 for coupling to the circuit board 1702. In the embodiment illustrated in FIG. 69, the microelectronic package 1720 and the circuit board 1702 are attached to opposing sides of the package interposer 1704; in other embodiments, the microelectronic package 1720 and the circuit board 1702 may be attached to a same side of the package interposer

1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may be a microelectronic support 104.

The microelectronic assembly 1700 may include a microelectronic package 1724 coupled to the first face 1740 of the circuit board 1702 by coupling components 1722. The coupling components 1722 may take the form of any of the embodiments discussed above with reference to the coupling components 1716, and the microelectronic package 1724 may take the form of any of the embodiments discussed above with reference to the microelectronic package 1720.

The microelectronic assembly 1700 illustrated in FIG. 69 includes a package-on-package structure 1734 coupled to the second face 1742 of the circuit board 1702 by coupling components 1728. The package-on-package structure 1734 may include a microelectronic package 1726 and a microelectronic package 1732 coupled together by coupling components 1730 such that the microelectronic package 1726 is disposed between the circuit board 1702 and the microelectronic package 1732. The coupling components 1728 and 1730 may take the form of any of the embodiments of the coupling components 1716 discussed above, and the microelectronic packages 1726 and 1732 may take the form of any of the embodiments of the microelectronic package 1720 discussed above. The package-on-package structure 1734 may be configured in accordance with any of the package-on-package structures known in the art.

Figure 70:
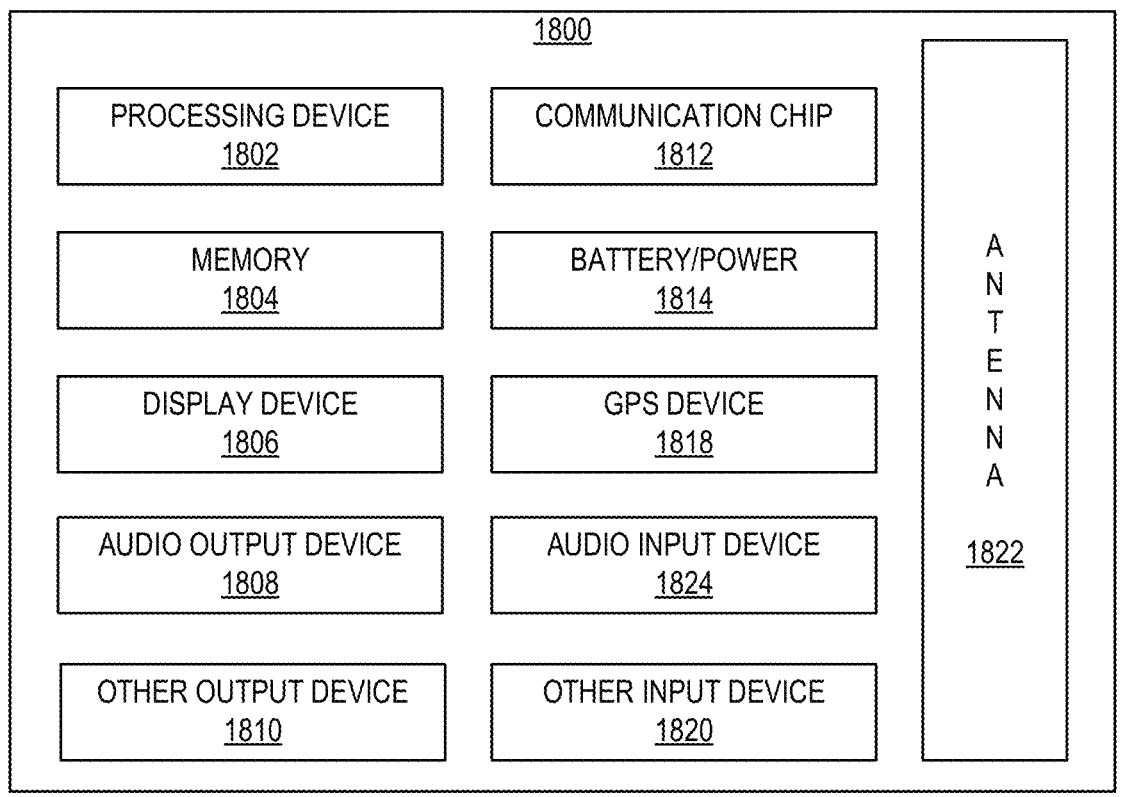
FIG. 70 is a block diagram of an example computing device that may include a communication system, a microelectronic package, and/or a waveguide cable, in accordance with any of the embodiments disclosed herein.

FIG. 70 is a block diagram of an example computing device 1800 that may include one or more communication systems 100, microelectronic packages 102, waveguide cables 118, and/or components thereof, in accordance with any of the embodiments disclosed herein. For example, any suitable ones of the components of the computing device 1800 may include one or more of the microelectronic device assemblies 1700, microelectronic packages 1650, microelectronic devices 1600, or dies 1502 disclosed herein. A number of components are illustrated in FIG. 70 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 70, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808, but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute ofof Electrical and Electronics Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions). The communication chip 1812 may include, for example, a millimeter-wave communication transceiver (e.g., as the microelectronic component 106) to support millimeter-wave communication (e.g., along a waveguide cable 118 or a transmission line 120 through a microelectronic support 104).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The computing device 1800 may include an audio output device 1808 (or corresponding interface circuitry, as discussed above). The audio output device 1808 may include any device that generates an audible indicator, such as speakers, headsets, or earbuds.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop computing device, a server device or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

The following paragraphs provide various examples of the embodiments disclosed herein.

Example A1 is a millimeter-wave dielectric waveguide, including: a first material, wherein an opening in the first material extends longitudinally along the millimeter-wave dielectric waveguide, the opening has a first cross-section at a first location along a longitudinal direction of the millimeter-wave dielectric waveguide, the opening has a second cross-section at a second location along the longitudinal direction of the millimeter-wave dielectric waveguide, the first cross-section is different than the second cross-section, and the first location is different than the second location; and a second material, wherein the first material is between the second material and the opening, and the second material has a dielectric constant that is less than a dielectric constant of the first material.

Example A2 includes the subject matter of Example A1, and further specifies that the opening has a circular cross-section at the first location, and the opening has a circular cross-section at the second location.

Example A3 includes the subject matter of Example A1, and further specifies that the opening has a non-circular cross-section at the first location, and the opening has a non-circular cross-section at the second location.

Example A4 includes the subject matter of any of Examples A1-3, and further specifies that the opening has a third cross-section at a third location along the longitudinal direction of the millimeter-wave dielectric waveguide, the third cross-section is different than the first cross-section, the third cross-section is different than the second cross-section, the third location is different than the first location, and the third location is different than the second location.

Example A5 includes the subject matter of Example A4, and further specifies that the third location is between the first location and the second location, and an area of the third cross-section is between an area of the first cross-section and an area of the second cross-section.

Example A6 includes the subject matter of any of Examples A1-5, and further specifies that the millimeter-wave dielectric waveguide includes a first section having the opening with the first cross-section, a second section having the opening with the second cross-section, and a transition section between the first section and the second section.

Example A7 includes the subject matter of Example A6, and further specifies that the transition section includes a stepwise change in the opening from having the first cross-section to having the second cross-section.

Example A8 includes the subject matter of Example A6, and further specifies that the transition section includes a gap between the first section and the second section.

Example A9 includes the subject matter of Example A8, and further specifies that the gap has a width that is less than 1 millimeter.

Example A10 includes the subject matter of Example A6, and further specifies that the transition section includes a smoothly varying change in the opening from having the first cross-section to having the second cross-section.

Example A11 includes the subject matter of any of Examples A1-5, and further specifies that the opening has a cross-section that smoothly varies along the longitudinal direction of the millimeter-wave dielectric waveguide.

Example A12 includes the subject matter of any of Examples A1-11, and further specifies that the opening is a first opening, and the millimeter-wave dielectric waveguide further includes a second opening in the first material that extends longitudinally along the millimeter-wave dielectric waveguide.

Example A13 includes the subject matter of Example A12, and further specifies that the second opening has a third cross-section at the first location along the longitudinal direction of the millimeter-wave dielectric waveguide, the second opening has a fourth cross-section at the second location along the longitudinal direction of the millimeter-wave dielectric waveguide, the third cross-section is different than the fourth cross-section, and the first location is different than the second location.

Example A14 includes the subject matter of any of Examples A1-13, and further includes: air in the opening.

Example A15 includes the subject matter of any of Examples A1-14, and further includes: a third material in the opening, wherein the third material has a dielectric constant that is less than the dielectric constant of the first material.

Example A16 includes the subject matter of any of Examples A1-15, and further specifies that the first material includes polytetrafluoroethylene, a fluoropolymer, a low-density polyethylene, or a high-density polyethylene.

Example A17 includes the subject matter of any of Examples A1-16, and further specifies that the first material includes a plastic.

Example A18 includes the subject matter of Example A17, and further specifies that the plastic has a dielectric constant that is less than 4.

Example A19 includes the subject matter of any of Examples A1-18, and further specifies that the first material includes a ceramic.

Example A20 includes the subject matter of Example A19, and further specifies that the ceramic has a dielectric constant that is less than 10.

Example A21 includes the subject matter of any of Examples A1-20, and further specifies that the second material includes a foam.

Example A22 includes the subject matter of any of Examples A1-21, and further specifies that the second material has a dielectric constant that is less than 2.

Example A23 includes the subject matter of any of Examples A1-22, and further specifies that the first material has an outer diameter that is less than or equal to 2 millimeters.

Example A24 includes the subject matter of any of Examples A1-23, and further specifies that the opening is one of an array of openings in the first material.

Example A25 includes the subject matter of any of Examples A1-24, and further specifies that the first material has a circular cross-section at the first location, and the first material has a circular cross-section at the second location.

Example A26 includes the subject matter of any of Examples A1-24, and further specifies that the first material has a non-circular cross-section at the first location, and the first material has a non-circular cross-section at the second location.

Example A27 includes the subject matter of any of Examples A1-26, and further specifies that the second material has a circular cross-section at the first location, and the second material has a circular cross-section at the second location.

Example A28 includes the subject matter of any of Examples A1-26, and further specifies that the second material has a non-circular cross-section at the first location, and the second material has a non-circular cross-section at the second location.

Example A29 includes the subject matter of any of Examples A1-28, and further specifies that the millimeter-wave dielectric waveguide is one of multiple millimeter-wave dielectric waveguides in a cable.

Example A30 includes the subject matter of Example A29, and further specifies that the cable includes a wrap material around the multiple millimeter-wave dielectric waveguides.

Example A31 includes the subject matter of any of Examples A29-30, and further includes: a connector at an end of the millimeter-wave dielectric waveguide.

Example A32 includes the subject matter of any of Examples A1-28, and further specifies that the millimeter-wave dielectric waveguide is included in a package substrate or an interposer.

Example A33 includes the subject matter of any of Examples A1-32, and further specifies that the millimeter-wave dielectric waveguide has a length that is less than 5 meters.

Example A34 includes the subject matter of any of Examples A1-33, and further includes: a metal layer, wherein the first material is between the opening and the metal layer.

Example A35 includes the subject matter of Example A34, and further specifies that the metal layer is a first metal layer, the millimeter-wave dielectric waveguide further includes a second metal layer, and the first material is between the first metal layer and the second metal layer.

Example A36 is a millimeter-wave dielectric waveguide, including: a first material, wherein an opening in the first material varies in cross-section along a longitudinal direction of the millimeter-wave dielectric waveguide; and a second material, wherein the first material is between the second material and the opening, and the second material has a dielectric constant that is less than a dielectric constant of the first material.

Example A37 includes the subject matter of Example A36, and further specifies that the opening has a circular cross-section at first location along a longitudinal direction of the millimeter-wave dielectric waveguide, and the opening has a circular cross-section at a second location along a longitudinal direction of the millimeter-wave dielectric waveguide.

Example A38 includes the subject matter of Example A36, and further specifies that the opening has a non-circular cross-section at a first location along a longitudinal direction of the millimeter-wave dielectric waveguide, and the opening has a non-circular cross-section at a second location along a longitudinal direction of the millimeter-wave dielectric waveguide.

Example A39 includes the subject matter of any of Examples A36-38, and further specifies that an outside diameter of the millimeter-wave dielectric waveguide is constant along a longitudinal direction of the millimeter-wave dielectric waveguide.

Example A40 includes the subject matter of any of Examples A36-38, and further specifies that an outside diameter of the millimeter-wave dielectric waveguide is not constant along a longitudinal direction of the millimeter-wave dielectric waveguide.

Example A41 includes the subject matter of any of Examples A36-40, and further specifies that the millimeter-wave dielectric waveguide includes a first section having the opening with a first area, a second section having the opening with a second area, and a transition section between the first section and the second section.

Example A42 includes the subject matter of Example A41, and further specifies that the transition section includes a stepwise change in the opening from having the first area to having the second area.

Example A43 includes the subject matter of Example A41, and further specifies that the transition section includes a gap between the first section and the second section.

Example A44 includes the subject matter of Example A43, and further specifies that the gap has a width that is less than 1 millimeter.

Example A45 includes the subject matter of Example A41, and further specifies that the transition section includes a smoothly varying change in the opening from having the first area to having the second area.

Example A46 includes the subject matter of any of Examples A36-40, and further specifies that the opening has an area that smoothly varies along the longitudinal direction of the millimeter-wave dielectric waveguide.

Example A47 includes the subject matter of any of Examples A36-46, and further specifies that the opening is a first opening, and the millimeter-wave dielectric waveguide further includes a second opening in the first material that extends longitudinally along the millimeter-wave dielectric waveguide.

Example A48 includes the subject matter of Example A47, and further specifies that the second opening varies in cross-section along a longitudinal direction of the millimeter-wave dielectric waveguide.

Example A49 includes the subject matter of any of Examples A36-48, and further includes: air in the opening.

Example A50 includes the subject matter of any of Examples A36-49, and further includes: a third material in the opening, wherein the third material has a dielectric constant that is less than the dielectric constant of the first material.

Example A51 includes the subject matter of any of Examples A36-50, and further specifies that the first material includes polytetrafluoroethylene, a fluoropolymer, a low-density polyethylene, or a high-density polyethylene.

Example A52 includes the subject matter of any of Examples A36-51, and further specifies that the first material includes a plastic.

Example A53 includes the subject matter of Example A52, and further specifies that the plastic has a dielectric constant that is less than 4.

Example A54 includes the subject matter of any of Examples A36-53, and further specifies that the first material includes a ceramic.

Example A55 includes the subject matter of Example A54, and further specifies that the ceramic has a dielectric constant that is less than 10.

Example A56 includes the subject matter of any of Examples A36-55, and further specifies that the second material includes a foam.

Example A57 includes the subject matter of any of Examples A36-56, and further specifies that the second material has a dielectric constant that is less than 2.

Example A58 includes the subject matter of any of Examples A36-57, and further specifies that the first material has an outer diameter that is less than or equal to 2 millimeters.

Example A59 includes the subject matter of any of Examples A36-58, and further specifies that the opening is one of an array of openings in the first material.

Example A60 includes the subject matter of any of Examples A36-59, and further specifies that the first material has a circular cross-section at the first location, and the first material has a circular cross-section at the second location.

Example A61 includes the subject matter of any of Examples A36-59, and further specifies that the first material has a non-circular cross-section at the first location, and the first material has a non-circular cross-section at the second location.

Example A62 includes the subject matter of any of Examples A36-61, and further specifies that the second material has a circular cross-section at the first location, and the second material has a circular cross-section at the second location.

Example A63 includes the subject matter of any of Examples A36-61, and further specifies that the second material has a non-circular cross-section at the first location, and the second material has a non-circular cross-section at the second location.

Example A64 includes the subject matter of any of Examples A36-63, and further specifies that the millimeter-wave dielectric waveguide is one of multiple millimeter-wave dielectric waveguides in a cable.

Example A65 includes the subject matter of Example A64, and further specifies that the cable includes a wrap material around the multiple millimeter-wave dielectric waveguides.

Example A66 includes the subject matter of any of Examples A64-65, and further includes: a connector at an end of the millimeter-wave dielectric waveguide.

Example A67 includes the subject matter of any of Examples A36-63, and further specifies that the millimeter-wave dielectric waveguide is included in a package substrate or an interposer.

Example A68 includes the subject matter of any of Examples A36-67, and further specifies that the millimeter-wave dielectric waveguide has a length that is less than 5 meters.

Example A69 includes the subject matter of any of Examples A36-68, and further includes: a metal layer, wherein the first material is between the opening and the metal layer.

Example A70 includes the subject matter of Example A69, and further specifies that the metal layer is a first metal layer, the millimeter-wave dielectric waveguide further includes a second metal layer, and the first material is between the first metal layer and the second metal layer.

Example A71 is a millimeter-wave communication system, including: a first microelectronic component; a second microelectronic component; and a millimeter-wave dielectric waveguide, communicatively coupled between the first microelectronic component and the second microelectronic component, wherein the millimeter-wave dielectric waveguide includes: a first material, wherein an opening in the first material extends longitudinally along the millimeter-wave dielectric waveguide, the opening has a first area at a first location along a longitudinal direction of the millimeter-wave dielectric waveguide, the opening has a second area at a second location along the longitudinal direction of the millimeter-wave dielectric waveguide, the first area is different than the second area, and the first location is different than the second location, and a second material, wherein the first material is between the second material and the opening, and the second material has a dielectric constant that is less than a dielectric constant of the first material.

Example A72 includes the subject matter of Example A71, and further specifies that the opening has a circular cross-section at the first location, and the opening has a circular cross-section at the second location.

Example A73 includes the subject matter of Example A71, and further specifies that the opening has a non-circular cross-section at the first location, and the opening has a non-circular cross-section at the second location.

Example A74 includes the subject matter of any of Examples A71-73, and further specifies that the opening has a third area at a third location along the longitudinal direction of the millimeter-wave dielectric waveguide, the third area is different than the first area, the third area is different than the second area, the third location is different than the first location, and the third location is different than the second location.

Example A75 includes the subject matter of Example A74, and further specifies that the third location is between the first location and the second location, and the third area is between the first area and the second area.

Example A76 includes the subject matter of any of Examples A71-75, and further specifies that the millimeter-wave dielectric waveguide includes a first section having the opening with the first area, a second section having the opening with the second area, and a transition section between the first section and the second section.

Example A77 includes the subject matter of Example A76, and further specifies that the transition section includes a stepwise change in the opening from having the first area to having the second area.

Example A78 includes the subject matter of Example A76, and further specifies that the transition section includes a gap between the first section and the second section.

Example A79 includes the subject matter of Example A78, and further specifies that the gap has a width that is less than 1 millimeter.

Example A80 includes the subject matter of Example A76, and further specifies that the transition section includes a smoothly varying change in the opening from having the first area to having the second area.

Example A81 includes the subject matter of any of Examples A71-75, and further specifies that the opening has an area that smoothly varies along the longitudinal direction of the millimeter-wave dielectric waveguide.

Example A82 includes the subject matter of any of Examples A71-81, and further specifies that the opening is a first opening, and the millimeter-wave dielectric waveguide further includes a second opening in the first material that extends longitudinally along the millimeter-wave dielectric waveguide.

Example A83 includes the subject matter of Example A82, and further specifies that the second opening has a third area at the first location along the longitudinal direction of the millimeter-wave dielectric waveguide, the second opening has a fourth area at the second location along the longitudinal direction of the millimeter-wave dielectric waveguide, the third area is different than the fourth area, and the first location is different than the second location.

Example A84 includes the subject matter of any of Examples A71-83, and further specifies that the millimeter-wave dielectric waveguide includes: air in the opening.

Example A85 includes the subject matter of any of Examples A71-84, and further specifies that the millimeter-wave dielectric waveguide includes: a third material in the opening, wherein the third material has a dielectric constant that is less than the dielectric constant of the first material.

Example A86 includes the subject matter of any of Examples A71-75, and further specifies that the first material includes polytetrafluoroethylene, a fluoropolymer, a low-density polyethylene, or a high-density polyethylene.

Example A87 includes the subject matter of any of Examples A71-86, and further specifies that the first material includes a plastic.

Example A88 includes the subject matter of Example A87, and further specifies that the plastic has a dielectric constant that is less than 4.

Example A89 includes the subject matter of any of Examples A71-88, and further specifies that the first material includes a ceramic.

Example A90 includes the subject matter of Example A89, and further specifies that the ceramic has a dielectric constant that is less than 10.

Example A91 includes the subject matter of any of Examples A71-90, and further specifies that the second material includes a foam.

Example A92 includes the subject matter of any of Examples A71-91, and further specifies that the second material has a dielectric constant that is less than 2.

Example A93 includes the subject matter of any of Examples A71-92, and further specifies that the first material has an outer diameter that is less than or equal to 2 millimeters.

Example A94 includes the subject matter of any of Examples A71-93, and further specifies that the opening is one of an array of openings in the first material.

Example A95 includes the subject matter of any of Examples A71-94, and further specifies that the first material has a circular cross-section at the first location, and the first material has a circular cross-section at the second location.

Example A96 includes the subject matter of any of Examples A71-94, and further specifies that the first material has a non-circular cross-section at the first location, and the first material has a non-circular cross-section at the second location.

Example A97 includes the subject matter of any of Examples A71-96, and further specifies that the second material has a circular cross-section at the first location, and the second material has a circular cross-section at the second location.

Example A98 includes the subject matter of any of Examples A71-96, and further specifies that the second material has a non-circular cross-section at the first location, and the second material has a non-circular cross-section at the second location.

Example A99 includes the subject matter of any of Examples A71-98, and further specifies that the millimeter-wave dielectric waveguide is one of multiple millimeter-wave dielectric waveguides in a cable.

Example A100 includes the subject matter of Example A99, and further specifies that the cable includes a wrap material around the multiple millimeter-wave dielectric waveguides.

Example A101 includes the subject matter of any of Examples A99-100, and further specifies that the millimeter-wave dielectric waveguide includes: a connector at an end of the millimeter-wave dielectric waveguide.

Example A102 includes the subject matter of any of Examples A71-98, and further specifies that the millimeter-wave dielectric waveguide is included in a package substrate or an interposer.

Example A103 includes the subject matter of any of Examples A71-102, and further specifies that the millimeter-wave dielectric waveguide has a length that is less than 5 meters.

Example A104 includes the subject matter of any of Examples A71-103, and further specifies that the millimeter-wave dielectric waveguide includes: a metal layer, wherein the first material is between the opening and the metal layer.

Example A105 includes the subject matter of Example A104, and further specifies that the metal layer is a first metal layer, the millimeter-wave dielectric waveguide further includes a second metal layer, and the first material is between the first metal layer and the second metal layer.

Example A106 includes the subject matter of any of Examples A71-105, and further specifies that the first microelectronic component includes a millimeter-wave communication transceiver.

Example A107 includes the subject matter of any of Examples A71-106, and further specifies that the millimeter-wave communication system is a server system.

Example A108 includes the subject matter of any of Examples A71-106, and further specifies that the millimeter-wave communication system is a handheld system.

Example A109 includes the subject matter of any of Examples A71-106, and further specifies that the millimeter-wave communication system is a wearable system.

Example A110 includes the subject matter of any of Examples A71-106, and further specifies that the millimeter-wave communication system is a vehicle system.

Example A111 is a method of manufacturing a millimeter-wave dielectric waveguide including any of the methods disclosed herein.

Example B1 is a millimeter-wave dielectric waveguide, including: a first section including a first material and a first cladding; and a second section including a second material and a second cladding; wherein the first material is a solid material, and the second material has a longitudinal opening therein.

Example B2 includes the subject matter of Example B1, and further specifies that the first material and the second material have a same material composition.

Example B3 includes the subject matter of any of Examples B1-2, and further specifies that the first cladding and the second cladding have a same material composition.

Example B4 includes the subject matter of any of Examples B1-3, and further specifies that the opening has a circular cross-section.

Example B5 includes the subject matter of any of Examples B1-3, and further specifies that the opening has a non-circular cross-section.

Example B6 includes the subject matter of any of Examples B1-5, and further includes: a third section between the first section and the second section, wherein the third section includes a third material and a third cladding, the third material has a longitudinal opening therein, and a diameter of the longitudinal opening increases closer to the second section.

Example B7 includes the subject matter of Example B6, and further specifies that a diameter of the third material increases closer to the second section.

Example B8 includes the subject matter of any of Examples B6-7, and further specifies that an outer diameter of the third material is equal to an outer diameter of the first material at an end of the third material proximate to the first material.

Example B9 includes the subject matter of any of Examples B6-8, and further specifies that an outer diameter of the third material is equal to an outer diameter of the second material at an end of the third material proximate to the second material.

Example B10 includes the subject matter of any of Examples B6-9, and further specifies that a length of the third section is between 1 millimeter and 50 millimeters.

Example B11 includes the subject matter of any of Examples B1-10, and further specifies that the first section further includes a coating, the first cladding is between the coating and the first material, and the coating has a loss tangent that is greater than a loss tangent of the first cladding.

Example B12 includes the subject matter of Example B11, and further specifies that the coating does not extend to the second section.

Example B13 includes the subject matter of any of Examples B11-12, and further specifies that the coating includes conductive particles or fibers, or the coating includes a ferrite material.

Example B14 includes the subject matter of any of Examples B1-13, and further includes: air in the opening.

Example B15 includes the subject matter of any of Examples B1-14, and further includes: a third material in the opening, wherein the third material has a dielectric constant that is less than the dielectric constant of the first material.

Example B16 includes the subject matter of any of Examples B1-15, and further specifies that the first material includes polytetrafluoroethylene, a fluoropolymer, a low-density polyethylene, or a high-density polyethylene.

Example B17 includes the subject matter of any of Examples B1-16, and further specifies that the first material includes a plastic.

Example B18 includes the subject matter of Example B17, and further specifies that the plastic has a dielectric constant that is less than 4.

Example B19 includes the subject matter of any of Examples B1-18, and further specifies that the first material includes a ceramic.

Example B20 includes the subject matter of Example B19, and further specifies that the ceramic has a dielectric constant that is less than 10.

Example B21 includes the subject matter of any of Examples B1-20, and further specifies that the first cladding includes a foam.

Example B22 includes the subject matter of any of Examples B1-21, and further specifies that the first cladding has a dielectric constant that is less than 2.

Example B23 includes the subject matter of any of Examples B1-22, and further specifies that the first material has an outer diameter that is less than or equal to 2 millimeters.

Example B24 includes the subject matter of any of Examples B1-23, and further specifies that the opening is one of an array of openings in the second material.

Example B25 includes the subject matter of any of Examples B1-24, and further specifies that an outside diameter of the millimeter-wave dielectric waveguide is constant along a longitudinal direction of the millimeter-wave dielectric waveguide.

Example B26 includes the subject matter of any of Examples B1-24, and further specifies that an outside diameter of the millimeter-wave dielectric waveguide is not constant along a longitudinal direction of the millimeter-wave dielectric waveguide.

Example B27 includes the subject matter of any of Examples B1-26, and further specifies that the first cladding has a circular cross-section.

Example B28 includes the subject matter of any of Examples B1-26, and further specifies that the first cladding has a non-circular cross-section.

Example B29 includes the subject matter of any of Examples B1-28, and further specifies that the millimeter-wave dielectric waveguide is one of multiple millimeter-wave dielectric waveguides in a cable.

Example B30 includes the subject matter of Example B29, and further specifies that the cable includes a wrap material around the multiple millimeter-wave dielectric waveguides.

Example B31 includes the subject matter of any of Examples B29-30, and further includes: a connector at an end of the millimeter-wave dielectric waveguide.

Example B32 includes the subject matter of any of Examples B1-28, and further specifies that the millimeter-wave dielectric waveguide is included in a package substrate or an interposer.

Example B33 includes the subject matter of any of Examples B1-32, and further specifies that the millimeter-wave dielectric waveguide has a length that is less than 5 meters.

Example B34 includes the subject matter of any of Examples B1-33, and further includes: a metal layer, wherein the second material is between the opening and the metal layer.

Example B35 includes the subject matter of Example B34, and further specifies that the metal layer is a first metal layer, the millimeter-wave dielectric waveguide further includes a second metal layer, and the first material is between the first metal layer and the second metal layer.

Example B36 is a millimeter-wave dielectric waveguide, including: a first section including a first material and a first cladding; and a second section including a second material and a second cladding; wherein the first section includes a coating outside the first cladding, the coating does not extend onto the second section, and the second material has a longitudinal opening therein.

Example B37 includes the subject matter of Example B36, and further specifies that the first material and the second material have a same material composition.

Example B38 includes the subject matter of any of Examples B36-37, and further specifies that the first cladding and the second cladding have a same material composition.

Example B39 includes the subject matter of any of Examples B36-38, and further specifies that the opening has a circular cross-section.

Example B40 includes the subject matter of any of Examples B36-38, and further specifies that the opening has a non-circular cross-section.

Example B41 includes the subject matter of any of Examples B36-40, and further includes: a third section between the first section and the second section, wherein the third section includes a third material and a third cladding, the third material has a longitudinal opening therein, and a diameter of the longitudinal opening increases closer to the second section.

Example B42 includes the subject matter of Example B41, and further specifies that a diameter of the third material increases closer to the second section.

Example B43 includes the subject matter of any of Examples B41-42, and further specifies that an outer diameter of the third material is equal to an outer diameter of the first material at an end of the third material proximate to the first material.

Example B44 includes the subject matter of any of Examples B41-43, and further specifies that an outer diameter of the third material is equal to an outer diameter of the second material at an end of the third material proximate to the second material.

Example B45 includes the subject matter of any of Examples B41-44, and further specifies that a length of the third section is between 1 millimeter and 50 millimeters.

Example B46 includes the subject matter of any of Examples B36-45, and further specifies that the coating has a loss tangent that is greater than a loss tangent of the first cladding.

Example B47 includes the subject matter of any of Examples B36-46, and further specifies that the coating includes conductive particles or fibers.

Example B48 includes the subject matter of any of Examples B36-47, and further specifies that the coating includes conductive particles or fibers, or the coating includes a ferrite material.

Example B49 includes the subject matter of any of Examples B36-48, and further includes: air in the opening.

Example B50 includes the subject matter of any of Examples B36-49, and further includes: a third material in the opening, wherein the third material has a dielectric constant that is less than the dielectric constant of the first material.

Example B51 includes the subject matter of any of Examples B36-50, and further specifies that the first material includes polytetrafluoroethylene, a fluoropolymer, a low-density polyethylene, or a high-density polyethylene.

Example B52 includes the subject matter of any of Examples B36-51, and further specifies that the first material includes a plastic.

Example B53 includes the subject matter of any of Examples B52, and further specifies that the plastic has a dielectric constant that is less than 4.

Example B54 includes the subject matter of any of Examples B36-53, and further specifies that the first material includes a ceramic.

Example B55 includes the subject matter of Example B54, and further specifies that the ceramic has a dielectric constant that is less than 10.

Example B56 includes the subject matter of any of Examples B36-55, and further specifies that the first cladding includes a foam.

Example B57 includes the subject matter of any of Examples B36-56, and further specifies that the first cladding has a dielectric constant that is less than 2.

Example B58 includes the subject matter of any of Examples B36-57, and further specifies that the first material has an outer diameter that is less than or equal to 2 millimeters.

Example B59 includes the subject matter of any of Examples B36-58, and further specifies that the opening is one of an array of openings in the second material.

Example B60 includes the subject matter of any of Examples B36-59, and further specifies that the first material has a longitudinal opening therein, and a diameter of the opening in the first material is less than a diameter of the opening in the second.

Example B61 includes the subject matter of any of Examples B36-59, and further specifies that the first material does not have a longitudinal opening therein.

Example B62 includes the subject matter of any of Examples B36-61, and further specifies that the first cladding has a circular cross-section.

Example B63 includes the subject matter of any of Examples B36-61, and further specifies that the first cladding has a non-circular cross-section.

Example B64 includes the subject matter of any of Examples B36-63, and further specifies that the millimeter-wave dielectric waveguide is one of multiple millimeter-wave dielectric waveguides in a cable.

Example B65 includes the subject matter of Example B64, and further specifies that the cable includes a wrap material around the multiple millimeter-wave dielectric waveguides.

Example B66 includes the subject matter of any of Examples B64-65, and further includes: a connector at an end of the millimeter-wave dielectric waveguide.

Example B67 includes the subject matter of any of Examples B36-63, and further specifies that the millimeter-wave dielectric waveguide is included in a package substrate or an interposer.

Example B68 includes the subject matter of any of Examples B36-67, and further specifies that the millimeter-wave dielectric waveguide has a length that is less than 5 meters.

Example B69 includes the subject matter of any of Examples B36-68, and further includes: a metal layer, wherein the second material is between the opening and the metal layer.

Example B70 includes the subject matter of Example B69, and further specifies that the metal layer is a first metal layer, the millimeter-wave dielectric waveguide further includes a second metal layer, and the first material is between the first metal layer and the second metal layer.

Example B71 is a millimeter-wave communication system, including: a first microelectronic component; a second microelectronic component; and a millimeter-wave dielectric waveguide, communicatively coupled between the first microelectronic component and the second microelectronic component, wherein the millimeter-wave dielectric waveguide includes: a first section including a first material and a first cladding, and a second section including a second material and a second cladding, wherein the first section includes an absorptive coating and the second section does not include an absorptive coating.

Example B72 includes the subject matter of Example B71, and further specifies that the first material and the second material have a same material composition.

Example B73 includes the subject matter of any of Examples B71-72, and further specifies that the first cladding and the second cladding have a same material composition.

Example B74 includes the subject matter of any of Examples B71-73, and further specifies that the second material has a longitudinal opening therein, and the opening has a circular cross-section.

Example B75 includes the subject matter of any of Examples B71-73, and further specifies that the second material has a longitudinal opening therein, and the opening has a non-circular cross-section.

Example B76 includes the subject matter of any of Examples B71-75, and further includes: a third section between the first section and the second section, wherein the third section includes a third material and a third cladding, the third material has a longitudinal opening therein, and a diameter of the longitudinal opening increases closer to the second section.

Example B77 includes the subject matter of Example B76, and further specifies that a diameter of the third material increases closer to the second section.

Example B78 includes the subject matter of any of Examples B76-77, and further specifies that an outer diameter of the third material is equal to an outer diameter of the first material at an end of the third material proximate to the first material.

Example B79 includes the subject matter of any of Examples B76-78, and further specifies that an outer diameter of the third material is equal to an outer diameter of the second material at an end of the third material proximate to the second material.

Example B80 includes the subject matter of any of Examples B76-79, and further specifies that a length of the third section is between 1 millimeter and 50 millimeters.

Example B81 includes the subject matter of any of Examples B71-80, and further specifies that the absorptive coating has a loss tangent that is greater than a loss tangent of the first cladding.

Example B82 includes the subject matter of Example B81, and further specifies that the absorptive coating has a loss tangent greater than a loss tangent of the second cladding.

Example B83 includes the subject matter of any of Examples B81-82, and further specifies that the absorptive coating includes conductive particles or fibers, or the absorptive coating includes a ferrite material.

Example B84 includes the subject matter of any of Examples B71-83, and further specifies that the millimeter-wave dielectric waveguide includes: air in the opening.

Example B85 includes the subject matter of any of Examples B71-84, and further specifies that the millimeter-wave dielectric waveguide includes: a third material in the opening, wherein the third material has a dielectric constant that is less than the dielectric constant of the first material.

Example B86 includes the subject matter of any of Examples B71-75, and further specifies that the first material includes polytetrafluoroethylene, a fluoropolymer, a low-density polyethylene, or a high-density polyethylene.

Example B87 includes the subject matter of any of Examples B71-86, and further specifies that the first material includes a plastic.

Example B88 includes the subject matter of Example B87, and further specifies that the plastic has a dielectric constant that is less than 4.

Example B89 includes the subject matter of any of Examples B71-88, and further specifies that the first material includes a ceramic.

Example B90 includes the subject matter of Example B89, and further specifies that the ceramic has a dielectric constant that is less than 10.

Example B91 includes the subject matter of any of Examples B71-90, and further specifies that the first cladding includes a foam.

Example B92 includes the subject matter of any of Examples B71-91, and further specifies that the first cladding has a dielectric constant that is less than 2.

Example B93 includes the subject matter of any of Examples B71-92, and further specifies that the first material has a diameter that is less than or equal to 2 millimeters.

Example B94 includes the subject matter of any of Examples B71-93, and further specifies that the second material has a longitudinal opening therein, and the opening is one of an array of openings in the second material.

Example B95 includes the subject matter of any of Examples B71-94, and further specifies that an outside diameter of the millimeter-wave dielectric waveguide is constant along a longitudinal direction of the millimeter-wave dielectric waveguide.

Example B96 includes the subject matter of any of Examples B71-94, and further specifies that an outside diameter of the millimeter-wave dielectric waveguide is not constant along a longitudinal direction of the millimeter-wave dielectric waveguide.

Example B97 includes the subject matter of any of Examples B71-96, and further specifies that the first cladding has a circular cross-section.

Example B98 includes the subject matter of any of Examples B71-96, and further specifies that the first cladding has a non-circular cross-section.

Example B99 includes the subject matter of any of Examples B71-98, and further specifies that the millimeter-wave dielectric waveguide is one of multiple millimeter-wave dielectric waveguides in a cable.

Example B100 includes the subject matter of Example B99, and further specifies that the cable includes a wrap material around the multiple millimeter-wave dielectric waveguides.

Example B101 includes the subject matter of any of Examples B99-100, and further specifies that the millimeter-wave dielectric waveguide includes: a connector at an end of the millimeter-wave dielectric waveguide.

Example B102 includes the subject matter of any of Examples B71-98, and further specifies that the millimeter-wave dielectric waveguide is included in a package substrate or an interposer.

Example B103 includes the subject matter of any of Examples B71-102, and further specifies that the millimeter-wave dielectric waveguide has a length that is less than 5 meters.

Example B104 includes the subject matter of any of Examples B71-103, and further specifies that the millimeter-wave dielectric waveguide includes: a metal layer, wherein the first material is between the first cladding and the metal layer.

Example B105 includes the subject matter of any of Examples B104, and further specifies that the metal layer is a first metal layer, the millimeter-wave dielectric waveguide further includes a second metal layer, and the first material is between the first metal layer and the second metal layer.

Example B106 includes the subject matter of any of Examples B71-105, and further specifies that the first microelectronic component includes a millimeter-wave communication transceiver.

Example B107 includes the subject matter of any of Examples B71-106, and further specifies that the millimeter-wave communication system is a server system.

Example B108 includes the subject matter of any of Examples B71-106, and further specifies that the millimeter-wave communication system is a handheld system.

Example B109 includes the subject matter of any of Examples B71-106, and further specifies that the millimeter-wave communication system is a wearable system.

Example B110 includes the subject matter of any of Examples B71-106, and further specifies that the millimeter-wave communication system is a vehicle system.

Example C1 is a millimeter-wave dielectric waveguide bundle, including: a first dielectric waveguide including a first core material and a first cladding material; and a second dielectric waveguide, adjacent to the first dielectric waveguide, including a second core material and a second cladding material, wherein, at a location along a longitudinal length of the millimeter-wave dielectric waveguide bundle, (1) the first core material has a different material composition than the second core material or (2) the first cladding material has a different material composition than the second cladding material.

Example C2 includes the subject matter of Example C1, and further specifies that the first core material has a different material composition than the second core material.

Example C3 includes the subject matter of any of Examples C1-2, and further specifies that the first cladding material has a different material composition than the second cladding material.

Example C4 includes the subject matter of any of Examples C1-3, and further specifies that the first dielectric waveguide includes a first longitudinal opening in the first core material, and the second dielectric waveguide includes a second longitudinal opening in the second core material.

Example C5 includes the subject matter of Example C4, and further specifies that an area of the first longitudinal opening at the location is different than an area of the second longitudinal opening at the location.

Example C6 includes the subject matter of any of Examples C4-5, and further specifies that a material in the first longitudinal opening is different than a material in the second longitudinal opening.

Example C7 includes the subject matter of Example C6, and further specifies that the material in the first longitudinal opening includes air.

Example C8 includes the subject matter of any of Examples C1-7, and further specifies that the first core material and the second core material have a different outer diameter at the location.

Example C9 includes the subject matter of any of Examples C1-7, and further specifies that the first cladding material and the second cladding material have a different outer diameter at the location.

Example C10 includes the subject matter of any of Examples C1-9, and further specifies that the first core material and the second core material have a different outer shape at the location.

Example C11 includes the subject matter of any of Examples C1-9, and further specifies that the first cladding material and the second cladding material have a different outer shape at the location.

Example C12 includes the subject matter of any of Examples C1-11, and further includes: a third dielectric waveguide, wherein the second dielectric waveguide is between the first dielectric waveguide and the second dielectric waveguide, and the third dielectric waveguide has a same structure as the first dielectric waveguide.

Example C13 includes the subject matter of any of Examples C1-12, and further specifies that the first core material includes polytetrafluoroethylene, a fluoropolymer, a low-density polyethylene, or a high-density polyethylene.

Example C14 includes the subject matter of any of Examples C1-13, and further specifies that the first core material includes a plastic.

Example C15 includes the subject matter of Example C14, and further specifies that the plastic has a dielectric constant that is less than 4.

Example C16 includes the subject matter of any of Examples C1-15, and further specifies that the first core material includes a ceramic.

Example C17 includes the subject matter of Example C16, and further specifies that the ceramic has a dielectric constant that is less than 10.

Example C18 includes the subject matter of any of Examples C1-17, and further specifies that the first cladding material includes a foam.

Example C19 includes the subject matter of any of Examples C1-18, and further specifies that the first cladding material has a dielectric constant that is less than 2.

Example C20 includes the subject matter of any of Examples C1-18, and further specifies that the first cladding material has a dielectric constant that is less than a dielectric constant of the first core material, and the second cladding material has a dielectric constant that is less than a dielectric constant of the second core material.

Example C21 includes the subject matter of any of Examples C1-20, and further specifies that the first core material has an outer diameter that is less than or equal to 2 millimeters.

Example C22 includes the subject matter of any of Examples C1-21, and further specifies that the first core material includes a plurality of openings.

Example C23 includes the subject matter of any of Examples C1-22, and further specifies that the millimeter-wave dielectric waveguide bundle includes a one-dimensional array of dielectric waveguides.

Example C24 includes the subject matter of any of Examples C1-22, and further specifies that the millimeter-wave dielectric waveguide bundle includes a two-dimensional array of dielectric waveguides.

Example C25 includes the subject matter of any of Examples C1-24, and further specifies that an outside diameter of the first dielectric waveguide is constant along a longitudinal direction of the millimeter-wave dielectric waveguide bundle.

Example C26 includes the subject matter of any of Examples C1-24, and further specifies that an outside diameter of the first dielectric waveguide is not constant along a longitudinal direction of the millimeter-wave dielectric waveguide bundle.

Example C27 includes the subject matter of any of Examples C1-26, and further specifies that the first cladding material has a circular cross-section.

Example C28 includes the subject matter of any of Examples C1-26, and further specifies that the first cladding material has a non-circular cross-section.

Example C29 includes the subject matter of any of Examples C1-28, and further includes: a wrap surrounding the first dielectric waveguide and the second dielectric waveguide.

Example C30 includes the subject matter of any of Examples C1-29, and further includes: a connector at an end of the millimeter-wave dielectric waveguide bundle.

Example C31 includes the subject matter of any of Examples C1-30, and further specifies that the millimeter-wave dielectric waveguide bundle includes four or more dielectric waveguides.

Example C32 includes the subject matter of any of Examples C1-28, and further specifies that the millimeter-wave dielectric waveguide bundle is included in a package substrate or an interposer.

Example C33 includes the subject matter of any of Examples C1-32, and further specifies that the millimeter-wave dielectric waveguide bundle has a length that is less than 5 meters.

Example C34 includes the subject matter of any of Examples C1-33, and further includes: a metal layer, wherein the first dielectric waveguide and the second dielectric waveguide are at a same face of the metal layer.

Example C35 includes the subject matter of Example C34, and further specifies that the metal layer is a first metal layer, the millimeter-wave dielectric waveguide bundle further includes a second metal layer, and the first dielectric waveguide is between the first metal layer and the second metal layer.

Example C36 is a millimeter-wave dielectric waveguide bundle, including: a first dielectric waveguide including a first core material and a first cladding material; and a second dielectric waveguide, adjacent to the first dielectric waveguide, including a second core material and a second cladding material, wherein, at a location along a longitudinal length of the millimeter-wave dielectric waveguide bundle, (1) the first core material has one or more different dimensions than the second core material or (2) the first cladding material has one or more different dimensions than the second cladding material.

Example C37 includes the subject matter of Example C36, and further specifies that the first core material has a different material composition than the second core material.

Example C38 includes the subject matter of any of Examples C36-37, and further specifies that the first cladding material has a different material composition than the second cladding material.

Example C39 includes the subject matter of any of Examples C36-38, and further specifies that the first dielectric waveguide includes a first longitudinal opening in the first core material, and the second dielectric waveguide includes a second longitudinal opening in the second core material.

Example C40 includes the subject matter of Example C39, and further specifies that an area of the first longitudinal opening at the location is different than an area of the second longitudinal opening at the location.

Example C41 includes the subject matter of any of Examples C39-40, and further specifies that a material in the first longitudinal opening is different than a material in the second longitudinal opening.

Example C42 includes the subject matter of Example C41, and further specifies that the material in the first longitudinal opening includes air.

Example C43 includes the subject matter of any of Examples C36-42, and further specifies that the first core material and the second core material have a different outer diameter at the location.

Example C44 includes the subject matter of any of Examples C36-42, and further specifies that the first cladding material and the second cladding material have a different outer diameter at the location.

Example C45 includes the subject matter of any of Examples C36-44, and further specifies that the first core material and the second core material have a different outer shape at the location.

Example C46 includes the subject matter of any of Examples C36-44, and further specifies that the first cladding material and the second cladding material have a different outer shape at the location.

Example C47 includes the subject matter of any of Examples C36-46, and further includes: a third dielectric waveguide, wherein the second dielectric waveguide is between the first dielectric waveguide and the second dielectric waveguide, and the third dielectric waveguide has a same structure as the first dielectric waveguide.

Example C48 includes the subject matter of any of Examples C36-47, and further specifies that the first core material includes polytetrafluoroethylene, a fluoropolymer, a low-density polyethylene, or a high-density polyethylene.

Example C49 includes the subject matter of any of Examples C36-48, and further specifies that the first core material includes a plastic.

Example C50 includes the subject matter of Example C49, and further specifies that the plastic has a dielectric constant that is less than 4.

Example C51 includes the subject matter of any of Examples C36-50, and further specifies that the first core material includes a ceramic.

Example C52 includes the subject matter of Example C51, and further specifies that the ceramic has a dielectric constant that is less than 10.

Example C53 includes the subject matter of any of Examples C36-52, and further specifies that the first cladding material includes a foam.

Example C54 includes the subject matter of any of Examples C36-53, and further specifies that the first cladding material has a dielectric constant that is less than 2.

Example C55 includes the subject matter of any of Examples C36-53, and further specifies that the first cladding material has a dielectric constant that is less than a dielectric constant of the first core material, and the second cladding material has a dielectric constant that is less than a dielectric constant of the second core material.

Example C56 includes the subject matter of any of Examples C36-55, and further specifies that the first core material has an outer diameter that is less than or equal to 2 millimeters.

Example C57 includes the subject matter of any of Examples C36-56, and further specifies that the first core material includes a plurality of openings.

Example C58 includes the subject matter of any of Examples C36-57, and further specifies that the millimeter-wave dielectric waveguide bundle includes a one-dimensional array of dielectric waveguides.

Example C59 includes the subject matter of any of Examples C36-57, and further specifies that the millimeter-wave dielectric waveguide bundle includes a two-dimensional array of dielectric waveguides.

Example C60 includes the subject matter of any of Examples C36-59, and further specifies that an outside diameter of the first dielectric waveguide is constant along a longitudinal direction of the millimeter-wave dielectric waveguide bundle.

Example C61 includes the subject matter of any of Examples C36-59, and further specifies that an outside diameter of the first dielectric waveguide is not constant along a longitudinal direction of the millimeter-wave dielectric waveguide bundle.

Example C62 includes the subject matter of any of Examples C36-61, and further specifies that the first cladding material has a circular cross-section.

Example C63 includes the subject matter of any of Examples C36-61, and further specifies that the first cladding material has a non-circular cross-section.

Example C64 includes the subject matter of any of Examples C36-63, and further includes: a wrap surrounding the first dielectric waveguide and the second dielectric waveguide.

Example C65 includes the subject matter of any of Examples C36-64, and further includes: a connector at an end of the millimeter-wave dielectric waveguide bundle.

Example C66 includes the subject matter of any of Examples C36-65, and further specifies that the millimeter-wave dielectric waveguide bundle includes four or more dielectric waveguides.

Example C67 includes the subject matter of any of Examples C36-63, and further specifies that the millimeter-wave dielectric waveguide bundle is included in a package substrate or an interposer.

Example C68 includes the subject matter of any of Examples C36-67, and further specifies that the millimeter-wave dielectric waveguide bundle has a length that is less than 5 meters.

Example C69 includes the subject matter of any of Examples C36-68, and further includes: a metal layer, wherein the first dielectric waveguide and the second dielectric waveguide are at a same face of the metal layer.

Example C70 includes the subject matter of Example C69, and further specifies that the metal layer is a first metal layer, the millimeter-wave dielectric waveguide bundle further includes a second metal layer, and the first dielectric waveguide is between the first metal layer and the second metal layer.

Example C71 is a millimeter-wave communication system, including: a first microelectronic component; a second microelectronic component; and a millimeter-wave dielectric waveguide bundle, communicatively coupled between the first microelectronic component and the second microelectronic component, wherein the millimeter-wave dielectric waveguide bundle includes: a first dielectric waveguide including a first core material and a first cladding material, and a second dielectric waveguide, adjacent to the first dielectric waveguide, including a second core material and a second cladding material, wherein, at a location along a longitudinal length of the millimeter-wave dielectric waveguide bundle, the first dielectric waveguide has a different material arrangement than the second dielectric waveguide.

Example C72 includes the subject matter of Example C71, and further specifies that the first core material has a different material composition than the second core material.

Example C73 includes the subject matter of any of Examples C71-72, and further specifies that the first cladding material has a different material composition than the second cladding material.

Example C74 includes the subject matter of any of Examples C71-73, and further specifies that the first dielectric waveguide includes a first longitudinal opening in the first core material, and the second dielectric waveguide includes a second longitudinal opening in the second core material.

Example C75 includes the subject matter of Example C74, and further specifies that an area of the first longitudinal opening at the location is different than an area of the second longitudinal opening at the location.

Example C76 includes the subject matter of any of Examples C74-75, and further specifies that a material in the first longitudinal opening is different than a material in the second longitudinal opening.

Example C77 includes the subject matter of Example C76, and further specifies that the material in the first longitudinal opening includes air.

Example C78 includes the subject matter of any of Examples C71-77, and further specifies that the first core material and the second core material have a different outer diameter at the location.

Example C79 includes the subject matter of any of Examples C71-77, and further specifies that the first cladding material and the second cladding material have a different outer diameter at the location.

Example C80 includes the subject matter of any of Examples C71-79, and further specifies that the first core material and the second core material have a different outer shape at the location.

Example C81 includes the subject matter of any of Examples C71-79, and further specifies that the first cladding material and the second cladding material have a different outer shape at the location.

Example C82 includes the subject matter of any of Examples C71-81, and further includes: a third dielectric waveguide, wherein the second dielectric waveguide is between the first dielectric waveguide and the second dielectric waveguide, and the third dielectric waveguide has a same structure as the first dielectric waveguide.

Example C83 includes the subject matter of any of Examples C71-82, and further specifies that the first core material includes polytetrafluoroethylene, a fluoropolymer, a low-density polyethylene, or a high-density polyethylene.

Example C84 includes the subject matter of any of Examples C71-83, and further specifies that the first core material includes a plastic.

Example C85 includes the subject matter of Example C84, and further specifies that the plastic has a dielectric constant that is less than 4.

Example C86 includes the subject matter of any of Examples C71-85, and further specifies that the first core material includes a ceramic.

Example C87 includes the subject matter of Example C86, and further specifies that the ceramic has a dielectric constant that is less than 10.

Example C88 includes the subject matter of any of Examples C71-87, and further specifies that the first cladding material includes a foam.

Example C89 includes the subject matter of any of Examples C71-88, and further specifies that the first cladding material has a dielectric constant that is less than 2.

Example C90 includes the subject matter of any of Examples C71-88, and further specifies that the first cladding material has a dielectric constant that is less than a dielectric constant of the first core material, and the second cladding material has a dielectric constant that is less than a dielectric constant of the second core material.

Example C91 includes the subject matter of any of Examples C71-90, and further specifies that the first core material has an outer diameter that is less than or equal to 2 millimeters.

Example C92 includes the subject matter of any of Examples C71-91, and further specifies that the first core material includes a plurality of openings.

Example C93 includes the subject matter of any of Examples C71-92, and further specifies that the millimeter-wave dielectric waveguide bundle includes a one-dimensional array of dielectric waveguides.

Example C94 includes the subject matter of any of Examples C71-92, and further specifies that the millimeter-wave dielectric waveguide bundle includes a two-dimensional array of dielectric waveguides.

Example C95 includes the subject matter of any of Examples C71-94, and further specifies that an outside diameter of the first dielectric waveguide is constant along a longitudinal direction of the millimeter-wave dielectric waveguide bundle.

Example C96 includes the subject matter of any of Examples C71-94, and further specifies that an outside diameter of the first dielectric waveguide is not constant along a longitudinal direction of the millimeter-wave dielectric waveguide bundle.

Example C97 includes the subject matter of any of Examples C71-96, and further specifies that the first cladding material has a circular cross-section.

Example C98 includes the subject matter of any of Examples C71-96, and further specifies that the first cladding material has a non-circular cross-section.

Example C99 includes the subject matter of any of Examples C71-98, and further includes: a wrap surrounding the first dielectric waveguide and the second dielectric waveguide.

Example C100 includes the subject matter of any of Examples C71-99, and further includes: a connector at an end of the millimeter-wave dielectric waveguide bundle.

Example C101 includes the subject matter of any of Examples C71-100, and further specifies that the millimeter-wave dielectric waveguide bundle includes four or more dielectric waveguides.

Example C102 includes the subject matter of any of Examples C71-98, and further specifies that the millimeter-wave dielectric waveguide bundle is included in a package substrate or an interposer.

Example C103 includes the subject matter of any of Examples C71-102, and further specifies that the millimeter-wave dielectric waveguide bundle has a length that is less than 5 meters.

Example C104 includes the subject matter of any of Examples C71-103, and further includes: a metal layer, wherein the first dielectric waveguide and the second dielectric waveguide are at a same face of the metal layer.

Example C105 includes the subject matter of Example C104, and further specifies that the metal layer is a first metal layer, the millimeter-wave dielectric waveguide bundle further includes a second metal layer, and the first dielectric waveguide is between the first metal layer and the second metal layer.

Example C106 includes the subject matter of any of Examples C71-105, and further specifies that the first microelectronic component includes a millimeter-wave communication transceiver.

Example C107 includes the subject matter of any of Examples C71-106, and further specifies that the millimeter-wave communication system is a server system.

Example C108 includes the subject matter of any of Examples C71-106, and further specifies that the millimeter-wave communication system is a handheld system.

Example C109 includes the subject matter of any of Examples C71-106, and further specifies that the millimeter-wave communication system is a wearable system.

Example C110 includes the subject matter of any of Examples C71-106, and further specifies that the millimeter-wave communication system is a vehicle system.

Example C111 is a method of manufacturing a millimeter-wave dielectric waveguide bundle including any of the methods disclosed herein.

Example D1 is a millimeter-wave dielectric waveguide connector, including: a first material; a second material, at least partially around the first material, wherein the second material has a dielectric constant that is less than a dielectric constant of the first material; a third material, at least partially around the second material, wherein the third material has a loss tangent that is greater than a loss tangent of the second material; a first connector interface, wherein a first end of the first material is exposed at the first connector interface; and a second connector interface, wherein a second end of the first material is exposed at the second connector interface.

Example D2 includes the subject matter of Example D1, and further specifies that the first connector interface is parallel to the second connector interface.

Example D3 includes the subject matter of Example D1, and further specifies that the first connector interface is not parallel to the second connector interface.

Example D4 includes the subject matter of Example D1, and further specifies that the first connector interface is perpendicular to the second connector interface.

Example D5 includes the subject matter of Example D1, and further specifies that the millimeter-wave dielectric waveguide connector is curved.

Example D6 includes the subject matter of any of Examples D1-5, and further includes: a housing around the first material, second material, and third material.

Example D7 includes the subject matter of Example D6, and further specifies that the first connector interface is recessed relative to the housing.

Example D8 includes the subject matter of Example D6, and further specifies that the housing is recessed relative to the first connector interface.

Example D9 includes the subject matter of any of Examples D1-8, and further specifies that a face of the first end of the first material is parallel to a face of an end of the second material at the first connector interface.

Example D10 includes the subject matter of any of Examples D1-8, and further specifies that a face of the first end of the first material is not parallel to a face of an end of the second material at the first connector interface.

Example D11 includes the subject matter of any of Examples D1-10, and further specifies that the second material is exposed at the first connector interface.

Example D12 includes the subject matter of any of Examples D1-11, and further specifies that the second material is exposed at the second connector interface.

Example D13 includes the subject matter of any of Examples D1-12, and further specifies that the third material is not exposed at the first connector interface.

Example D14 includes the subject matter of any of Examples D1-13, and further specifies that the third material is not exposed at the second connector interface.

Example D15 includes the subject matter of any of Examples D1-14, and further specifies that the second material wraps around the first material.

Example D16 includes the subject matter of any of Examples D1-15, and further specifies that the first material includes polytetrafluoroethylene, a fluoropolymer, a low-density polyethylene, or a high-density polyethylene.

Example D17 includes the subject matter of any of Examples D1-16, and further specifies that the first material includes a plastic.

Example D18 includes the subject matter of Example D17, and further specifies that the plastic has a dielectric constant that is less than 4.

Example D19 includes the subject matter of any of Examples D1-18, and further specifies that the first material includes a ceramic.

Example D20 includes the subject matter of Example D19, and further specifies that the ceramic has a dielectric constant that is less than 10.

Example D21 includes the subject matter of any of Examples D1-20, and further specifies that the second material includes a foam.

Example D22 includes the subject matter of any of Examples D1-21, and further specifies that the second material has a dielectric constant that is less than 2.

Example D23 includes the subject matter of any of Examples D1-22, and further specifies that the second material has an outer diameter that is between 1 millimeter and 5 millimeters.

Example D24 includes the subject matter of any of Examples D1-23, and further specifies that the third material includes conductive particles or fibers.

Example D25 includes the subject matter of any of Examples D1-24, and further specifies that the third material includes a ferrite material.

Example D26 includes the subject matter of any of Examples D1-25, and further specifies that the third material has a thickness between 0.1 millimeters and 2 millimeters.

Example D27 includes the subject matter of any of Examples D1-26, and further specifies that a diameter of the first material narrows from the first connector interface.

Example D28 includes the subject matter of any of Examples D1-26, and further specifies that a diameter of the first material is constant in the millimeter-wave dielectric waveguide connector.

Example D29 includes the subject matter of any of Examples D1-28, and further specifies that a length of the first material is between 5 millimeters and 50 millimeters.

Example D30 includes the subject matter of any of Examples D1-29, and further specifies that the second connector interface is coupled to a microelectronic support.

Example D31 includes the subject matter of Example D30, and further specifies that the microelectronic support includes a package substrate or an interposer.

Example D32 includes the subject matter of any of Examples D1-29, and further specifies that the second connector interface is coupled to a dielectric waveguide cable.

Example D33 includes the subject matter of any of Examples D1-32, and further specifies that the first material has a circular outer diameter.

Example D34 includes the subject matter of any of Examples D1-32, and further specifies that the first material has a non-circular outer diameter.

Example D35 includes the subject matter of any of Examples D1-34, and further specifies that the second material has a circular outer diameter.

Example D36 includes the subject matter of any of Examples D1-34, and further specifies that the second material has a non-circular outer diameter.

Example D37 includes the subject matter of any of Examples D1-36, and further specifies that the first material, second material, and third material are part of a waveguide, and the millimeter-wave dielectric waveguide connector includes multiple waveguides.

Example D38 includes the subject matter of any of Examples D1-37, and further specifies that the first end of the first material is recessed relative to an end of the second material at the first connector interface.

Example D39 includes the subject matter of any of Examples D1-37, and further specifies that an end of the second material is recessed relative to the first end of the first material at the first connector interface.

Example D40 includes the subject matter of any of Examples D1-37, and further specifies that an end of the second material is coplanar with the first end of the first material at the first connector interface.

Example D41 is a millimeter-wave dielectric waveguide connector complex, including: a first connector, including: a first material, and a second material, at least partially around the first material, wherein the second material has a dielectric constant that is less than a dielectric constant of the first material, a first connector interface, and a second connector interface, opposite to the first connector interface; and a second connector to mate with the first connector, wherein the second connector includes: a first material, and a second material, at least partially around the first material, wherein the second material has a dielectric constant that is less than a dielectric constant of the first material; wherein the first connector and the second connector meet at a first connector interface of the first connector, the first connector or the second connector includes a third material such that, when the first connector and the second connector are mated, the third material is at least partially around the second material of the first connector or the second material of the second connector, and wherein the third material has a loss tangent that is greater than a loss tangent of the second material.

Example D42 includes the subject matter of Example D41, and further specifies that the first connector interface is parallel to the second connector interface.

Example D43 includes the subject matter of Example D41, and further specifies that the first connector interface is not parallel to the second connector interface.

Example D44 includes the subject matter of Example D41, and further specifies that the first connector interface is perpendicular to the second connector interface.

Example D45 includes the subject matter of Example D41, and further specifies that the millimeter-wave dielectric waveguide connector is curved.

Example D46 includes the subject matter of any of Examples D41-45, and further specifies that the first connector further includes: a housing around the first material and the second material.

Example D47 includes the subject matter of Example D46, and further specifies that the first connector interface is recessed relative to the housing.

Example D48 includes the subject matter of Example D46, and further specifies that the housing is recessed relative to the first connector interface.

Example D49 includes the subject matter of any of Examples D41-48, and further specifies that a face of the first material of the first connector is parallel to a face of an end of the second material of the first connector at the first connector interface.

Example D50 includes the subject matter of any of Examples D41-48, and further specifies that a face of the first material of the first connector is not parallel to a face of an end of the second material of the first connector at the first connector interface.

Example D51 includes the subject matter of any of Examples D41-50, and further specifies that the second material of the first connector is exposed at the first connector interface.

Example D52 includes the subject matter of any of Examples D41-51, and further specifies that the second material of the first connector is exposed at the second connector interface.

Example D53 includes the subject matter of any of Examples D41-52, and further specifies that the third material is included in the first connector, and is not exposed at the first connector interface.

Example D54 includes the subject matter of any of Examples D41-53, and further specifies that the third material is included in the first connector, and is not exposed at the second connector interface.

Example D55 includes the subject matter of any of Examples D41-54, and further specifies that the second material wraps around the first material in the second connector.

Example D56 includes the subject matter of any of Examples D41-55, and further specifies that the first material of the first connector includes polytetrafluoroethylene, a fluoropolymer, a low-density polyethylene, or a high-density polyethylene.

Example D57 includes the subject matter of any of Examples D41-56, and further specifies that the first material of the first connector includes a plastic.

Example D58 includes the subject matter of Example D57, and further specifies that the plastic has a dielectric constant that is less than 4.

Example D59 includes the subject matter of any of Examples D41-58, and further specifies that the first material of the first connector includes a ceramic.

Example D60 includes the subject matter of Example D59, and further specifies that the ceramic has a dielectric constant that is less than 10.

Example D61 includes the subject matter of any of Examples D41-60, and further specifies that the second material of the first connector includes a foam.

Example D62 includes the subject matter of any of Examples D41-61, and further specifies that the second material of the first connector has a dielectric constant that is less than 2.

Example D63 includes the subject matter of any of Examples D41-62, and further specifies that the second material of the first connector has an outer diameter that is between 1 millimeter and 5 millimeters.

Example D64 includes the subject matter of any of Examples D41-63, and further specifies that the third material includes conductive particles or fibers.

Example D65 includes the subject matter of any of Examples D41-64, and further specifies that the third material includes a ferrite material.

Example D66 includes the subject matter of any of Examples D41-65, and further specifies that the third material has a thickness between 0.1 millimeters and 2 millimeters.

Example D67 includes the subject matter of any of Examples D41-66, and further specifies that the first connector or the second connector includes a tapered portion of the first material.

Example D68 includes the subject matter of any of Examples D41-66, and further specifies that a diameter of the first material is constant in the second connector.

Example D69 includes the subject matter of any of Examples D41-68, and further specifies that a length of the first material in the first connector is between 5 millimeters and 50 millimeters.

Example D70 includes the subject matter of any of Examples D41-69, and further specifies that the second connector interface is coupled to a microelectronic support.

Example D71 includes the subject matter of Example D70, and further specifies that the microelectronic support includes a package substrate or an interposer.

Example D72 includes the subject matter of any of Examples D41-69, and further specifies that the second connector interface is coupled to a dielectric waveguide cable.

Example D73 includes the subject matter of any of Examples D41-72, and further specifies that the first material of the first connector has a circular outer diameter.

Example D74 includes the subject matter of any of Examples D41-72, and further specifies that the first material of the first connector has a non-circular outer diameter.

Example D75 includes the subject matter of any of Examples D41-74, and further specifies that the second material of the first connector has a circular outer diameter.

Example D76 includes the subject matter of any of Examples D41-74, and further specifies that the second material of the first connector has a non-circular outer diameter.

Example D77 includes the subject matter of any of Examples D41-76, and further specifies that the first material and the second material of the first connector are part of a waveguide, and the first connector includes multiple waveguides.

Example D78 includes the subject matter of any of Examples D41-77, and further specifies that an end of the first material of the first connector is recessed relative to an end of the second material of the first connector at the first connector interface.

Example D79 includes the subject matter of any of Examples D41-77, and further specifies that an end of the second material of the first connector is recessed relative to an end of the first material of the first connector at the first connector interface.

Example D80 includes the subject matter of any of Examples D41-77, and further specifies that an end of the second material of the first connector is coplanar with an end of the first material of the first connector at the first connector interface.

Example D81 is a millimeter-wave communication component, including: a microelectronic component; and a millimeter-wave dielectric waveguide connector, communicatively coupled to the microelectronic component, wherein the millimeter-wave dielectric waveguide connector includes: a first material, a second material, at least partially around the first material, wherein the second material has a dielectric constant that is less than a dielectric constant of the first material, a third material, at least partially around the second material, wherein the third material has a loss tangent that is greater than a loss tangent of the second material, a first connector interface, wherein a first end of the first material is exposed at the first connector interface, and a second connector interface coupled to the microelectronic component, wherein a second end of the first material is exposed at the second connector interface.

Example D82 includes the subject matter of Example D81, and further specifies that the first connector interface is parallel to the second connector interface.

Example D83 includes the subject matter of Example D81, and further specifies that the first connector interface is not parallel to the second connector interface.

Example D84 includes the subject matter of Example D81, and further specifies that the first connector interface is perpendicular to the second connector interface.

Example D85 includes the subject matter of Example D81, and further specifies that the millimeter-wave dielectric waveguide connector is curved.

Example D86 includes the subject matter of any of Examples D81-85, and further specifies that the millimeter-wave dielectric waveguide connector includes a housing around the first material, second material, and third material.

Example D87 includes the subject matter of Example D86, and further specifies that the first connector interface is recessed relative to the housing.

Example D88 includes the subject matter of Example D86, and further specifies that the housing is recessed relative to the first connector interface.

Example D89 includes the subject matter of any of Examples D81-88, and further specifies that a face of the first end of the first material is parallel to a face of an end of the second material at the first connector interface.

Example D90 includes the subject matter of any of Examples D81-88, and further specifies that a face of the first end of the first material is not parallel to a face of an end of the second material at the first connector interface.

Example D91 includes the subject matter of any of Examples D81-90, and further specifies that the second material is exposed at the first connector interface.

Example D92 includes the subject matter of any of Examples D81-91, and further specifies that the second material is exposed at the second connector interface.

Example D93 includes the subject matter of any of Examples D81-92, and further specifies that the third material is not exposed at the first connector interface.

Example D94 includes the subject matter of any of Examples D81-93, and further specifies that the third material is not exposed at the second connector interface.

Example D95 includes the subject matter of any of Examples D81-94, and further specifies that the second material wraps around the first material.

Example D96 includes the subject matter of any of Examples D81-95, and further specifies that the first material includes polytetrafluoroethylene, a fluoropolymer, a low-density polyethylene, or a high-density polyethylene.

Example D97 includes the subject matter of any of Examples D81-96, and further specifies that the first material includes a plastic.

Example D98 includes the subject matter of Example D97, and further specifies that the plastic has a dielectric constant that is less than 4.

Example D99 includes the subject matter of any of Examples D81-98, and further specifies that the first material includes a ceramic.

Example D100 includes the subject matter of Example D99, and further specifies that the ceramic has a dielectric constant that is less than 10.

Example D101 includes the subject matter of any of Examples D81-100, and further specifies that the second material includes a foam.

Example D102 includes the subject matter of any of Examples D81-101, and further specifies that the second material has a dielectric constant that is less than 2.

Example D103 includes the subject matter of any of Examples D81-102, and further specifies that the second material has an outer diameter that is between 1 millimeter and 5 millimeters.

Example D104 includes the subject matter of any of Examples D81-103, and further specifies that the third material includes conductive particles or fibers.

Example D105 includes the subject matter of any of Examples D81-104, and further specifies that the third material includes a ferrite material.

Example D106 includes the subject matter of any of Examples D81-105, and further specifies that the third material has a thickness between 0.1 millimeters and 2 millimeters.

Example D107 includes the subject matter of any of Examples D81-106, and further specifies that a diameter of the first material narrows from the first connector interface.

Example D108 includes the subject matter of any of Examples D81-106, and further specifies that a diameter of the first material is constant in the millimeter-wave dielectric waveguide connector.

Example D109 includes the subject matter of any of Examples D81-108, and further specifies that a length of the first material is between 5 millimeters and 50 millimeters.

Example D110 includes the subject matter of any of Examples D81-109, and further specifies that the second connector interface is coupled to a microelectronic support of the microelectronic component.

Example D111 includes the subject matter of Example D110, and further specifies that the microelectronic support includes a package substrate or an interposer.

Example D112 includes the subject matter of any of Examples D81-109, and further specifies that the second connector interface is coupled to a dielectric waveguide cable of the microelectronic component.

Example D113 includes the subject matter of any of Examples D81-112, and further specifies that the first material has a circular outer diameter.

Example D114 includes the subject matter of any of Examples D81-112, and further specifies that the first material has a non-circular outer diameter.

Example D115 includes the subject matter of any of Examples D81-114, and further specifies that the second material has a circular outer diameter.

Example D116 includes the subject matter of any of Examples D81-114, and further specifies that the second material has a non-circular outer diameter.

Example D117 includes the subject matter of any of Examples D81-116, and further specifies that the first material, second material, and third material are part of a waveguide, and the millimeter-wave dielectric waveguide connector includes multiple waveguides.

Example D118 includes the subject matter of any of Examples D81-117, and further specifies that the first end of the first material is recessed relative to an end of the second material at the first connector interface.

Example D119 includes the subject matter of any of Examples D81-117, and further specifies that an end of the second material is recessed relative to the first end of the first material at the first connector interface.

Example D120 includes the subject matter of any of Examples D81-117, and further specifies that an end of the second material is coplanar with the first end of the first material at the first connector interface.

Example D121 includes the subject matter of any of Examples D81-120, and further specifies that the millimeter-wave communication component is part of a server system.

Example D122 includes the subject matter of any of Examples D81-120, and further specifies that the millimeter-wave communication component is part of a handheld system.

Example D123 includes the subject matter of any of Examples D81-120, and further specifies that the millimeter-wave communication component is part of a wearable system.

Example D124 includes the subject matter of any of Examples D81-120, and further specifies that the millimeter-wave communication component is part of a vehicle system.

Example D125 is a method of manufacturing a millimeter-wave dielectric waveguide connector including any of the methods disclosed herein.

Example E1 is a millimeter-wave dielectric waveguide connector, including: a first connector interface; a second connector interface; a dielectric material exposed at the first connector interface and at the second connector interface; and a metal structure around the dielectric material, wherein the metal structure includes a flared portion at the first connector interface.

Example E2 includes the subject matter of Example E1, and further specifies that an end of the dielectric material at the first connector interface is parallel to an end of the dielectric material at the second connector interface.

Example E3 includes the subject matter of Example E1, and further specifies that an end of the dielectric material at the first connector interface is not parallel to an end of the dielectric material at the second connector interface.

Example E4 includes the subject matter of any of Examples E1-3, and further specifies that an end of the dielectric material at the first connector interface is recessed from the flared portion.

Example E5 includes the subject matter of any of Examples E1-3, and further specifies that an end of the dielectric material at the first connector interface extends into the flared portion.

Example E6 includes the subject matter of Example E1, and further specifies that the first connector interface is parallel to the second connector interface.

Example E7 includes the subject matter of Example E1, and further specifies that the first connector interface is not parallel to the second connector interface.

Example E8 includes the subject matter of Example E1, and further specifies that the first connector interface is perpendicular to the second connector interface.

Example E9 includes the subject matter of Example E1, and further specifies that the millimeter-wave dielectric waveguide connector is curved.

Example E10 includes the subject matter of any of Examples E1-9, and further includes: a housing around the dielectric material and the metal structure.

Example E11 includes the subject matter of Example E10, and further specifies that the housing includes a plastic.

Example E12 includes the subject matter of any of Examples E1-11, and further specifies that the dielectric material includes polytetrafluoroethylene, a fluoropolymer, a low-density polyethylene, or a high-density polyethylene.

Example E13 includes the subject matter of any of Examples E1-12, and further specifies that the dielectric material includes a plastic.

Example E14 includes the subject matter of Example E13, and further specifies that the plastic has a dielectric constant that is less than 4.

Example E15 includes the subject matter of any of Examples E1-14, and further specifies that the dielectric material includes a ceramic.

Example E16 includes the subject matter of Example E15, and further specifies that the ceramic has a dielectric constant that is less than 10.

Example E17 includes the subject matter of any of Examples E1-16, and further specifies that a length of the dielectric material is between 5 millimeters and 50 millimeters.

Example E18 includes the subject matter of any of Examples E1-17, and further specifies that the second connector interface is coupled to a microelectronic support.

Example E19 includes the subject matter of Example E18, and further specifies that the microelectronic support includes a package substrate or an interposer.

Example E20 includes the subject matter of any of Examples E1-17, and further specifies that the second connector interface is coupled to a dielectric waveguide cable.

Example E21 includes the subject matter of any of Examples E1-20, and further specifies that the dielectric material has a circular outer diameter.

Example E22 includes the subject matter of any of Examples E1-20, and further specifies that the dielectric material has a non-circular outer diameter.

Example E23 includes the subject matter of any of Examples E1-22, and further specifies that the dielectric material and the metal structure are part of a waveguide, and the millimeter-wave dielectric waveguide connector includes multiple waveguides.

Example E24 is a millimeter-wave dielectric waveguide connector complex, including: a first connector, including: a first connector interface, a second connector interface, opposite to the first connector interface, a dielectric material, and a metal structure, wherein the metal structure includes a horn portion at a first connector interface; and a second connector to mate with the first connector, wherein the second connector includes: a first material, and a second material, at least partially around the first material, wherein the second material has a dielectric constant that is less than a dielectric constant of the first material; wherein the first connector and the second connector are to mate at a first connector interface of the first connector.

Example E25 includes the subject matter of Example E24, and further specifies that an end of the dielectric material at the first connector interface is parallel to an end of the dielectric material at the second connector interface.

Example E26 includes the subject matter of Example E24, and further specifies that an end of the dielectric material at the first connector interface is not parallel to an end of the dielectric material at the second connector interface.

Example E27 includes the subject matter of any of Examples E24-26, and further specifies that an end of the dielectric material at the first connector interface is recessed from the horn portion.

Example E28 includes the subject matter of any of Examples E24-26, and further specifies that an end of the dielectric material at the first connector interface extends into the horn portion.

Example E29 includes the subject matter of Example E24, and further specifies that the first connector interface is parallel to the second connector interface.

Example E30 includes the subject matter of Example E24, and further specifies that the first connector interface is not parallel to the second connector interface.

Example E31 includes the subject matter of Example E24, and further specifies that the first connector interface is perpendicular to the second connector interface.

Example E32 includes the subject matter of Example E24, and further specifies that the millimeter-wave dielectric waveguide connector is curved.

Example E33 includes the subject matter of any of Examples E24-32, and further includes: a housing around the dielectric material and the metal structure.

Example E34 includes the subject matter of Example E33, and further specifies that the housing includes a plastic.

Example E35 includes the subject matter of any of Examples E24-34, and further specifies that the dielectric material includes polytetrafluoroethylene, a fluoropolymer, a low-density polyethylene, or a high-density polyethylene.

Example E36 includes the subject matter of any of Examples E24-35, and further specifies that the dielectric material includes a plastic.

Example E37 includes the subject matter of Example E36, and further specifies that the plastic has a dielectric constant that is less than 4.

Example E38 includes the subject matter of any of Examples E24-37, and further specifies that the dielectric material includes a ceramic.

Example E39 includes the subject matter of Example E38, and further specifies that the ceramic has a dielectric constant that is less than 10.

Example E40 includes the subject matter of any of Examples E24-39, and further specifies that a length of the dielectric material is between 5 millimeters and 50 millimeters.

Example E41 includes the subject matter of any of Examples E24-40, and further specifies that the second connector interface is coupled to a microelectronic support.

Example E42 includes the subject matter of Example E41, and further specifies that the microelectronic support includes a package substrate or an interposer.

Example E43 includes the subject matter of any of Examples E24-40, and further specifies that the second connector interface is coupled to a dielectric waveguide cable.

Example E44 includes the subject matter of any of Examples E24-43, and further specifies that the dielectric material has a circular outer diameter.

Example E45 includes the subject matter of any of Examples E24-43, and further specifies that the dielectric material has a non-circular outer diameter.

Example E46 includes the subject matter of any of Examples E24-45, and further specifies that the dielectric material and the metal structure are part of a waveguide, and the millimeter-wave dielectric waveguide connector includes multiple waveguides.

Example E47 includes the subject matter of any of Examples E24-46, and further specifies that the dielectric material and the first material have a same material composition.

Example E48 includes the subject matter of any of Examples E24-47, and further specifies that the second material includes a foam.

Example E49 includes the subject matter of any of Examples E24-48, and further specifies that the second material has a dielectric constant that is less than 2.

Example E50 includes the subject matter of any of Examples E24-49, and further specifies that an end of the first material tapers to a smaller diameter.

Example E51 includes the subject matter of any of Examples E24-49, and further specifies that the first material has a constant diameter.

Example E52 is a microelectronic support, including: a substrate-integrated waveguide; a millimeter-wave dielectric waveguide connector; and a launcher coupled between the substrate-integrated waveguide and the millimeter-wave dielectric waveguide connector.

Example E53 includes the subject matter of Example E52, and further specifies that the substrate-integrated waveguide includes slots proximate to the launcher.

Example E54 includes the subject matter of any of Examples E52-53, and further specifies that the microelectronic support includes a plurality of substrate-integrated waveguides.

Example E55 includes the subject matter of Example E54, and further includes: a multiplexer coupled between the launcher and the plurality of substrate-integrated waveguides.

Example E56 includes the subject matter of Example E55, and further specifies that the multiplexer is an N-plexer, and the microelectronic support includes N substrate-integrated waveguides.

Example E57 includes the subject matter of any of Examples E52-56, and further specifies that the microelectronic support includes a package substrate coupled to an interposer, and the substrate-integrated waveguide is in the interposer.

Example E58 includes the subject matter of Example E57, and further specifies that the interposer includes silicon or aluminum nitride.

Example E59 includes the subject matter of any of Examples E57-58, and further specifies that the millimeter-wave dielectric waveguide connector is coupled to the interposer.

Example E60 includes the subject matter of any of Examples E57-59, and further specifies that a microelectronic component is coupled to the package substrate, and the package substrate includes a transmission line between the interposer and the microelectronic component.

Example E61 includes the subject matter of any of Examples E57-60, and further specifies that the package substrate includes an organic dielectric material.

Example E62 includes the subject matter of any of Examples E52-61, and further specifies that the launcher includes a patch launcher, a horn launcher, a Vivaldi-like launcher, a dipole-based launcher, or a slot-based launcher.

Example F1 is a microelectronic support for millimeter-wave communication, including: a millimeter-wave communication transmission line, wherein the transmission line includes a trace in a metal layer, wherein the trace is electrically coupled to a via by a via pad in the metal layer; and a ground plane in the metal layer, wherein one or more metal portions contact the via pad and the ground plane.

Example F2 includes the subject matter of Example F1, and further specifies that the trace is part of a microstrip, stripline, or coplanar waveguide.

Example F3 includes the subject matter of any of Examples F1-2, and further specifies that the one or more metal portions include a spoke between the via pad and the ground plane.

Example F4 includes the subject matter of any of Examples F1-3, and further specifies that the one or more metal portions include multiple spokes between the via pad and the ground plane.

Example F5 includes the subject matter of any of Examples F1-4, and further specifies that the one or more metal portions include a branching spoke between the via pad and the ground plane.

Example F6 includes the subject matter of any of Examples F1-5, and further specifies that the via pad is spaced apart from the ground plane by an antipad, and the antipad is non-circular.

Example F7 includes the subject matter of Example F6, and further specifies that the antipad includes an extension into which a metal portion extends.

Example F8 includes the subject matter of any of Examples F6-7, and further specifies that the antipad includes a plurality of extensions.

Example F9 includes the subject matter of any of Examples F7-8, and further specifies that the extension has a length between 150 microns and 12000 microns.

Example F10 includes the subject matter of any of Examples F6-9, and further specifies that the antipad has a diameter between 100 microns and 600 microns.

Example F11 includes the subject matter of any of Examples F1-10, and further specifies that the via pad is a first via pad, the metal layer is a first metal layer, the one or more metal portions are one or more first metal portions, the transmission line includes a second via pad in a second metal layer, and one or more second metal portions contact the second via pad and a second ground plane in the second metal layer.

Example F12 includes the subject matter of Example F11, and further specifies that the one or more second metal portions include a spoke between the second via pad and the second ground plane.

Example F13 includes the subject matter of any of Examples F11-12, and further specifies that the one or more second metal portions include multiple spokes between the second via pad and the second ground plane.

Example F14 includes the subject matter of any of Examples F11-13, and further specifies that the one or more second metal portions include a branching spoke between the second via pad and the second ground plane.

Example F15 includes the subject matter of any of Examples F11-14, and further specifies that the second via pad is spaced apart from the second ground plane by a second antipad, and the second antipad is non-circular.

Example F16 includes the subject matter of Example F15, and further specifies that the second antipad includes an extension into which a second metal portion extends.

Example F17 includes the subject matter of any of Examples F15-16, and further specifies that the second antipad includes a plurality of extensions.

Example F18 includes the subject matter of any of Examples F11-17, and further specifies that the first via pad and the second via pad have at least one via therebetween.

Example F19 includes the subject matter of any of Examples F11-17, and further specifies that the first via pad and the second via pad have at least one via therebetween.

Example F20 includes the subject matter of any of Examples F1-19, and further specifies that the trace is a first trace, the transmission line further includes a second trace, and the via is between the first trace and the second trace.

Example F21 includes the subject matter of Example F20, and further specifies that the second trace is part of a microstrip, stripline, or coplanar waveguide.

Example F22 includes the subject matter of any of Examples F1-21, and further includes: a launcher structure at an end of the transmission line.

Example F23 includes the subject matter of any of Examples F1-22, and further specifies that a width of the trace is between 5 microns and 400 microns.

Example F24 includes the subject matter of any of Examples F1-23, and further specifies that a diameter of the via pad is between 50 microns and 300 microns.

Example F25 includes the subject matter of any of Examples F1-24, and further specifies that the one or more metal portions include a metal portion with a length between 150 microns and 12000 microns.

Example F26 includes the subject matter of any of Examples F1-25, and further specifies that the one or more metal portions include a metal portion with a width between 5 microns and 400 microns.

Example F27 includes the subject matter of any of Examples F1-26, and further specifies that the trace is spaced apart from the ground plane by a distance between 5 microns and 400 microns.

Example F28 is a microelectronic package, including: a microelectronic support including: a millimeter-wave communication transmission line, wherein the transmission line includes a trace in a metal layer, wherein the trace is electrically coupled to a via by a via pad in the metal layer, and a ground plane in the metal layer, wherein one or more metal portions contact the via pad and the ground plane; and a microelectronic component coupled to the microelectronic support, wherein the microelectronic component is communicatively coupled to the transmission line.

Example F29 includes the subject matter of Example F28, and further specifies that the trace is part of a microstrip, stripline, or coplanar waveguide.

Example F30 includes the subject matter of any of Examples F28-29, and further specifies that the one or more metal portions include a spoke between the via pad and the ground plane.

Example F31 includes the subject matter of any of Examples F28-30, and further specifies that the one or more metal portions include multiple spokes between the via pad and the ground plane.

Example F32 includes the subject matter of any of Examples F28-31, and further specifies that the one or more metal portions include a branching spoke between the via pad and the ground plane.

Example F33 includes the subject matter of any of Examples F28-32, and further specifies that the via pad is spaced apart from the ground plane by an antipad, and the antipad is non-circular.

Example F34 includes the subject matter of Example F33, and further specifies that the antipad includes an extension into which a metal portion extends.

Example F35 includes the subject matter of any of Examples F33-34, and further specifies that the antipad includes a plurality of extensions.

Example F36 includes the subject matter of any of Examples F34-35, and further specifies that the extension has a length between 150 microns and 12000 microns.

Example F37 includes the subject matter of any of Examples F34-36, and further specifies that the antipad has a diameter between 100 microns and 600 microns.

Example F38 includes the subject matter of any of Examples F28-37, and further specifies that the via pad is a first via pad, the metal layer is a first metal layer, the one or more metal portions are one or more first metal portions, the transmission line includes a second via pad in a second metal layer, and one or more second metal portions contact the second via pad and a second ground plane in the second metal layer.

Example F39 includes the subject matter of Example F38, and further specifies that the one or more second metal portions include a spoke between the second via pad and the second ground plane.

Example F40 includes the subject matter of any of Examples F38-39, and further specifies that the one or more second metal portions include multiple spokes between the second via pad and the second ground plane.

Example F41 includes the subject matter of any of Examples F38-40, and further specifies that the one or more second metal portions include a branching spoke between the second via pad and the second ground plane.

Example F42 includes the subject matter of any of Examples F38-41, and further specifies that the second via pad is spaced apart from the second ground plane by a second antipad, and the second antipad is non-circular.

Example F43 includes the subject matter of Example F42, and further specifies that the second antipad includes an extension into which a second metal portion extends.

Example F44 includes the subject matter of any of Examples F42-43, and further specifies that the second antipad includes a plurality of extensions.

Example F45 includes the subject matter of any of Examples F38-44, and further specifies that the first via pad and the second via pad have at least one via therebetween.

Example F46 includes the subject matter of any of Examples F38-44, and further specifies that the first via pad and the second via pad have at least one via therebetween.

Example F47 includes the subject matter of any of Examples F28-46, and further specifies that the trace is a first trace, the transmission line further includes a second trace, and the via is between the first trace and the second trace.

Example F48 includes the subject matter of Example F47, and further specifies that the second trace is part of a microstrip, stripline, or coplanar waveguide.

Example F49 includes the subject matter of any of Examples F28-48, and further specifies that the microelectronic support further includes a launcher structure at an end of the transmission line.

Example F50 includes the subject matter of any of Examples F28-49, and further specifies that the microelectronic component includes a millimeter-wave dielectric waveguide connector.

Example F51 includes the subject matter of any of Examples F28-50, and further specifies that the microelectronic component includes a millimeter-wave communication transceiver.

Example F52 includes the subject matter of any of Examples F28-51, and further specifies that a width of the trace is between 5 microns and 400 microns.

Example F53 includes the subject matter of any of Examples F28-52, and further specifies that a diameter of the via pad is between 50 microns and 300 microns.

Example F54 includes the subject matter of any of Examples F28-53, and further specifies that the one or more metal portions include a metal portion with a length between 150 microns and 12000 microns.

Example F55 includes the subject matter of any of Examples F28-54, and further specifies that the one or more metal portions include a metal portion with a width between 5 microns and 400 microns.

Example F56 includes the subject matter of any of Examples F28-55, and further specifies that the trace is spaced apart from the ground plane by a distance between 5 microns and 400 microns.

Example F57 is a microelectronic package, including: a microelectronic support including: a millimeter-wave communication transmission line, wherein the transmission line includes a trace in a metal layer, wherein the trace is conductively coupled to a via by a via pad in the metal layer, and a ground plane in the metal layer, wherein one or more metal portions electrically couple the via pad to the ground plane; and a microelectronic component coupled to the microelectronic support, wherein the microelectronic component is communicatively coupled to the transmission line.

Example F58 includes the subject matter of Example F57, and further specifies that the trace is part of a microstrip, stripline, or coplanar waveguide.

Example F59 includes the subject matter of any of Examples F57-58, and further specifies that the one or more metal portions include a spoke between the via pad and the ground plane.

Example F60 includes the subject matter of any of Examples F57-59, and further specifies that the one or more metal portions include multiple spokes between the via pad and the ground plane.

Example F61 includes the subject matter of any of Examples F57-60, and further specifies that the one or more metal portions include a branching spoke between the via pad and the ground plane.

Example F62 includes the subject matter of any of Examples F57-61, and further specifies that the via pad is spaced apart from the ground plane by an antipad, and the antipad is non-circular.

Example F63 includes the subject matter of Example F62, and further specifies that the antipad includes an extension into which a metal portion extends.

Example F64 includes the subject matter of any of Examples F62-63, and further specifies that the antipad includes a plurality of extensions.

Example F65 includes the subject matter of any of Examples F63-64, and further specifies that the extension has a length between 150 microns and 12000 microns.

Example F66 includes the subject matter of any of Examples F62-65, and further specifies that the antipad has a diameter between 100 microns and 600 microns.

Example F67 includes the subject matter of any of Examples F57-66, and further specifies that the via pad is a first via pad, the metal layer is a first metal layer, the one or more metal portions are one or more first metal portions, the transmission line includes a second via pad in a second metal layer, and one or more second metal portions electrically couple the second via pad to a second ground plane in the second metal layer.

Example F68 includes the subject matter of Example F67, and further specifies that the one or more second metal portions include a spoke between the second via pad and the second ground plane.

Example F69 includes the subject matter of any of Examples F67-68, and further specifies that the one or more second metal portions include multiple spokes between the second via pad and the second ground plane.

Example F70 includes the subject matter of any of Examples F67-69, and further specifies that the one or more second metal portions include a branching spoke between the second via pad and the second ground plane.

Example F71 includes the subject matter of any of Examples F67-70, and further specifies that the second via pad is spaced apart from the second ground plane by a second antipad, and the second antipad is non-circular.

Example F72 includes the subject matter of Example F71, and further specifies that the second antipad includes an extension into which a second metal portion extends.

Example F73 includes the subject matter of any of Examples F71-72, and further specifies that the second antipad includes a plurality of extensions.

Example F74 includes the subject matter of any of Examples F67-73, and further specifies that the first via pad and the second via pad have at least one via therebetween.

Example F75 includes the subject matter of any of Examples F67-73, and further specifies that the first via pad and the second via pad have at least one via therebetween.

Example F76 includes the subject matter of any of Examples F57-75, and further specifies that the trace is a first trace, the transmission line further includes a second trace, and the via is between the first trace and the second trace.

Example F77 includes the subject matter of Example F76, and further specifies that the second trace is part of a microstrip, stripline, or coplanar waveguide.

Example F78 includes the subject matter of any of Examples F57-77, and further specifies that the microelectronic support further includes a launcher structure at an end of the transmission line.

Example F79 includes the subject matter of any of Examples F57-78, and further specifies that the microelectronic component includes a millimeter-wave dielectric waveguide connector.

Example F80 includes the subject matter of any of Examples F57-79, and further specifies that the microelectronic component includes a millimeter-wave communication transceiver.

Example F81 includes the subject matter of any of Examples F57-80, and further specifies that a width of the trace is between 5 microns and 400 microns.

Example F82 includes the subject matter of any of Examples F57-80, and further specifies that a diameter of the via pad is between 50 microns and 300 microns.

Example F83 includes the subject matter of any of Examples F57-82, and further specifies that the one or more metal portions include a metal portion with a length between 150 microns and 12000 microns.

Example F84 includes the subject matter of any of Examples F57-83, and further specifies that the one or more metal portions include a metal portion with a width between 5 microns and 400 microns.

Example F85 includes the subject matter of any of Examples F57-84, and further specifies that the trace is spaced apart from the ground plane by a distance between 5 microns and 400 microns.

Example G1 is a microelectronic support for millimeter-wave communication, including: a millimeter-wave communication transmission line, wherein the transmission line includes a trace in a metal layer, wherein the trace is electrically coupled to a via by a via pad in the metal layer, the trace includes a first portion having a first width and a second portion having a second width different from the first width; and a ground plane in the metal layer, spaced apart from the trace.

Example G2 includes the subject matter of Example G1, and further specifies that the trace is part of a microstrip, stripline, or coplanar waveguide.

Example G3 includes the subject matter of any of Examples G1-2, and further specifies that the second portion is between the first portion and the via pad, and the second width is greater than the first width.

Example G4 includes the subject matter of any of Examples G1-3, and further specifies that the second portion is between the first portion and the via pad, and the second width is less than the first width.

Example G5 includes the subject matter of any of Examples G1-4, and further specifies that the via pad is spaced apart from the ground plane by an antipad.

Example G6 includes the subject matter of any of Examples G1-5, and further specifies that the trace is spaced apart from the ground plane by an antitrace, the antitrace includes a third portion having a third width and a fourth portion having a fourth width different from the third width, and the via pad is spaced apart from the ground plane by an antipad.

Example G7 includes the subject matter of Example G6, and further specifies that the fourth portion is between the third portion and the antipad, or the antipad is between the third portion and the fourth portion.

Example G8 includes the subject matter of any of Examples G6-7, and further specifies that the fourth width is greater than the third width.

Example G9 includes the subject matter of any of Examples G6-8, and further specifies that the fourth width is less than the third width.

Example G10 includes the subject matter of any of Examples G6-9, and further specifies that the first portion of the trace is in the third portion of the antitrace.

Example G11 includes the subject matter of any of Examples G6-10, and further specifies that the second portion of the trace is in the fourth portion of the antitrace.

Example G12 includes the subject matter of any of Examples G5-11, and further specifies that the antipad includes an extension into the ground plane.

Example G13 includes the subject matter of Example G12, and further specifies that the extension has a length between 150 microns and 12000 microns.

Example G14 includes the subject matter of any of Examples G5-13, and further specifies that the antipad has a diameter between 100 microns and 600 microns.

Example G15 includes the subject matter of any of Examples G1-14, and further specifies that the trace is a first trace, the transmission line further includes a second trace, and the via is between the first trace and the second trace.

Example G16 includes the subject matter of Example G15, and further specifies that the second trace is part of a microstrip, stripline, or coplanar waveguide.

Example G17 includes the subject matter of any of Examples G15-16, and further specifies that the second trace includes a first portion having a first width and a second portion having a second width different from the first width.

Example G18 includes the subject matter of any of Examples G1-17, and further includes: a launcher structure at an end of the transmission line.

Example G19 includes the subject matter of any of Examples G1-18, and further specifies that a width of the trace is between 5 microns and 400 microns.

Example G20 includes the subject matter of any of Examples G1-19, and further specifies that a diameter of the via pad is between 50 microns and 300 microns.

Example G21 includes the subject matter of any of Examples G1-20, and further specifies that the trace is spaced apart from the ground plane by a distance between 5 microns and 400 microns.

Example G22 is a microelectronic package, including: a microelectronic support including: a millimeter-wave communication transmission line, wherein the transmission line includes a trace in a metal layer, wherein the trace is electrically coupled to a via by a via pad in the metal layer, the trace includes a first portion having a first width and a second portion having a second width different from the first width, and a ground plane in the metal layer, spaced apart from the trace; and a microelectronic component coupled to the microelectronic support, wherein the microelectronic component is communicatively coupled to the transmission line.

Example G23 includes the subject matter of Example G22, and further specifies that the trace is part of a microstrip, stripline, or coplanar waveguide.

Example G24 includes the subject matter of any of Examples G22-23, and further specifies that the second portion is between the first portion and the via pad, and the second width is greater than the first width.

Example G25 includes the subject matter of any of Examples G22-24, and further specifies that the second portion is between the first portion and the via pad, and the second width is less than the first width.

Example G26 includes the subject matter of any of Examples G22-25, and further specifies that the via pad is spaced apart from the ground plane by an antipad.

Example G27 includes the subject matter of any of Examples G22-26, and further specifies that the trace is spaced apart from the ground plane by an antitrace, the antitrace includes a third portion having a third width and a fourth portion having a fourth width different from the third width, and the via pad is spaced apart from the ground plane by an antipad.

Example G28 includes the subject matter of Example G27, and further specifies that the fourth portion is between the third portion and the antipad, or the antipad is between the third portion and the fourth portion.

Example G29 includes the subject matter of any of Examples G27-28, and further specifies that the fourth width is greater than the third width.

Example G30 includes the subject matter of any of Examples G27-29, and further specifies that the fourth width is less than the third width.

Example G31 includes the subject matter of any of Examples G27-30, and further specifies that the first portion of the trace is in the third portion of the antitrace.

Example G32 includes the subject matter of any of Examples G27-31, and further specifies that the second portion of the trace is in the fourth portion of the antitrace.

Example G33 includes the subject matter of any of Examples G26-32, and further specifies that the antipad includes an extension into the ground plane.

Example G34 includes the subject matter of Example G33, and further specifies that the extension has a length between 150 microns and 12000 microns.

Example G35 includes the subject matter of any of Examples G26-34, and further specifies that the antipad has a diameter between 100 microns and 600 microns.

Example G36 includes the subject matter of any of Examples G22-35, and further specifies that the trace is a first trace, the transmission line further includes a second trace, and the via is between the first trace and the second trace.

Example G37 includes the subject matter of Example G36, and further specifies that the second trace is part of a microstrip, stripline, or coplanar waveguide.

Example G38 includes the subject matter of any of Examples G36-37, and further specifies that the second trace includes a first portion having a first width and a second portion having a second width different from the first width.

Example G39 includes the subject matter of any of Examples G22-38, and further includes: a launcher structure at an end of the transmission line.

Example G40 includes the subject matter of any of Examples G22-39, and further specifies that a width of the trace is between 5 microns and 400 microns.

Example G41 includes the subject matter of any of Examples G22-40, and further specifies that a diameter of the via pad is between 50 microns and 300 microns.

Example G42 includes the subject matter of any of Examples G22-41, and further specifies that the trace is spaced apart from the ground plane by a distance between 5 microns and 400 microns.

Example G43 includes the subject matter of any of Examples G22-42, and further specifies that the microelectronic component includes a millimeter-wave dielectric waveguide connector.

Example G44 includes the subject matter of any of Examples G22-43, and further specifies that the microelectronic component includes a millimeter-wave communication transceiver.

Example G45 is a microelectronic package, including: a microelectronic support including: a millimeter-wave communication transmission line, wherein the transmission line includes a trace in a metal layer, wherein the trace is electrically coupled to a via by a via pad in the metal layer, and a ground plane in the metal layer, spaced apart from the trace by an antitrace and spaced apart from the via pad by an antipad, wherein the antitrace includes a first portion having a first width and a second portion having a second width different from the first width; and a microelectronic component coupled to the microelectronic support, wherein the microelectronic component is communicatively coupled to the transmission line.

Example G46 includes the subject matter of Example G45, and further specifies that the trace is part of a microstrip, stripline, or coplanar waveguide.

Example G47 includes the subject matter of any of Examples G45-46, and further specifies that the second portion is between the first portion and the antipad, and the second width is greater than the first width.

Example G48 includes the subject matter of any of Examples G45-47, and further specifies that the second portion is between the first portion and the antipad, and the second width is less than the first width.

Example G49 includes the subject matter of any of Examples G45-48, and further specifies that the trace includes a third portion having a third width and a fourth portion having a fourth width different from the third width.

Example G50 includes the subject matter of Example G49, and further specifies that the fourth portion is between the third portion and the via pad.

Example G51 includes the subject matter of any of Examples G49-50, and further specifies that the fourth width is greater than the third width.

Example G52 includes the subject matter of any of Examples G49-51, and further specifies that the fourth width is less than the third width.

Example G53 includes the subject matter of any of Examples G49-52, and further specifies that the third portion of the trace is in the first portion of the antitrace.

Example G54 includes the subject matter of any of Examples G49-53, and further specifies that the fourth portion of the trace is in the second portion of the antitrace.

Example G55 includes the subject matter of any of Examples G45-54, and further specifies that the antipad includes an extension into the ground plane.

Example G56 includes the subject matter of Example G55, and further specifies that the extension has a length between 150 microns and 12000 microns.

Example G57 includes the subject matter of any of Examples G45-56, and further specifies that the antipad has a diameter between 100 microns and 600 microns.

Example G58 includes the subject matter of any of Examples G45-57, and further specifies that the trace is a first trace, the transmission line further includes a second trace, and the via is between the first trace and the second trace.

Example G59 includes the subject matter of Example G58, and further specifies that the second trace is part of a microstrip, stripline, or coplanar waveguide.

Example G60 includes the subject matter of any of Examples G58-59, and further specifies that the second trace is in a second antitrace of a ground plane, and the second antitrace includes a first portion having a first width and a second portion having a second width different from the first width.

Example G61 includes the subject matter of any of Examples G45-60, and further includes: a launcher structure at an end of the transmission line.

Example G62 includes the subject matter of any of Examples G45-61, and further specifies that a width of the trace is between 5 microns and 400 microns.

Example G63 includes the subject matter of any of Examples G45-62, and further specifies that a diameter of the via pad is between 50 microns and 300 microns.

Example G64 includes the subject matter of any of Examples G45-63, and further specifies that the trace is spaced apart from the ground plane by a distance between 5 microns and 400 microns.

Example G65 includes the subject matter of any of Examples G45-64, and further specifies that the microelectronic component includes a millimeter-wave dielectric waveguide connector.

Example G66 includes the subject matter of any of Examples G45-65, and further specifies that the microelectronic component includes a millimeter-wave communication transceiver.

The invention claimed is:

1. A microelectronic support for millimeter-wave communication, comprising:
   a millimeter-wave communication transmission line, wherein the transmission line includes a trace in a metal layer, wherein the trace is electrically coupled to a via by a via pad in the metal layer; and
   a ground plane in the metal layer, wherein one or more metal portions contact the via pad and the ground plane.

2. The microelectronic support of claim 1, wherein the trace is part of a microstrip, stripline, or coplanar waveguide.

3. The microelectronic support of claim 1, wherein the one or more metal portions include a spoke between the via pad and the ground plane.

4. The microelectronic support of claim 1, wherein the one or more metal portions include multiple spokes between the via pad and the ground plane.

5. The microelectronic support of claim 1, wherein the one or more metal portions include a branching spoke between the via pad and the ground plane.

6. The microelectronic support of claim 1, wherein the via pad is spaced apart from the ground plane by an antipad, and the antipad is non-circular.

7. The microelectronic support of claim 6, wherein the antipad includes an extension into which a metal portion extends.

8. The microelectronic support of claim 6, wherein the antipad includes a plurality of extensions.

9. A microelectronic package, comprising:
a microelectronic support including:
a millimeter-wave communication transmission line, wherein the transmission line includes a trace in a metal layer, wherein the trace is electrically coupled to a via by a via pad in the metal layer, and
a ground plane in the metal layer, wherein one or more metal portions contact the via pad and the ground plane; and
a microelectronic component coupled to the microelectronic support, wherein the microelectronic component is communicatively coupled to the transmission line.

10. The microelectronic package of claim 9, wherein the via pad is a first via pad, the metal layer is a first metal layer, the one or more metal portions are one or more first metal portions, the transmission line includes a second via pad in a second metal layer, and one or more second metal portions contact the second via pad and a second ground plane in the second metal layer.

11. The microelectronic package of claim 10, wherein the one or more second metal portions include a branching spoke between the second via pad and the second ground plane.

12. The microelectronic package of claim 10, wherein the second via pad is spaced apart from the second ground plane by a second antipad, and the second antipad is non-circular.

13. The microelectronic package of claim 12, wherein the second antipad includes an extension into which a second metal portion extends.

14. The microelectronic package of claim 12, wherein the second antipad includes a plurality of extensions.

15. A microelectronic package, comprising:
a microelectronic support including:
a millimeter-wave communication transmission line, wherein the transmission line includes a trace in a metal layer, wherein the trace is conductively coupled to a via by a via pad in the metal layer, and
a ground plane in the metal layer, wherein one or more metal portions electrically couple the via pad to the ground plane; and
a microelectronic component coupled to the microelectronic support, wherein the microelectronic component is communicatively coupled to the transmission line.

16. The microelectronic package of claim 15, wherein the microelectronic support further includes a launcher structure at an end of the transmission line.

17. The microelectronic package of claim 15, wherein the microelectronic component includes a millimeter-wave dielectric waveguide connector or a millimeter-wave communication transceiver.

18. The microelectronic support of claim 1, wherein the trace is further electrically coupled to the ground plane by the one or more metal portions.

19. The microelectronic support of claim 1, wherein the trace is electrically continuous with the via pad and the via.

20. The microelectronic package of claim 10, wherein the one or more second metal portions include a spoke between the second via pad and the second ground plane.

21. The microelectronic package of claim 10, wherein the one or more second metal portions include multiple spokes between the second via pad and the second ground plane.

* * * * *